United States Patent
Tokunaga

(10) Patent No.: US 7,838,346 B2
(45) Date of Patent: *Nov. 23, 2010

(54) MANUFACTURING METHOD OF SEMICONDUCTOR DEVICE

(75) Inventor: Hajime Tokunaga, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/505,095

(22) Filed: Jul. 17, 2009

(65) Prior Publication Data

US 2009/0286376 A1 Nov. 19, 2009

Related U.S. Application Data

(63) Continuation of application No. 11/283,775, filed on Nov. 22, 2005, now Pat. No. 7,575,959.

(30) Foreign Application Priority Data

Nov. 26, 2004 (JP) ............... 2004-342902

(51) Int. Cl.
  *H01L 21/00* (2006.01)
  *H01L 29/04* (2006.01)
  *H01L 29/76* (2006.01)

(52) U.S. Cl. ...................... 438/149; 257/69

(58) Field of Classification Search ......... 438/149–152; 257/69, E27.084–E27.097
See application file for complete search history.

(56) References Cited

U.S. PATENT DOCUMENTS 4,622,735 A * 11/1986 Shibata ................ 438/143

(Continued)

FOREIGN PATENT DOCUMENTS

| JP | 06-124962 | 5/1994 |
|----|-----------|--------|
| JP | 08-078329 | 3/1996 |
| JP | 08-250739 | 9/1996 |
| JP | 2004-221115 | 8/2004 |

OTHER PUBLICATIONS

Kim Gi Bum, et al., "*Improved Thermal Stability of Ni Silicide on Si (100) Through Reactive Deposition of Ni*", J. Vac. Sci. Technol. (Journal of Vacuum Science & Technology), B 21(1), Jan./Feb. 2003, pp. 319-322.

(Continued)

*Primary Examiner*—Calvin Lee
(74) *Attorney, Agent, or Firm*—Nixon Peabody LLP; Jeffrey L. Costellia

(57) ABSTRACT

Ni silicide is formed through simple steps. After forming a semiconductor film over a substrate, a Ni film is deposited over the semiconductor film while heating the substrate, thereby forming Ni suicide on the semiconductor film. Alternatively, after forming a semiconductor film over a substrate, a Ni film is deposited over the semiconductor film while heating the substrate up to 450° C. or higher, thereby forming Ni silicide on the semiconductor film. Alternatively, after forming a semiconductor film over a substrate, a Ni film is deposited with a thickness of 10 nm or more over the semiconductor film while heating the substrate to 450° C. or higher, thereby forming Ni silicide on the semiconductor film. Alternatively, after forming a semiconductor film over a substrate, and removing an oxide film on the semiconductor film, a Ni film is deposited over the semiconductor film while heating the substrate up to 450° C. or higher, thereby forming Ni silicide on the semiconductor film. Alternatively, after forming a semiconductor film over a substrate, and removing an oxide film on the semiconductor film, a Ni film is deposited with a thickness of 10 nm or more over the semiconductor film while heating the substrate up to 450° C. or higher, thereby forming Ni silicide on the semiconductor film.

55 Claims, 52 Drawing Sheets

U.S. PATENT DOCUMENTS

| | | | |
|---|---|---|---|
| 5,403,772 | A | 4/1995 | Zhang et al. |
| 5,426,064 | A | 6/1995 | Zhang et al. |
| 5,576,556 | A | 11/1996 | Takemura et al. |
| 5,595,944 | A | 1/1997 | Zhang et al. |
| 5,639,698 | A | 6/1997 | Yamazaki et al. |
| 5,644,147 | A | 7/1997 | Yamazaki et al. |
| 5,648,277 | A | 7/1997 | Zhang et al. |
| 5,807,770 | A | 9/1998 | Mineji |
| 5,814,540 | A | 9/1998 | Takemura et al. |
| 5,818,070 | A | 10/1998 | Yamazaki et al. |
| 5,897,347 | A | 4/1999 | Yamazaki et al. |
| 5,915,204 | A | 6/1999 | Sumi |
| 5,923,968 | A | 7/1999 | Yamazaki et al. |
| 5,956,579 | A | 9/1999 | Yamazaki et al. |
| 5,962,897 | A | 10/1999 | Takemura et al. |
| 5,986,286 | A | 11/1999 | Yamazaki et al. |
| 6,048,791 | A | 4/2000 | Katata et al. |
| 6,049,092 | A | 4/2000 | Konuma et al. |
| 6,074,900 | A | 6/2000 | Yamazaki et al. |
| 6,162,704 | A | 12/2000 | Yamazaki et al. |
| 6,204,170 | B1 | 3/2001 | Taguwa |
| 6,218,678 | B1 | 4/2001 | Zhang et al. |
| 6,355,512 | B1 | 3/2002 | Yamazaki et al. |
| 6,369,410 | B1 | 4/2002 | Yamazaki et al. |
| 6,455,875 | B2 | 9/2002 | Takemura et al. |
| 6,475,839 | B2 | 11/2002 | Zhang et al. |
| 6,605,496 | B1 | 8/2003 | Yamazaki |
| 6,613,614 | B2 | 9/2003 | Yamazaki et al. |
| 6,617,612 | B2 | 9/2003 | Zhang et al. |
| 6,624,477 | B1 | 9/2003 | Takemura et al. |
| 6,670,640 | B1 | 12/2003 | Yamazaki et al. |
| 6,777,275 | B1 | 8/2004 | Kluth |
| 6,790,749 | B2 | 9/2004 | Takemura et al. |
| 6,867,431 | B2 | 3/2005 | Konuma et al. |
| 6,882,018 | B2 | 4/2005 | Ohtani et al. |
| 7,109,108 | B2 * | 9/2006 | Takemura et al. ............ 438/149 |
| 7,223,666 | B2 | 5/2007 | Ohtani et al. |
| 7,288,480 | B2 | 10/2007 | Yamaguchi et al. |
| 7,575,959 | B2 * | 8/2009 | Tokunaga .................... 438/149 |
| 2001/0034088 | A1 | 10/2001 | Nakamura et al. |
| 2002/0011627 | A1 | 1/2002 | Takemura et al. |
| 2002/0094612 | A1 | 7/2002 | Nakamura et al. |
| 2003/0006414 | A1 | 1/2003 | Takemura et al. |
| 2004/0256621 | A1 | 12/2004 | Konuma et al. |
| 2005/0037549 | A1 | 2/2005 | Takemura et al. |
| 2005/0055494 | A1 | 3/2005 | Doris et al. |
| 2005/0059236 | A1 | 3/2005 | Nishida et al. |
| 2005/0112817 | A1 | 5/2005 | Cheng et al. |
| 2005/0142705 | A1 | 6/2005 | Konuma et al. |
| 2005/0153489 | A1 | 7/2005 | Konuma et al. |
| 2007/0007529 | A1 | 1/2007 | Takemura et al. |
| 2007/0210451 | A1 | 9/2007 | Ohtani et al. |
| 2009/0200611 | A1 | 8/2009 | Takemura |

OTHER PUBLICATIONS

D. Mangelinck et al., Effect of Co, Pt and Au additions on the stability and epitaxy of $NiSi_2$ films on (111)Si, Journal of Applied Physics, Sep. 1, 1998, pp. 2583-2590, vol. 84, No. 5.

* cited by examiner

FIG. 16
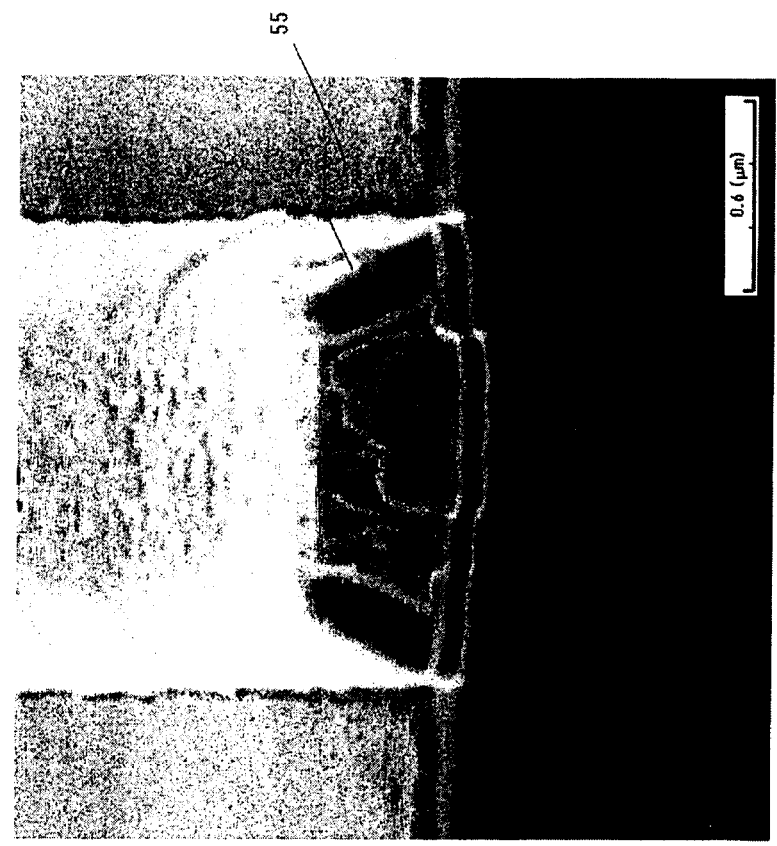
Case where surface oxide film is not removed
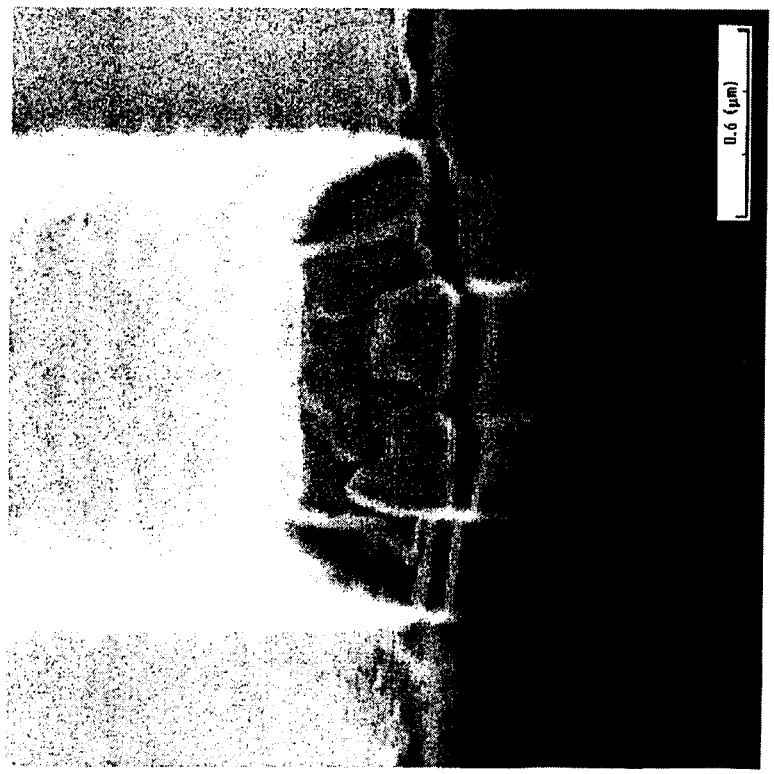
Case where surface oxide film is removed

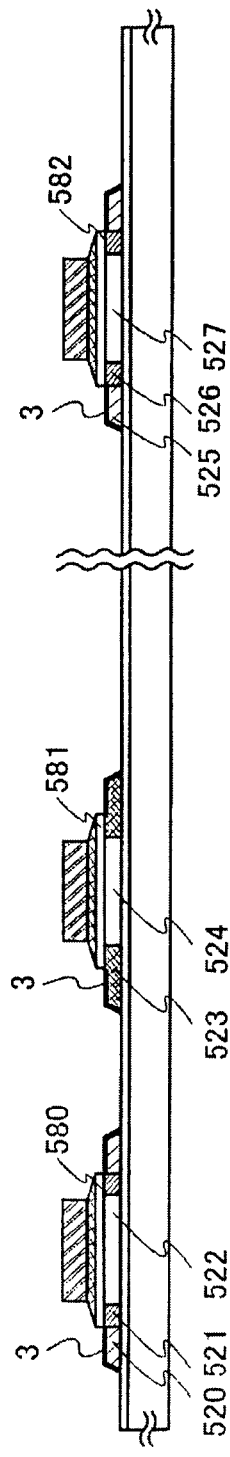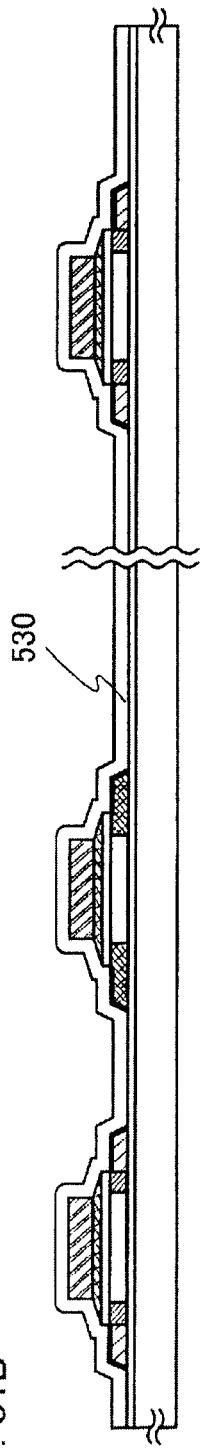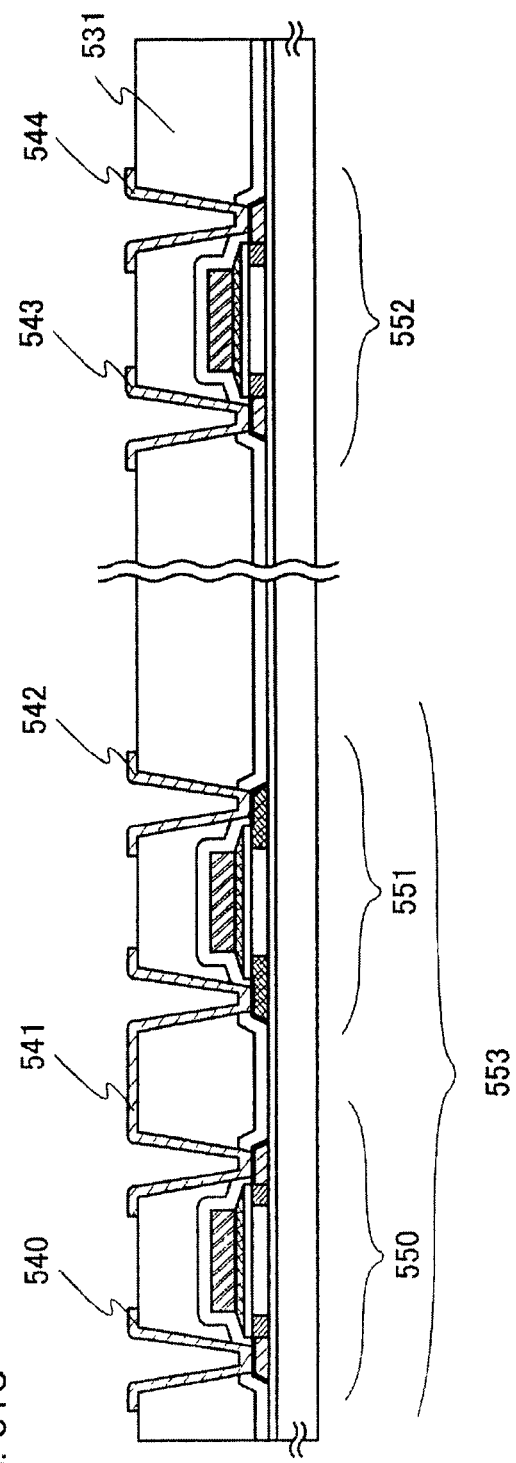

FIG. 36A
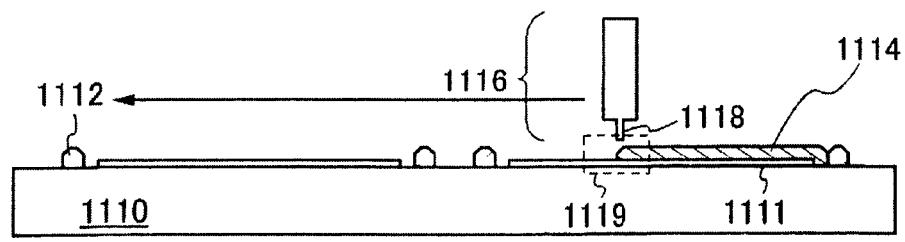
FIG. 36B
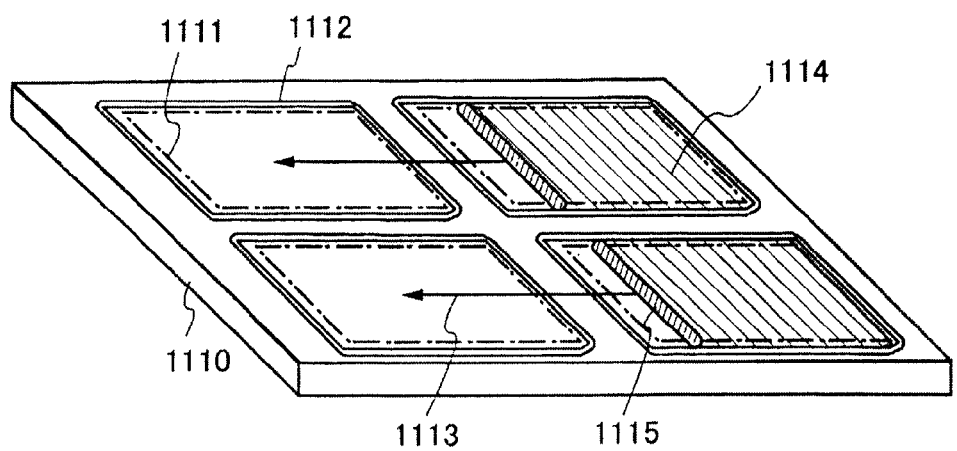
FIG. 36C
FIG. 36D
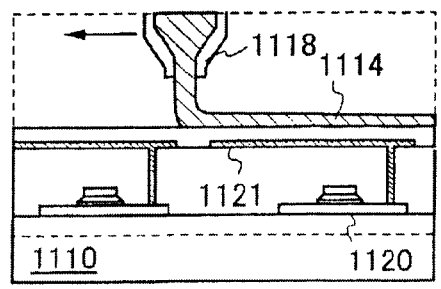
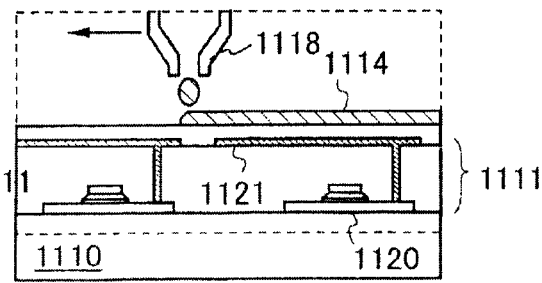

FIG. 38A
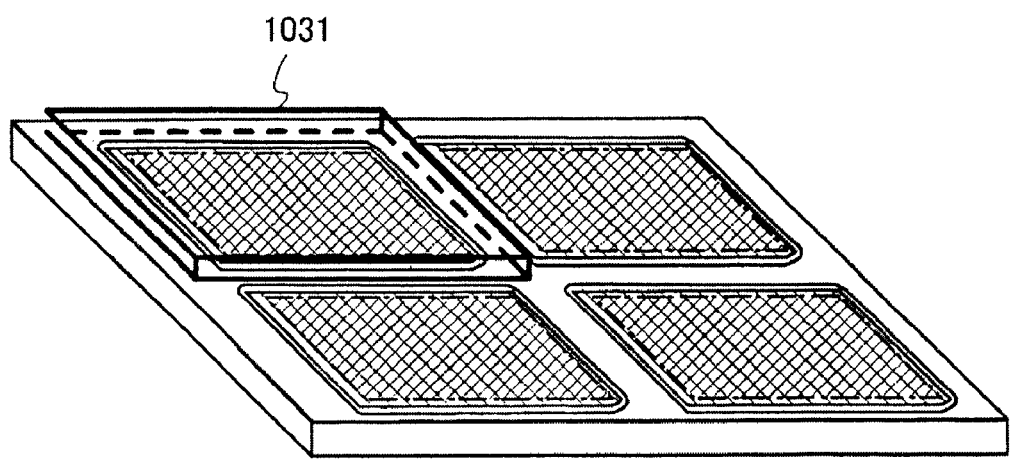
FIG. 38B
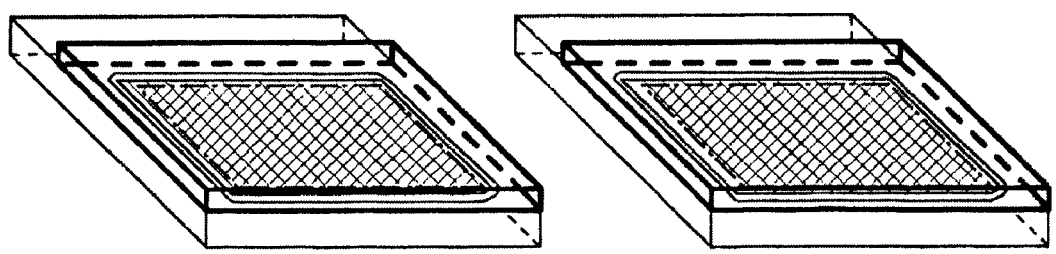
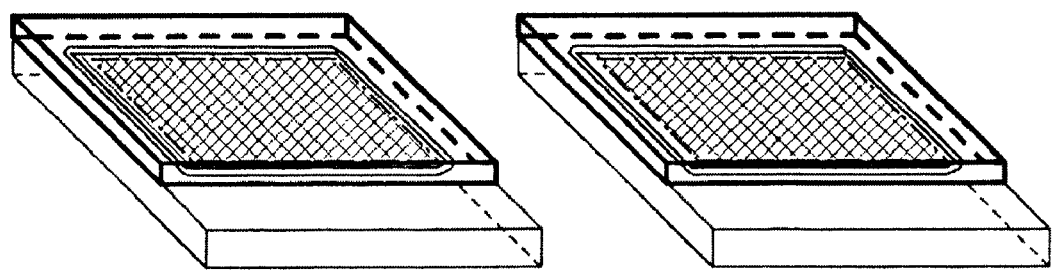

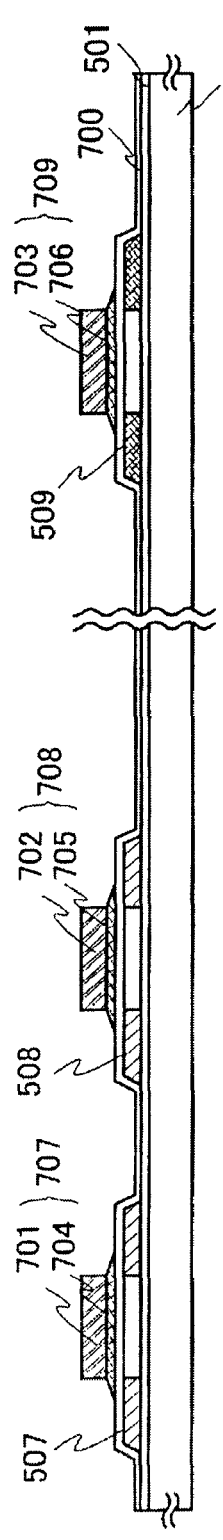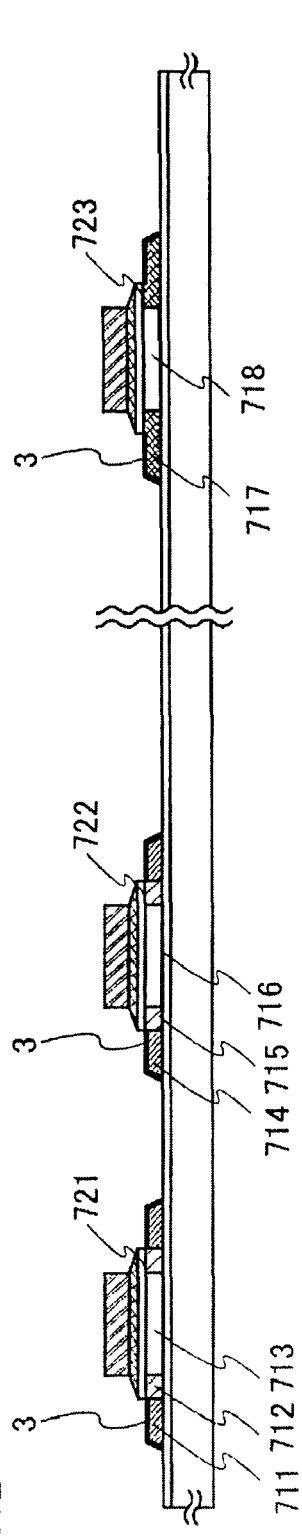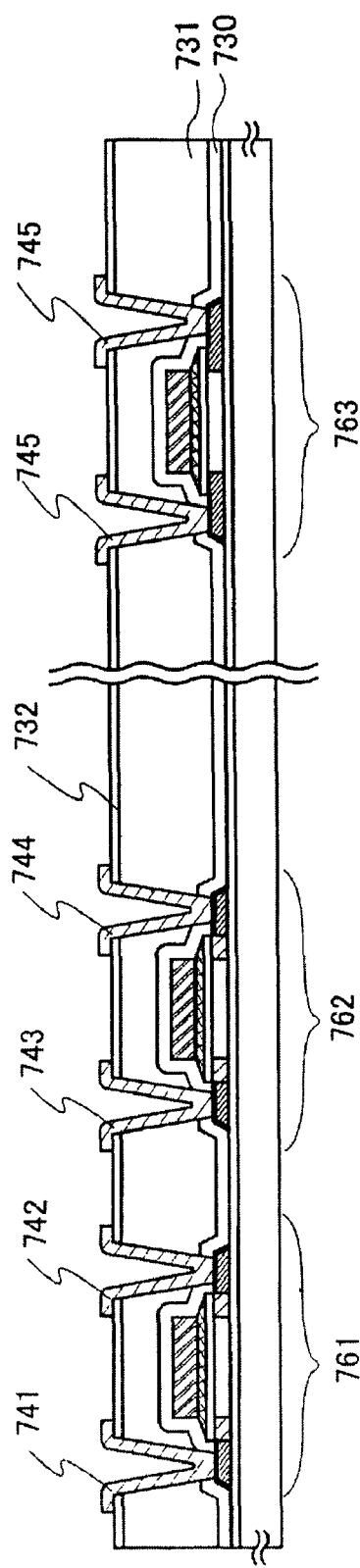

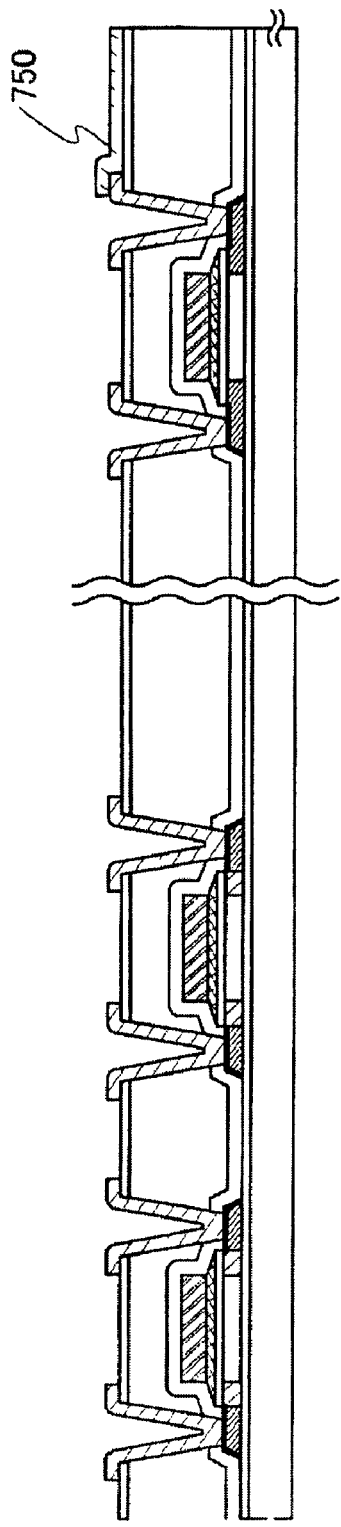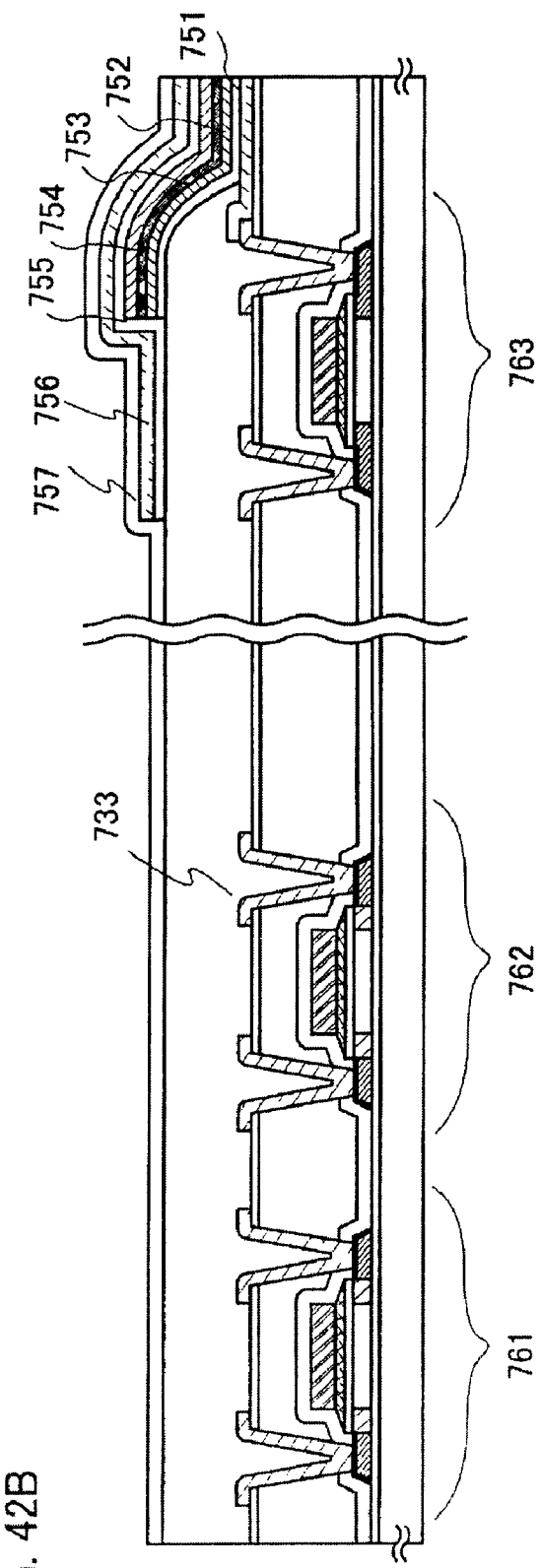
FIG. 42A
FIG. 42B

MANUFACTURING METHOD OF SEMICONDUCTOR DEVICE

BACKGROUND OF THE INVENTION

1. Field of the Invention

The present invention relates to a TFT (Thin Film Transistor) formed over a substrate.

2. Description of the Related Art

In accordance with the reduction in scale of an integrated circuit, the contact resistance between Si and metals as well as the resistance of source and drain regions has been required to be lowered. Ti or Co silicide has been adopted for the Si process. Meanwhile, since Ni silicide (NiSi) can be formed at a low temperature, it is researched as a next-generation material.

For example, a Ni silicide formation step in a TFT manufacture process is carried out by depositing a Ni film over a source region and a drain region by sputtering and then annealing the Ni film at about 450° C. so that an unreacted portion of the Ni film is removed (see Patent Document 1).

In this manner, the Ni silicide formation step has conventionally been carried out by:

(1) forming a Ni film over a semiconductor film;

(2) applying heat treatment to produce Ni silicide by chemical reaction; and (3) removing an unreacted portion of the Ni film.

[Patent Document 1] Japanese Patent Laid-Open No. 2004-221115.

When the aforementioned process is carried out, the number of manufacturing steps is inevitably increased. The increase in the number of manufacturing steps is preferably suppressed since it will lead to a higher cost, shipping delay, higher probability of troubles, lower yield and the like.

Further, in the aforementioned steps, the thickness of the silicide film is determined by three parameters that are the thickness of a Ni film, the heat treatment temperature and the heat treatment time; therefore, elaborate conditioning and management of the treatment conditions are required in order to accurately control the thickness of the silicide film.

SUMMARY OF THE INVENTION

The invention is made in view of the foregoing problems, and it is a primary object of the invention to form Ni silicide through simple steps.

According to the invention, a Ni film is deposited over a semiconductor film while heating the semiconductor film. At the same time as the deposition, Ni silicide is formed by chemical reaction, and then an unreacted portion of the Ni film is removed. The invention is applied to the formation of Ni silicide on source and drain regions of a semiconductor film. In the case of manufacturing electrodes or electrode wires such as a gate electrode, a source electrode or a drain electrode by using a semiconductor film, Ni silicide of the invention can be used.

A manufacturing method of a semiconductor device comprises: forming a semiconductor film over a substrate; forming a metal film over the semiconductor film while heating the substrate, thereby forming metal silicide on the semiconductor film; and removing an unreacted portion of the metal film.

In the aforementioned manufacturing method of a semiconductor device, one or more metals selected from Ni, Ti, V; Co, Zr, Nb, Mo, Ta, and Pt can be used for the metal to form the metal silicide on the semiconductor film.

A manufacturing method of a semiconductor device comprises: forming a semiconductor film over a substrate; forming a nickel film over the semiconductor film while heating the substrate, thereby forming nickel silicide on the semiconductor film; and removing an unreacted portion of the nickel film.

A manufacturing method of a semiconductor device comprises: forming a semiconductor film over a substrate; forming a nickel film over the semiconductor film while heating the substrate up to 450° C. or higher, thereby forming nickel silicide on the semiconductor film; and removing an unreacted portion of the nickel film.

A manufacturing method of a semiconductor device, comprises: forming a semiconductor film over a substrate; forming a nickel film with a thickness of 10 nm or more over the semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; removing an oxide film on the semiconductor film; forming a nickel film over the semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; removing an oxide film on the semiconductor film; forming a nickel film with a thickness of 10 nm or more over the semiconductor film while beating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; adding n-type or p-type impurities into the semiconductor film using the gate electrode as a mask; partially removing the gate insulating film by etching using the gate electrode as a mask, thereby exposing a part of the semiconductor film; forming a nickel film over the exposed semiconductor film while heating the substrate, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; adding n-type or p-type impurities into the semiconductor film using the gate electrode as a mask; partially removing the gate insulating film by etching using the gate electrode as a mask, thereby exposing a part of the semiconductor film; forming a nickel film over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; adding n-type or p-type impurities into the semiconductor film using the gate electrode as a mask; partially removing the gate insulating film by etching using the gate electrode as a mask, thereby exposing a part of the semiconductor film; forming a nickel film with a thickness of 10 nm or more over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; adding n-type or p-type impurities into the semiconductor film using the gate electrode as a mask; partially removing the gate insulating film by etching using the gate electrode as a mask, thereby exposing a part of the semiconductor film; removing an oxide film on the exposed semiconductor film; forming a nickel film over the exposed semiconductor film while heating the substrate up to 450° C. or higher, thereby forming nickel silicide on the semiconductor film; and removing an unreacted portion of the nickel film.

A manufacturing method of a semiconductor device comprises forming a semiconductor film over a substrate; forming a gate insulating film over the semiconductor film; forming a gate electrode over the gate insulating film; adding n-type or p-type impurities into the semiconductor film using the gate electrode as a mask; partially removing the gate insulating film by etching with the gate electrode as a mask, thereby exposing a part of the semiconductor film; removing an oxide film on the exposed semiconductor film; forming a nickel film with a thickness of 10 nm or more over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; first adding n-type or p-type impurities into the semiconductor film using the gate electrode as a mask; forming an insulating film covering the gate electrode and the gate insulating film; forming an insulating film covering the gate electrode and the gate insulating film; forming sidewalls on side surfaces of the gate electrode by etching the insulating film, thereby exposing a part of the semiconductor film by partially removing the gate insulating film; second adding n-type or p-type impurities into the semiconductor film to form LDD regions and source and drain regions; forming a nickel film over the exposed semiconductor film while heating the substrate, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; first adding n-type or p-type impurities into the semiconductor film using the gate electrode as a mask; forming an insulating film covering the gate electrode and the gate insulating film; forming sidewalls on side surfaces of the gate electrode by etching the insulating film, thereby exposing a part of the semiconductor film by partially removing the gate insulating film; second adding n-type or p-type impurities into the semiconductor film to form LDD regions and source and drain regions; forming a nickel film over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; first adding n-type or p-type impurities into the semiconductor film using the gate electrode as a mask; forming an insulating film covering the gate electrode and the gate insulating film; forming sidewalls on side surfaces of the gate electrode by etching the insulating film, thereby exposing a part of the semiconductor film by partially removing the gate insulating film; second adding n-type or p-type impurities into the semiconductor film to form LDD regions and source and drain regions; forming a nickel film with a thickness of 10 nm or more over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; first adding n-type or p-type impurities into the semiconductor film using the gate electrode as a mask; forming an insulating film covering the gate electrode and the gate insulating film; forming sidewalls on side surfaces of the gate electrode by etching the insulating film, thereby exposing a part of the semiconductor film by partially removing the gate insulating film; second adding n-type or p-type impurities into the semiconductor film to form LDD regions and source and drain regions; removing an oxide film on the exposed semiconductor film; depositing a nickel film over the exposed semiconductor film while heating the substrate up to 450° C. or higher, thereby forming nickel silicide on the semiconductor film; and removing an unreacted portion of the nickel film.

A manufacturing method of a semiconductor device comprises: forming a semiconductor film over a substrate; forming a gate insulating film over the semiconductor film; forming a gate electrode over the gate insulating film; first adding n-type or p-type impurities into the semiconductor film using the gate electrode as a mask; forming an insulating film covering the gate electrode and the gate insulating film; forming sidewalls on side surfaces of the gate electrode by etching the insulating film, thereby exposing a part of the semiconductor film by partially removing the gate insulating film; second adding n-type or p-type impurities into the semiconductor film to form LDD regions and source and drain regions; removing an oxide film on the exposed semiconductor film; depositing a nickel film with a thickness of 10 nm or more over the exposed semiconductor film while heating the substrate up to 450° C. or higher, thereby forming nickel silicide on the semiconductor film; and removing an unreacted portion of the nickel film.

In the aforementioned manufacturing method of a semiconductor device, etching the insulating film is performed by anisotropic etching.

In the aforementioned manufacturing method of a semiconductor device, the LDD regions is formed in a part of the semiconductor film which is overlapping with the sidewalls with the gate insulating film interposed therebetween, and the source and drain regions are formed in the exposed semiconductor film. In the aforementioned manufacturing method of a semiconductor device, the nickel film is deposited by sputtering, CVD or vapor deposition.

In the aforementioned manufacturing method of a semiconductor device, the nickel film is deposited by sputtering with a power density lower than 1.4 W/cm$^2$.

The thickness of the Ni film may be 10 nm more, or preferably 15 nm or more. In addition, a step of removing an oxide film on the surface of the semiconductor film may be provided before depositing the Ni film.

The heating temperature may be 450° C. or higher. In the case of using a glass substrate having low heat resistance, the heating temperature is required to be equal to or lower than the heat distortion temperature of the glass substrate. On the other hand, at a temperature lower than 450° C., only a Ni film can be deposited but silicide cannot be formed. Therefore, another heat treatment is required after depositing the Ni film.

After forming the Ni silicide, an unreacted portion of the Ni film is removed. The unreacted portion of the Ni film can be removed with an etchant.

Note that in the present invention, the metal used for forming silicide is not limited to Ni, and one or more metals selected from Ti, V; Co, Zr, Nb, Mo, Ta, and Pt may be used.

The invention can provide a semiconductor element having source and drain regions with low resistance, and electrodes and wires with low resistance. The semiconductor element includes a TFT, a field effect transistor (FET), a MOS transistor, a bipolar transistor, a MIM element, a memory element, a diode, a photoelectric conversion element, a capacitor element, a resistor element and the like.

The semiconductor device includes an integrated circuit, a display device, a wireless tag, an IC tag, an IC card and the like which are constructed of semiconductor elements. As typical examples of the display device, there are a liquid crystal display device, a light-emitting display device, a DMD (Digital Micromirror Device), a PDP (Plasma Display Panel), an FED (Field Emission Display), an electrophoretic display device (electronic paper) and the like. Note that the TFT includes a staggered TFT, an inversely staggered TFT (channel-etched TFT or channel-protected TFT), a top-gate coplanar TFT, a bottom-gate coplanar TFT and the like.

The aforementioned display device means a device using display elements, namely an image display device. In addition, the display device includes all of a module on which a connector such as a flexible printed wiring board (FPC: Flexible Printed Circuit), a TAB (Tape Automated Bonding) tape or a TCP (Tape Carrier Package) is mounted; a module where a tip of a TAB tape or a TCP is provided with a printed wiring board; and a module where an IC (Integrated Circuit) or a CPU is directly mounted onto display elements by a COG (Chip On Glass) bonding method.

According to the invention, a Ni silicide layer can be formed through two steps of:

1) forming a Ni film over a semiconductor film while heating the semiconductor film and forming a silicide layer at the same time; and 2) removing an unreacted portion of the Ni film.

In addition, according to the invention, Ni silicide is formed by chemical reaction at the deposition of the Ni film; therefore, the thickness of the silicide layer depends on the thickness of the Ni film which is estimated based on the deposition rate. Thus, the Ni silicide layer can be controlled with few parameters. Further, in the case of forming Ni silicide on source and drain regions of a TFT in accordance with the invention, the resistance of the source and drain regions can be sufficiently lowered; therefore, another advantage can be provided such that an activation step of the impurities added into the source and drain regions can be omitted.

In this manner, a semiconductor element and a semiconductor device can be formed with high accuracy through simple steps in accordance with the invention. Further, a manufacturing method of a semiconductor element and a semiconductor device can be provided at low cost with high throughput and yield. In addition, according to the invention, the thickness of a silicide film can be easily determined with few parameters such as the thickness and the deposition temperature of a Ni film.

BRIEF DESCRIPTION OF THE DRAWINGS

FIG. 16 are photographs showing changes in the cross-sectional shape depending on whether an oxide film is removed or not.

FIG. 31A to FIG. 31C illustrate manufacturing steps of a semiconductor device in accordance with the invention.

FIG. 36A to FIG. 36D illustrate manufacturing steps of a liquid crystal display device in accordance with the invention, in which a liquid crystal dropping method is used.

FIG. 38A and FIG. 38I3 illustrate manufacturing steps of a liquid crystal display device in accordance with the invention, in which a liquid crystal dropping method is used.

FIG. 41A to FIG. 41C illustrate manufacturing steps of an EL display device in accordance with the invention.

FIG. 42A and FIG. 42B illustrate manufacturing steps of an EL display device in accordance with the invention.

DETAILED DESCRIPTION OF THE INVENTION

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein.

Embodiment Mode 1

Figure 1A:
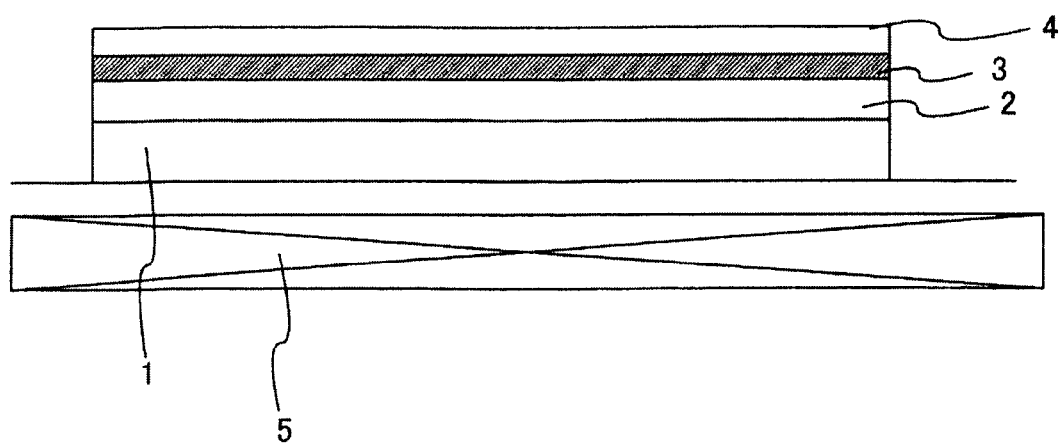
FIG. 1A and FIG. 1B illustrate manufacturing steps of a semiconductor device in accordance with the invention.

Description is made below on an embodiment mode in which Ni silicide is formed on the surface of a semiconductor film (FIG. 1A). A Ni film 4 is directly deposited over a semiconductor film 2 which is formed over a substrate 1, thereby forming a Ni silicide layer 3. The Ni film may be formed by sputtering. Note that the invention is not limited to the sputtering, but CVD, vapor deposition or the like may be employed.

In forming the Ni film, the semiconductor film 2 is required to be heated with a heater 5. The heating temperature may be 450° C. or higher. In the case where the substrate 1 is a glass substrate having low heat resistance, the beating temperature is required to be equal to or lower than the heat distortion temperature of the glass substrate. On the other hand, at a temperature lower than 450° C., only a Ni film can be deposited but silicide cannot be formed on the entire surface of the semiconductor film. Therefore, another heat treatment is required after depositing the Ni film.

In the case of forming the Ni film by CVD, $Ni(CF_3C(O)CHC(O)CF_3)_2$ and $H_2$ can be used as a material gas. Alternatively, $Ni(CO)_4$ or the like can be used as a material gas. As a vapor deposition method, ion beam deposition, laser deposition or the like can be used.

Before forming the Ni film, a step of removing an oxide film such as a natural oxide film formed on the surface of the semiconductor film may be provided. This is because the oxide film formed on the surface of the semiconductor film 2 may adversely affect the formation of Ni silicide. For the removal of the oxide film, known hydrofluoric acid or the like can be used.

The thickness of the Ni film to be deposited may be 10 nm or more, or preferably 15 nm or more. In the case where the Ni film is thin, the silicide-producing reaction between the semiconductor and Ni is small, and thus there may be a case where the resistance of the semiconductor film cannot be sufficiently lowered. However, in the case where the resistance of the semiconductor film has already been lowered by adding impurities such as phosphorus or boron into the semiconductor film, the resistance of the semiconductor film can be sufficiently lowered even when the Ni film is thin.

After forming Ni silicide by depositing the Ni film, an unreacted portion of the Ni film is removed. In the case where not the entire surface of the semiconductor film is exposed because a gate insulating film or the like is formed thereover, Ni silicide cannot be formed on the unexposed portion. Therefore, the unreacted portion of the Ni film is removed. At this time, the Ni film can be removed by using an etchant composed of $HCl:HNO_3:H_2O$, $HCl:H_2O_2:H_2O$ or the like without removing the Ni silicide.

Figure 2A:
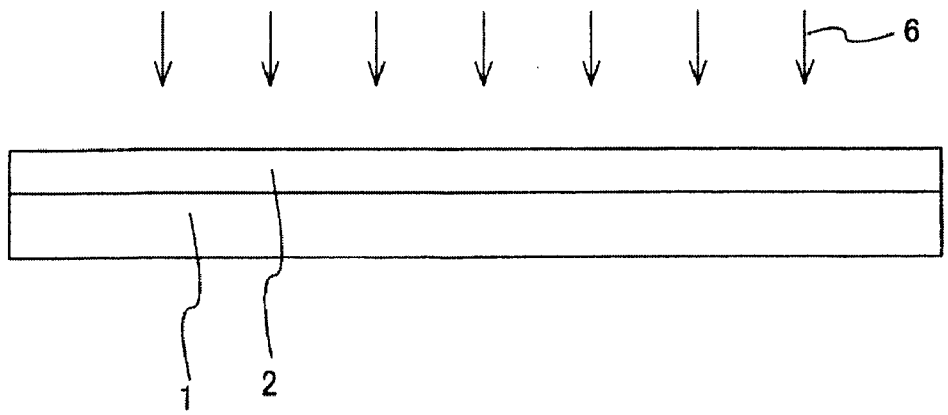
FIG. 2A to FIG. 2D illustrate manufacturing steps of a semiconductor device in accordance with the invention.

Description is made below on a method of forming a semiconductor film for forming Ni silicide. First, as shown in FIG. 2A, the semiconductor film 2 is formed over the substrate 1. The substrate 1 may be a glass substrate, a quartz substrate, a substrate formed of an insulating substance such as alumina, a plastic substrate having heat resistance to the processing temperature of a subsequent step, a silicon wafer, a metal plate or the like. In this case, an insulating film may be formed over the surface of the substrate 1 in order to prevent diffusion of impurities from the substrate side, such as silicon oxide ($SiO_x$), silicon nitride ($SiN_x$), silicon oxynitride ($SiO_xN_y$) (x>y) or silicon nitride oxide ($SiN_xO_y$) (x>y). Alternatively, the substrate 1 may be a stainless substrate, a metal substrate or a semiconductor substrate over the surface of which is formed an insulating film such as silicon oxide or silicon nitride.

Note that in the case of using a plastic substrate as the substrate 1, it is preferable to use a material having a relatively high glass transition point such as PC (polycarbonate), PES (polyether sulfone), PET polyethylene terephthalate) or PEN (polyethylene naphthalate).

The semiconductor film 2 is formed using silicon, silicon-germanium, silicon-germanium-carbon or the like, with which Ni silicide can be formed. As a method for forming the semiconductor film 2, known CVD, sputtering, coating, vapor deposition and the like can be used. The semiconductor film 2 may be any one of an amorphous semiconductor film, a crystalline semiconductor film and a single crystalline semiconductor film.

In the case of using a crystalline semiconductor film, the following formation methods can be used: a method of directly forming a crystalline semiconductor film over the substrate 1; or a method of forming an amorphous semiconductor film over the substrate 1 and then crystallizing it.

Figure 2B:
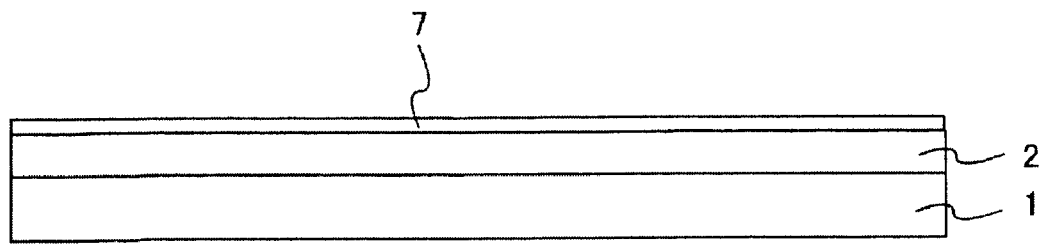
Figure 2C:
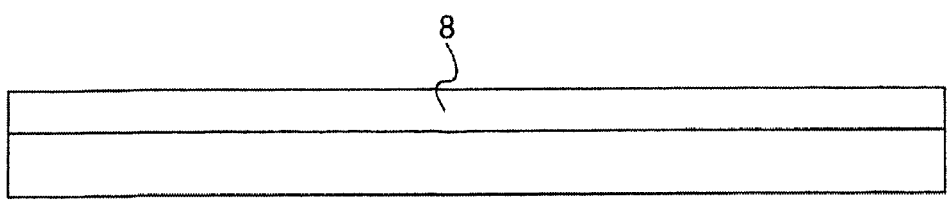
Figure 2D:
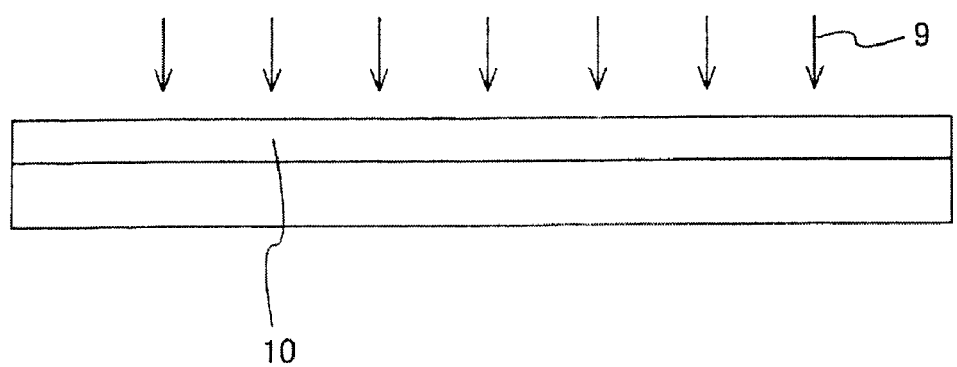

As a method of crystallizing an amorphous semiconductor film, the following methods can be used: a method of crystallizing an amorphous semiconductor film by irradiation with a laser beam 6; a method of crystallizing an amorphous semiconductor film by heating at a low temperature of about 550° C. with an element which promotes the crystallization of the semiconductor film; or a method of crystallizing an amorphous semiconductor film by heating at a low temperature of about 550° C. with an element which promotes the crystallization of the semiconductor film and then irradiating the semiconductor film with a laser beam 9 (FIG. 2D). Needless to say, a method of thermally crystallizing an amorphous semiconductor film without using the element can be used as well. However, such the method can be applied only to the case where the substrate is a quartz substrate, a silicon wafer or the like which can withstand the high temperature.

The laser beams 6 and 9 may be obtained by using a pulsed or CW excimer laser, YAG laser, $YVO_4$ laser, YLF laser, $YAlO_3$ laser, glass laser, ruby laser, Alexandrite laser, sapphire laser or the like which has a wavelength equal to or shorter than 400 nm. Alternatively, a beam emitted from an ultraviolet lamp may be used instead of using the aforementioned laser beams. In the case of using the aforementioned lasers, laser beams emitted from the laser oscillator may be linearly condensed with an optical system so that the semiconductor film is irradiated with the condensed laser beams. The crystallization conditions are appropriately selected by a practitioner. In the case of using a pulsed excimer laser, a pulse repetition rate is set to 10 to 40 Hz, and a laser energy density is set to 100 to 500 $mJ/cm^2$. In the case of using a pulsed YAG laser or $YVO_4$ laser, a second or third harmonic is used, a pulse repetition rate is set to 1 to 10 kHz, and a laser energy density is set to 300 to 600 $mJ/cm^2$. Then, the entire surface of the substrate is irradiated with the laser beams which are linearly condensed to have a width of 100 to 1000 µm, for example 400 µm. At this time, the overlapped ratio of the laser beams is preferably set to 80 to 98%. Other than these, a laser beam having a repetition rate of 1 to 10 MHz can be used.

In the case of using a CW laser (for example, a CW $YVO_4$ laser), a laser beam emitted from a CW $YVO_4$ laser having an output of 5 to 15 W, for example 10 W is converted into a higher harmonic (second to fourth harmonics) with a non-linear optical element. Alternatively, another method of emitting a high harmonic may be used, in which a $YVO_4$ crystal and a non-linear optical element are set in a resonator. The emitted laser beam is preferably transformed into a laser beam having a rectangular or elliptical shape on the irradiation surface with an optical system so that the semiconductor film is irradiated with the laser beam. The energy density at this time is required to be 0.001 to 100 $MW/cm^2$ (preferably, 0.1 to 10 $MW/cm^2$). The semiconductor film may be irradiated with the laser beam while being moved relatively to the laser beam at a rate of 0.5 to 2000 cm/s.

As the method of crystallizing the semiconductor film by heating with an element which promotes the crystallization of the semiconductor film, a technique disclosed in Japanese Patent Laid-Open No. Hei 8-78329 can be used. According to the technique in the patent publication, an amorphous semiconductor film is selectively doped with a metal element which promotes the crystallization of the semiconductor film, and then heat treatment is applied so that the amorphous semiconductor film is crystallized with the doped region as a nucleus. The detailed description thereof is made below.

First, a metal-containing layer 7 is formed over the surface of the amorphous semiconductor film 2 as shown in FIG. 2B. The metal-containing layer 7 contains a metal element having a catalytic action which promotes the crystallization of the semiconductor film (e.g., one or more of Fe, Ni, Co, Ru, Rh, Pd, Os, Ir, Pt, Cu and Au). In the case where the metal element is Ni, the metal-containing layer 7 is formed by coating the surface of the semiconductor film 2 with a nickel acetate solution containing nickel 1 to 100 ppm by weight using a spinner. Note that a method for forming the metal-containing layer 7 includes, in addition to the coating, sputtering, vapor deposition and plasma treatment which can produce an extremely thin film. Although shown here is an example in which the entire surface is coated, the metal-containing layer 7 may be selectively formed using a mask. In addition, the metal-containing layer 7 may be formed before forming the amorphous semiconductor film 2 namely below the amorphous semiconductor film 2.

Then, heat treatment is applied to the substrate 1, the amorphous semiconductor film 2 and the metal-containing layer 7. Then, an alloy of the metal element and the semiconductor is formed inside the semiconductor, and crystallization progresses with the alloy as a nucleus. Accordingly, the amorphous semiconductor film 2 is crystallized, and a semiconductor film having a crystalline structure (hereinafter referred to as a crystalline semiconductor film) 8 is formed. Note that the concentration of oxygen contained in the crystalline semiconductor film 8 is desirably set equal to or lower than $5 \times 10^{18}/cm^3$. Here, after applying heat treatment for dehydrogenation (450 to 500° C. for 1 to 2 hours), heat treatment for crystallization (550 to 650° C. for 4 to 24 hours) is applied (FIG. 2C).

The amorphous semiconductor film 2 can also be crystallized by performing irradiation with strong light instead of the heat treatment. In this case, any one of or a combination of infrared light, visible light and ultraviolet light can be used. Typically, light emitted from a halogen lamp, a metal halide lamp, a xenon arc lamp, a carbon arc lamp, a high pressure sodium lamp or a high pressure mercury lamp is used. The lamp light source is lighted for 1 to 60 seconds, or preferably 30 to 60 seconds, and such lighting is repeated 1 to 10 times, or preferably 2 to 6 times. The light-emission intensity of the lamp light source is arbitrary, but the semiconductor film is instantaneously heated up to 600 to 1000° C. Note that if necessary, heat treatment may be performed in order to discharge the hydrogen contained in the amorphous semiconductor film 2 having an amorphous structure before the irradiation with the strong light. Alternatively, crystallization may be performed by both the heat treatment and irradiation with strong light.

Note that an oxide film (not shown) is formed on the surface of the crystalline semiconductor film 8 by the aforementioned heat treatment or irradiation with strong light. This oxide film is preferably removed by etching before performing the next step.

Then, in order to increase the crystallization rate of the crystalline semiconductor film 8 (rate of crystalline components which occupy the whole volume of the film) and to correct defects which remain in the crystalline grains, the crystalline semiconductor film 8 is irradiated with the laser beam 9 in the atmospheric air or oxygen atmosphere so as to obtain a crystalline semiconductor film 10. The laser beam may be selected from the aforementioned (FIG. 2D).

Figure 3A:
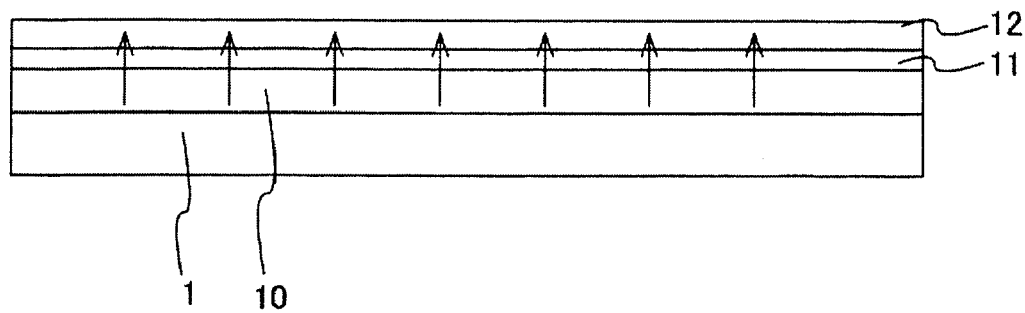
FIG. 3A to FIG. 3D illustrate manufacturing steps of a semiconductor device in accordance with the invention.

Next, description is made on a method of removing the metal element contained in the crystalline semiconductor film 10. First, as shown in FIG. 3A, the surface of the crystalline semiconductor film 10 is treated with ozone-containing solution (typically, ozone water), thereby forming an oxide film (called chemical oxide) on the surface of the crystalline semiconductor film 10. Accordingly, a barrier layer 11 composed of the oxide film is formed with a total thickness of 1 to 10 nm. The barrier layer 11 functions as an etching stopper when selectively removing only a gettering layer in a subsequent step.

Instead of using the ozone-containing solution, the barrier layer 11 can be similarly formed by treating with a solution containing hydrogen peroxide solution. Alternatively, the barrier layer 11 may be formed by generating ozone by irradiation with ultraviolet light in an oxygen atmosphere so that the ozone oxidizes the surface of the crystalline semiconductor film 10. Further alternatively, the barrier layer 11 may be formed by depositing an oxide film with a thickness of 1 to 10 nm by plasma CVD, sputtering, vapor deposition or the like.

Then, a gettering layer 12 containing a rare gas element is formed as a gettering site over the barrier layer 11. Here, a semiconductor film containing a rare gas element is formed as the gettering layer 12 by CVD or sputtering. When forming the gettering layer 12, the CVD conditions or the sputtering conditions are appropriately controlled so that a rare gas element is added thereto. The rare gas element may be one or more of helium (He), neon Ne), argon (Ar), krypton (Kr) and xenon (Xe). The gettering layer 12 is made to contain such a rare gas element ion as an inert gas because of the following two reasons: 1) in order to form a dangling bond so that the semiconductor film which constitutes the gettering layer 12 may have distortion; and 2) in order that the semiconductor film may have lattice distortion. In order that the semiconductor film may have lattice distortion, an element having a larger atomic radius than the element which constitutes the semiconductor film (e.g., silicon) is preferably used, such as argon (Ar), krypton (Kr) or xenon (Xe). In addition, if the semiconductor film is made to contain a rare gas element, not only a lattice distortion is formed but also a dangling bond is formed; therefore, the ability to getter the semiconductor film is further improved.

Note that in the case of forming the gettering layer 12 by using a material gas containing phosphorus which is an impurity element having one conductivity type or using a target including phosphorus, gettering can be performed by utilizing the cloning power of phosphorus in addition to the gettering by the rare gas element. In gettering, a metal element (e.g., nickel) tends to move to a region having a high concentration of oxygen; therefore, the concentration of oxygen contained in the gettering layer 12 is desirably set to $5 \times 10^{18}/cm^3$ or higher, for example (FIG. 3A).

Next, thermal treatment (e.g., beat treatment or irradiation with strong light) is applied to the crystalline semiconductor film 10, the barrier layer 11 and the gettering layer 12, thereby the metal element (e.g., nickel) is gettered as shown by the arrows in FIG. 3A so that the metal element in the crystalline semiconductor film 10 is lowered in concentration or removed.

Figure 3B:
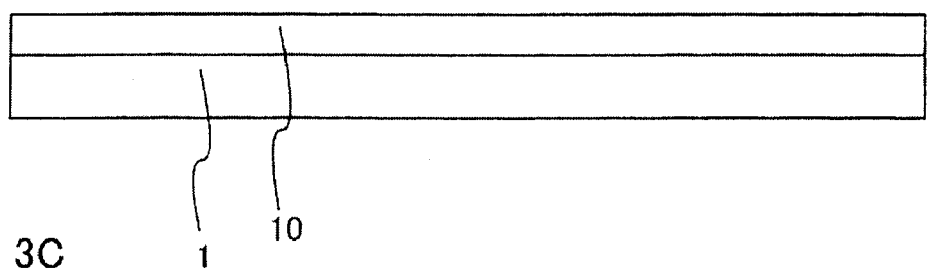

Then, a known etching method is applied utilizing the barrier layer 11 as an etching stopper, thereby only the gettering layer 12 is selectively removed. After that, the barrier layer 11 formed of an oxide film is removed, for example, with an etchant containing hydrofluoric acid (FIG. 3B).

Note that in the present invention, the metal used for forming silicide is not limited to Ni, and one or more metals selected from Ti, V, Co, Zr, Nb, Mo, Ta, and Pt may be used.

Embodiment Mode 2

Description is made below with reference to FIG. 2A to FIG. 3D and the like on an embodiment mode in which a top-gate TFT is formed using a crystalline semiconductor film in accordance with the invention. Here, the crystalline semiconductor film 10 manufactured in accordance with Embodiment Mode 1 is used. Description is schematically made below on a method of manufacturing the crystalline semiconductor film 10.

Over the glass substrate 1, an insulating film for preventing diffusion of impurities from the substrate side may be formed, such as a silicon oxide ($SiO_x$) film, a silicon nitride ($SiN_x$) film, a silicon oxynitride ($SiO_xN_y$) film (x>y) or a silicon nitride oxide ($SiN_xO_y$) film (x>y).

Then, the amorphous semiconductor film 2 is formed as the semiconductor film 2 (FIG. 2B). Here, the amorphous semiconductor film 2 is crystallized by heating with an element which promotes the crystallization of the semiconductor film, and then irradiating it with a laser beam. Needless to say, the invention is not limited to this method as described in Embodiment Mode 1.

First, the metal-containing layer 7 is formed over the surface of the amorphous semiconductor film 2 by the method described in Embodiment Mode 1 (FIG. 2B).

Then, the substrate 1, the amorphous semiconductor film 2 and the metal-containing layer 7 are crystallized by heat treatment so as to obtain the crystalline semiconductor film 8 (FIG. 2C). Here, after applying heat treatment for dehydrogenation (450 to 500° C. for 1 to 2 hours), heat treatment for crystallization (550 to 650° C. for 4 to 24 hours) is applied. Instead of the heat treatment, irradiation with strong light may be performed.

Note that an oxide film (not shown) is formed on the surface of the crystalline semiconductor film 8 by the aforementioned heat treatment or irradiation with strong light. This oxide film is preferably removed by etching before performing the next step.

Then, as shown in FIG. 2D, in order to increase the crystallization rate of the crystalline semiconductor film 8 (rate of crystalline components which occupy the whole volume of the film) and to correct defects which remain in the crystalline grains, the crystalline semiconductor film 8 is irradiated with the laser beam 9 in the atmospheric air or oxygen atmosphere so as to obtain the crystalline semiconductor film 10. The laser beam may be any of the ones shown in Embodiment Mode 1.

As shown in FIG. 3A, the surface of the crystalline semiconductor film 10 is treated with ozone-containing solution (typically, ozone water), thereby forming an oxide film (called chemical oxide) on the surface of the crystalline semiconductor film 10. Accordingly, the barrier layer 11 composed of the oxide film is formed with a total thickness of 1 to 10 nm. The barrier layer 11 functions as an etching stopper when selectively removing only a gettering layer in a subsequent step. The barrier layer can be formed in accordance with the method shown in Embodiment Mode 1.

Then, the gettering layer 12 containing a rare gas element is formed as a gettering site over the barrier layer 11. Here, a semiconductor film containing a rare gas element is formed as the gettering layer 12 by sputtering. As the rare gas element, argon (Ar) is used. However, the invention is not limited to argon as described in Embodiment Mode 1. In gettering, a metal element (e.g., nickel) tends to move to a region having a high concentration of oxygen; therefore, the concentration of oxygen contained in the gettering layer 12 is desirably set to be $5 \times 10^{18}$/cm$^3$ or higher, for example (FIG. 3A).

Next, thermal treatment (e.g., heat treatment or irradiation with strong light) is applied to the crystalline semiconductor film 10, the barrier layer 11 and the gettering layer 12, thereby the metal element (e.g., nickel) is gettered as shown by the arrows in FIG. 3A so that the metal element in the crystalline semiconductor film 10 is lowered in concentration or removed.

Then, a known etching method is applied utilizing the barrier layer 11 as an etching stopper, thereby only the gettering layer 12 is selectively removed. After that, the barrier layer 11 formed of an oxide film is removed, for example, with an etchant containing hydrofluoric acid (FIG. 3B).

Then, the crystalline semiconductor film 10 is formed into an island-like crystalline semiconductor film 13 by a known photolithography step.

Figure 3C:
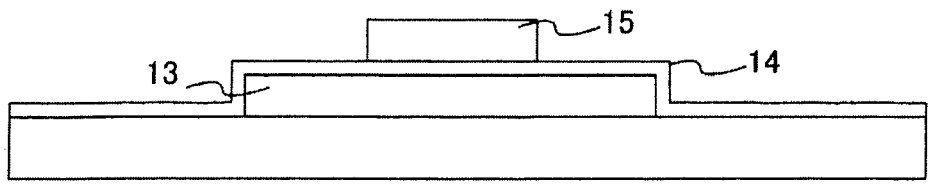

Then, after cleaning the surface of the crystalline semiconductor film 13 with an etchant containing hydrofluoric acid, a gate insulating film 14 is formed over the crystalline semiconductor film 13 (FIG. 3C). The gate insulating film 14 is formed of an insulating film containing silicon as a main component. Such a surface cleaning step of the crystalline semiconductor film 13 and a formation step of the gate insulating film 14 are desirably performed continuously without air exposure.

Then, after cleaning the surface of the gate insulating film 14, a metal film containing Al, Cu, W or the like as a main component is formed over the entire surface of the gate insulating film 14. A photoresist film (not shown) is applied onto this metal film, which is then exposed to light and developed, thereby forming a resist pattern. By etching the metal film with the resist pattern as a mask, a gate electrode 15 is formed over the gate insulating film 14. In the case where the gate electrode is formed using a material such as silicon with which Ni silicide can be formed, Ni silicide can also be formed on the gate electrode in accordance with the invention. For example, after forming a crystalline semiconductor film or amorphous semiconductor film having conductivity over the entire surface of the gate insulating film, a known photolithography step is applied to the semiconductor film so as to obtain a gate electrode.

Figure 3D:
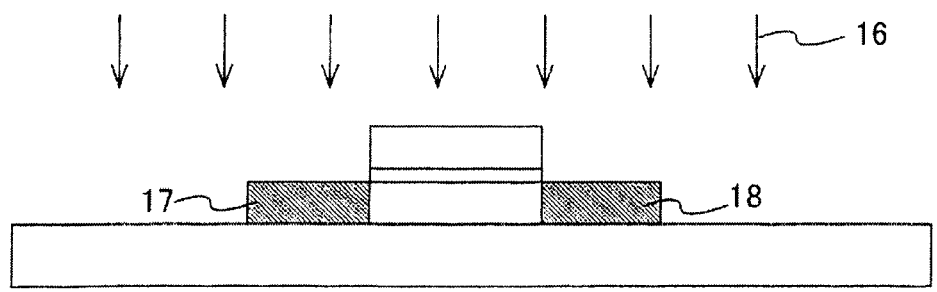

In forming the aforementioned gate electrode, the gate insulating film is also partially removed, thereby exposing a part of the crystalline semiconductor film 13. Then, an n-type impurity ion 16 (ion such as P or As, here P ion) is added into the crystalline semiconductor film 13 with the gate electrode 15 as a mask, thereby forming a source region 17 and a drain region 18 (FIG. 3D). Here, the n-type impurity ion 16 is added after partially exposing the crystalline semiconductor film; however, the order may be opposite. That is, it is possible that the gate insulating film is not removed in the formation of the gate electrode, and the n-type impurity ion is added into the crystalline semiconductor film 13 through the gate insulating film, and then the gate insulating film is partially removed by etching with the gate electrode as a mask so that the crystalline semiconductor film 13 is partially exposed.

Figure 4A:
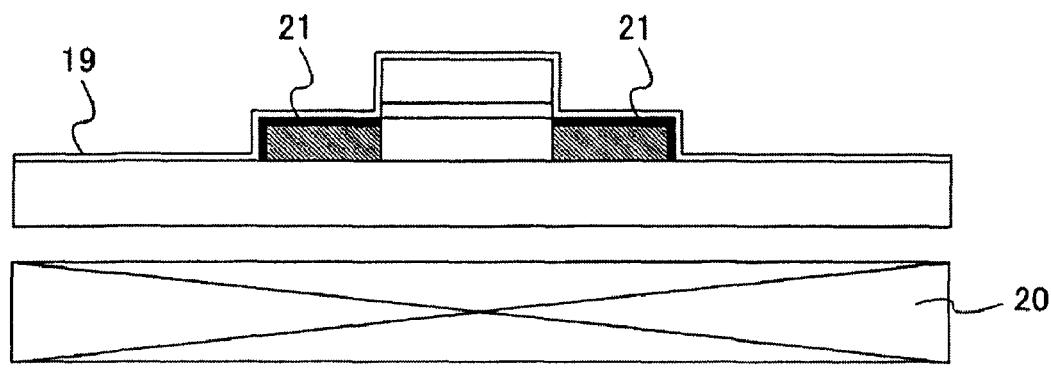
FIG. 4A to FIG. 4C illustrate manufacturing steps of a semiconductor device in accordance with the invention.
Figure 4B:
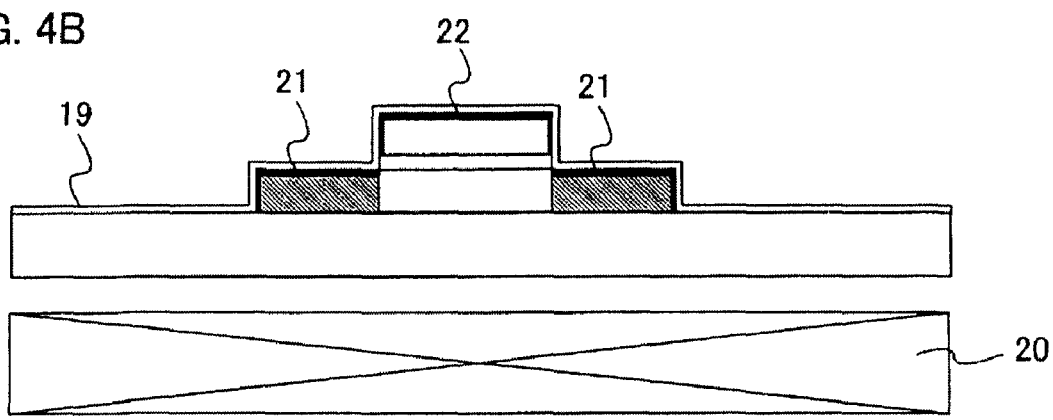

Then, the exposed surface of the crystalline semiconductor film 13 is cleaned with hydrofluoric acid. Then, the crystalline semiconductor film 13 and the substrate 1 are heated with a heater 20 at a temperature of 450° C. or higher, and a Ni film 19 is deposited over the entire surface to have a thickness of 10 nm or more, for example 30 nm. By this deposition, Ni silicide 21 is formed on exposed portions of the crystalline semiconductor film, namely the source region and the drain region (FIG. 4A). In the case where the gate electrode is formed of a crystalline semiconductor film having conductivity, Ni silicide 22 is formed on the gate electrode (FIG. 4B).

Figure 4C:
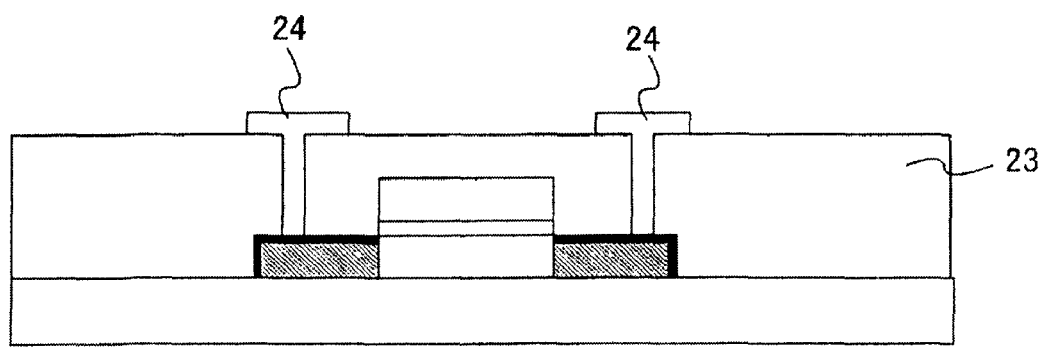

Then, an unreacted portion of the Ni film is removed with a known etchant (FIG. 4C). By the Ni silicide formation step, the resistance of the source and drain regions can be sufficiently lowered. Accordingly, the n-type impurity is not requited to be activated thereafter. Needless to say, heat treatment, irradiation with strong light or irradiation with laser beams may be carried out in order to activate the n-type impurity.

Then, an interlayer insulating film 23 is formed over the entire surface including the gate insulating film 14 and the gate electrode 15, and hydrogenation is carried out. Then, a resist pattern is formed over the interlayer insulating film 23, and the interlayer insulating film 23 is etched with the resist pattern as a mask. Thus, contact holes are formed above the source region 17 and the drain region 18 respectively, namely above the Ni silicide 21. Then, a conductive film (e.g., an Al alloy metal wire) is formed on the interlayer insulating film 23 and in the contact holes, and it is patterned to form source and drain electrodes 24. Through the aforementioned steps, a TFT (n-channel TFT) is formed.

Note that the invention is not limited to the TFT structure shown in FIG. 4C, but can be applied to a TFT having other structures. For example, a low-concentration drain structure may be adopted, where an LDD (Lightly Doped Drain) region is provided between a cannel region and a drain region (or a source region). In this structure, regions doped with a low concentration of impurity elements (hereinafter referred to as LDD regions) are provided between a source region and a channel region and between a drain region and the channel region respectively. Alternatively, a so-called GOLD (Gate-drain Overlapped LDD) structure may be adopted, where an LDD region is provided to overlap a no gate electrode with a gate insulating film interposed therebetween.

Although description has been made on an n-channel TFT in this embodiment mode, it is needless to mention that a p-channel TFT can be formed by using a p-type impurity element instead of the n-type impurity element. In addition, although this embodiment illustrates a top-gate TFT as an example, the invention can be applied to an inversely staggered TFT, for example.

Note that in the present invention, the metal used for forming silicide is not limited to Ni, and one or more metals selected from Ti, V, Co, Zr, Nb, Mo, Ta, and Pt may be used.

Embodiment 1

Description is made below on steps of manufacturing a crystalline silicon film in accordance with the invention. In Embodiments 2 to 5, a crystalline silicon film manufactured in accordance with this embodiment is used.

First, as shown in FIG. 2A, the amorphous silicon film 2 is formed with a thickness of 50 to 100 nm (e.g., 66 nm) over the glass substrate (Corning 1737) 1 by plasma CVD. In order to prevent diffusion of impurities such as sodium from the substrate side into the silicon film, a silicon nitride oxide (SiN$_x$O$_y$) film (x>y) and a silicon oxynitride (SiO$_x$N$_y$) film (x>y) are formed as base films (not shown).

Then, the amorphous silicon film 2 is crystallized. First, the metal-containing layer 7 is formed over the surface of the amorphous silicon film 2 as shown in FIG. 2B. The metal-containing layer 7 is formed by applying a nickel acetate solution containing nickel 1 to 100 ppm by weight using a spinner.

Then, as shown in FIG. 2C, the substrate 1, the amorphous silicon film 2 and the metal-containing layer 7 are heated to be crystallized. Here, after applying heat treatment for dehydrogenation (500° C. for 1 hour), heat treatment for crystallization (550° C. for 4 hours) is applied to obtain the crystalline silicon film 8.

Then, as shown in FIG. 2D, in order to increase the crystallization rate of the crystalline silicon film 8 (rate of crystalline components which occupy the whole volume of the film) and to correct defects which remain in the crystalline grains, the crystalline silicon film 8 is irradiated with the laser beam 9 in the atmospheric air.

As the laser beam 9, a second harmonic of a CW $YVO_4$ laser is used. The laser output is set to about 10 W, and an emitted laser beam is converted into a second harmonic with a non-linear optical element. The power density at this time is set to about 0.001 to 100 $MW/cm^2$. The silicon film is irradiated with the laser beam while being moved relatively to the laser beam at a rate of about 0.5 to 2000 cm/sec, for example 35 cm/sec. Accordingly, the crystalline silicon film 10 is formed.

Then, as shown in FIG. 3A, the surface of the crystalline silicon film 10 is treated with ozone-containing solution (typically, ozone water), thereby forming an oxide film (called chemical oxide) on the surface of the crystalline silicon film 10. Accordingly, the barrier layer 11 composed of the oxide film is formed with a total thickness of 1 to 10 nm. The barrier layer 11 functions as an etching stopper when selectively removing only the gettering layer 12 in a subsequent step.

Then, the gettering layer 12 containing an argon element is formed as a gettering site over the barrier layer 11. Here, an amorphous silicon film containing an argon element is formed by sputtering as the gettering layer 12.

Next, the crystalline silicon film 10, the barrier layer 11 and the gettering layer 12 are heated at 550° C. for 4 hours. Accordingly, a metal element (mainly nickel herein) is gettered as shown by the arrows in FIG. 3A so that the metal element in the crystalline semiconductor film 10 is lowered in concentration or removed.

Then, a known etching method is applied utilizing the barrier layer 11 as an etching stopper, thereby only the gettering layer 12 is selectively removed. After that, the barrier layer 11 formed of the oxide film is removed, for example, with an etchant containing hydrofluoric acid (FIG. 3B). Accordingly, the crystalline silicon film 10 is obtained.

Embodiment 2

Figure 1B:
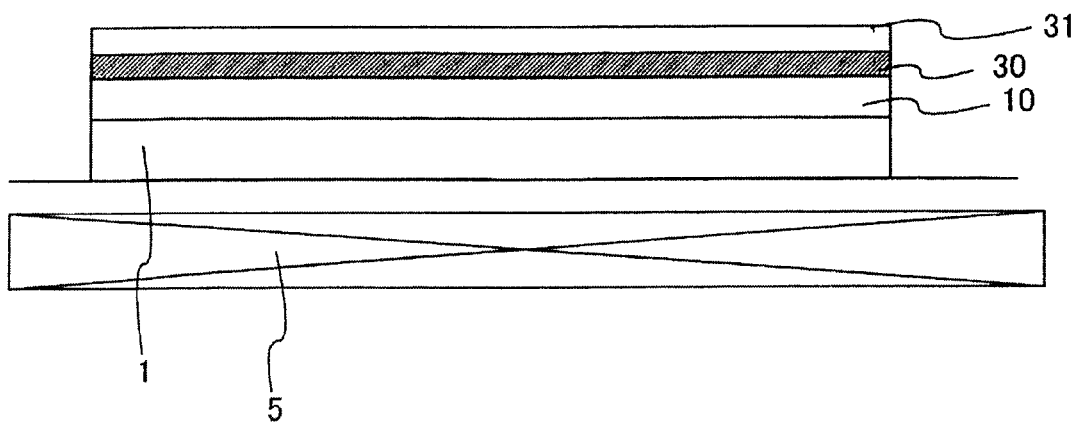
Figure 5:
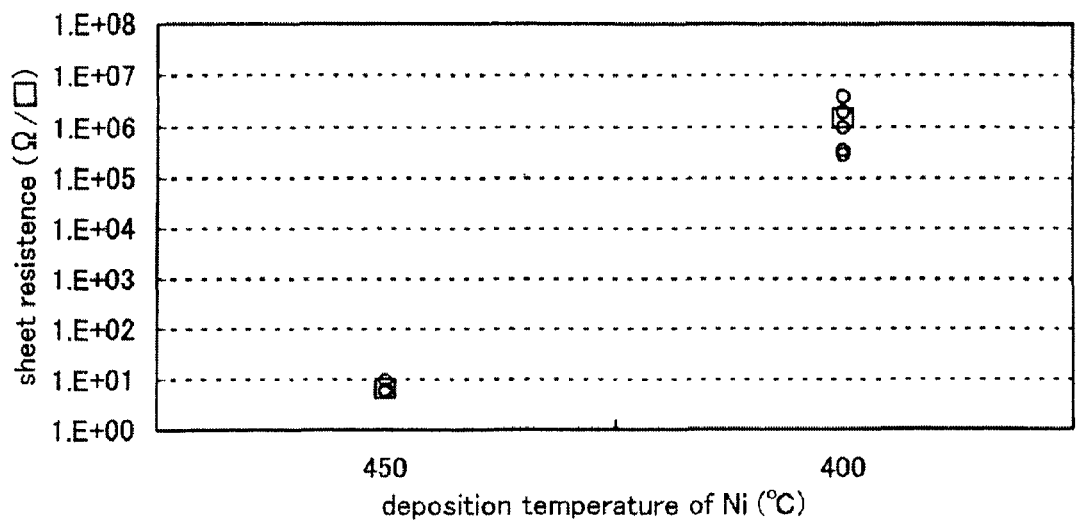
FIG. 5 is a graph showing a relationship between the film deposition temperature and the resistance value.
Figure 6:
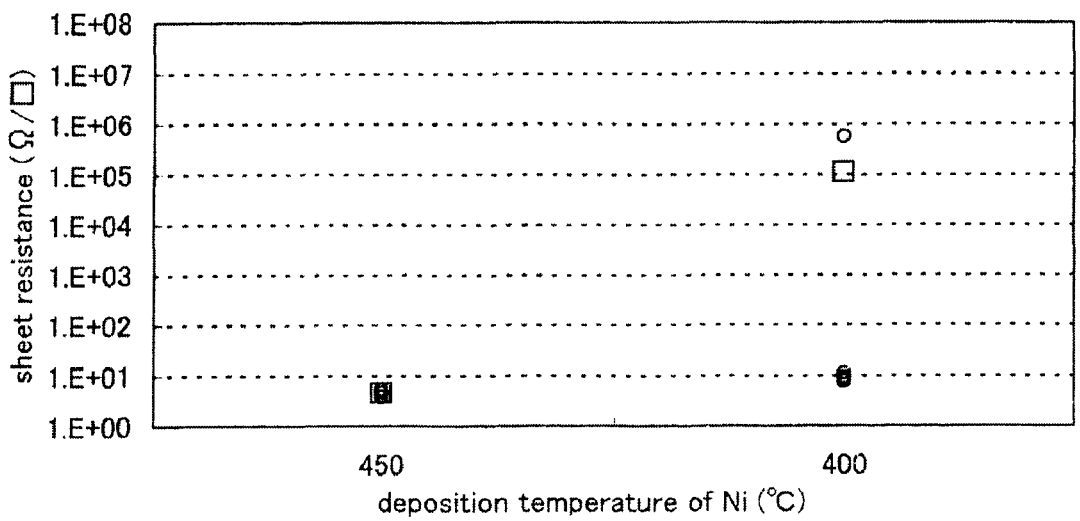
FIG. 6 is a graph showing a relationship between the film deposition temperature and the resistance value.

FIG. 5 and FIG. 6 show results obtained by examining the Ni film deposition temperature (substrate heating temperature) in the formation of Ni silicide, using the crystalline silicon film 10 manufactured in accordance with Embodiment 1. Note that in the ordinate axes in FIGS. 5 and 6, 1.E+00 indicates 1; 1.E+01 indicates 10; 1.E+02 indicates 100; 1.E+03 indicates 1000; 1.E+04 indicates $10^4$; 1.E+05 indicates $10^5$; 1.E+06 indicates $10^6$; 1.E+07 indicates $10^7$; and 1.E+08 indicates $10^8$. After removing the oxide film on the surface of the crystalline silicon film 10 using hydrofluoric acid, a Ni film 31 was deposited by sputtering while heating the crystalline silicon film 10 with the heater 5, thereby forming Ni silicide 30 (FIG. 1B). The power density at the film deposition was set to 4.2 $W/cm^2$ and the thickness of the Ni film was set to 50 nm. After forming the Ni silicide, an unreacted portion of the Ni film was removed and the surface sheet resistance was measured. FIG. 5 shows the surface sheet resistance after forming Ni silicide in the cases where the substrate heating temperature is set to 400° C. and 450° C., ○ indicates the measured value and □ indicates the average value.

It can be seen from FIG. 5 that the surface sheet resistance is high as for the deposition at 400° C. whereas the surface sheet resistance is lowered as for the deposition at 450° C. and thus silicide is formed. Thus, by depositing a Ni film at 450° C. or higher, nickel suicide can be formed without applying heat treatment thereafter.

Needless to say, heat treatment may be applied after depositing the Ni film. However, in this case, a heat treatment step is additionally required. FIG. 6 shows the surface sheet resistance measured after retaining the deposition temperatures (400° C. and 450° C.) for 5 minutes after the deposition ○ indicates the measured value and □ indicates the average value. It can be seen from FIG. 6 that the surface sheet resistance does not change much as for the deposition at 450° C. even when the deposited film is retained at 450° C. for 5 minutes thereafter On the other hand, the surface sheet resistance is lowered as for the deposition at 400° C. if the deposited film is retained at 400° C. for 5 minutes thereafter. Thus, it was verified that the silicide formation can be promoted by performing heat treatment after the film deposition.

Embodiment 3

Figure 7:
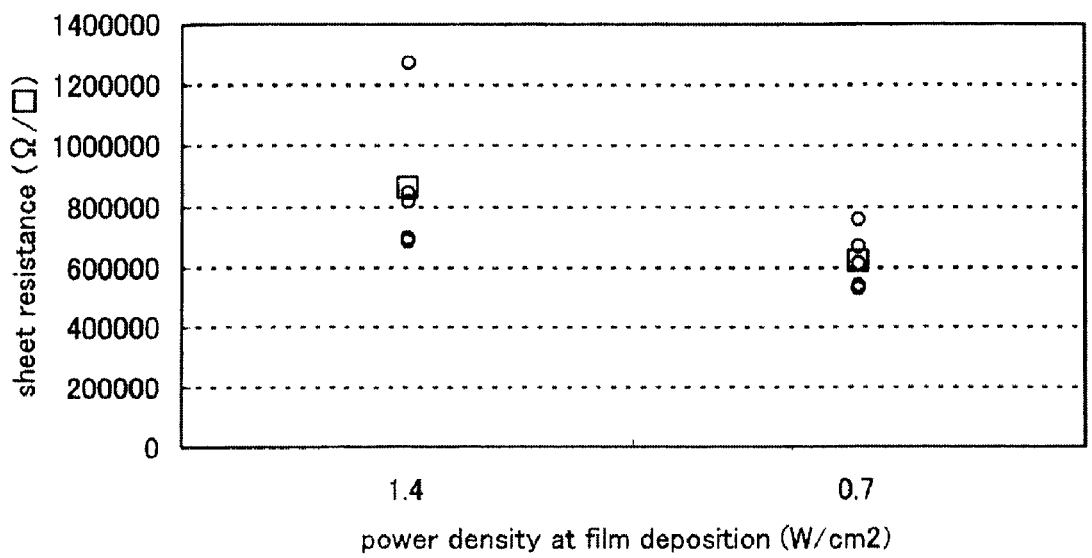
FIG. 7 is a graph showing a relationship between the film deposition power and the resistance value.

An experiment was made on the power at the Ni film deposition in the formation of Ni silicide, using the crystalline silicon film 10 manufactured in accordance with Embodiment 1. The Ni silicide 30 was formed by depositing the Ni film 31 by sputtering without removing the oxide film on the surface of the crystalline silicon film 10 (FIG. 1B), The substrate heating temperature at the Ni film deposition was set to 400° C. and the thickness of the Ni film was set to 15 nm, and the surface sheet resistance was measured after removing an unreacted portion of the Ni film after the formation of Ni silicide. FIG. 7 shows the surface sheet resistance after forming Ni silicide in the cases where the power density at the Ni film deposition is set to 1.4 $W/cm^2$ and 0.7 $W/cm^2$. ○ indicates the measured value and □ indicates the average value.

It can be seen from FIG. 7 that the surface sheet resistance is lower in the case of setting the power density at the film deposition to 0.7 $W/cm^2$ than 1.4 $W/cm^2$. Note that in FIG. 7, the surface sheet resistance has variations when the power density at the film deposition is set to 1.4 $W/cm^2$ and 0.7 $W/cm^2$. This is supposedly because the substrate heating temperature is set to 400° C. However, when the film deposition power was set lower, there was an obvious difference in the surface sheet resistance. That is, it was verified that more excellent Ni silicide can be formed at least when the power density is set lower than 1.4 $W/cm^2$.

Embodiment 4

An experiment was made on the presence of an oxide film on the surface of the silicon film before depositing a Ni film in the formation of Ni silicide, using the crystalline silicon film 10 manufactured in accordance with Embodiment 1. After removing the oxide film on the surface of the crystalline silicon film 10, the Ni film 31 was deposited by sputtering with the heater 5, thereby forming the Ni silicide 30 (FIG. 1B). On the other hand, as a comparative example, a Ni film was deposited by sputtering without removing the oxide film on the surface of the crystalline silicon film 10. The substrate heating temperature at the Ni film deposition was set to 400°

Figure 8:
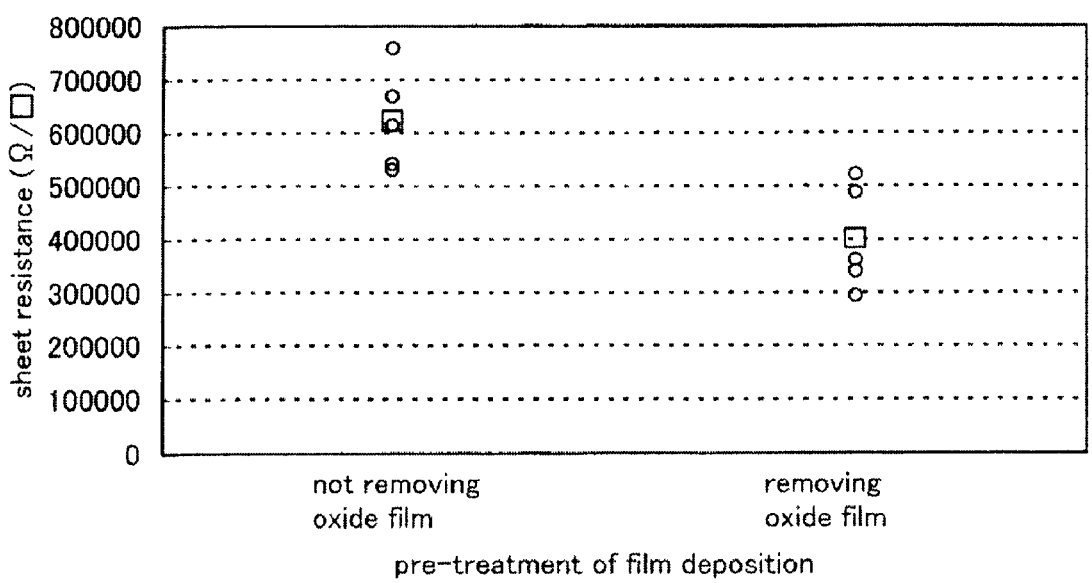
FIG. 8 is a graph showing a relationship between the pre-film deposition conditions and the resistance value.

C., the power density at the film deposition was set to 0.7 W/cm$^2$ and the thickness of the Ni film was set to 15 nm, and the surface sheet resistance was measured after removing an unreacted portion of the Ni film after the formation of Ni silicide. FIG. 8 shows the surface sheet resistance of a crystalline silicon film after forming Ni silicide in the cases where an oxide film is removed (oxide removal is provided) and not removed (oxide removal is not provided) before depositing a Ni film. ○ indicates the measured value and □ indicates the average value.

It can be seen from FIG. 8 that the surface sheet resistance is high in the case where the oxide film is not removed (oxide removal is not provided) whereas the surface sheet resistance is low in the case where the oxide film is removed (oxide removal is provided). Note that in FIG. 8, the surface sheet resistance has variations in the case cases where the oxide film is removed and not removed. This is supposedly because the substrate heating temperature is set to 400° C. However, there was an obvious difference in the surface sheet resistance between the cases where the oxide film is removed and not removed. That is; it was verified that a more excellent silicide layer can be formed by removing the oxide film.

Embodiment 5

Figure 9:
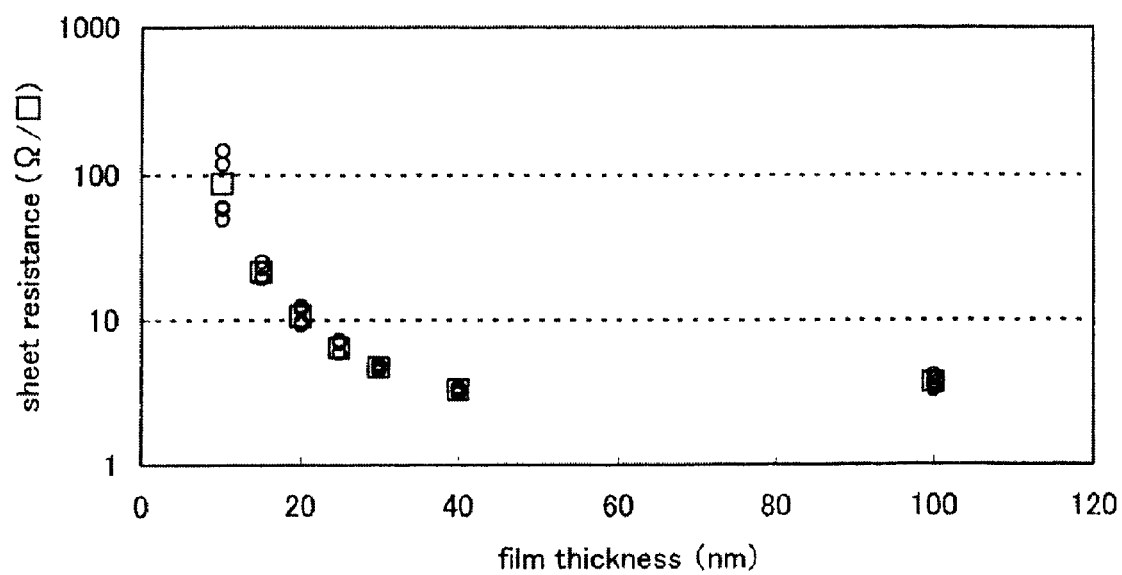
FIG. 9 is a graph showing a relationship between the thickness of a Ni film and the resistance value.

An experiment was made on the thickness of a Ni film in the formation of Ni silicide, using the crystalline silicon film 10 manufactured in accordance with Embodiment 1. After removing the oxide film on the surface of the crystalline silicon film 10, the Ni film 31 was deposited by sputtering with the heater 5, thereby forming the Ni silicide 30 (FIG. 1B). The thickness of the Ni film at this time was set to 5 to 100 nm. The power density at the film deposition was set to 0.7 W/cm$^2$ and the Ni film deposition temperature (substrate heating temperature) was set to 450° C. After forming the Ni silicide, an unreacted portion of the Ni film was removed and then the surface sheet resistance was measured. FIG. 9 shows the surface sheet resistance after the formation of the Ni silicide corresponding to each thickness of the Ni film. ○ indicates the measured value and □ indicates the average value.

In FIG. 9, the surface sheet resistance is high in the Ni film with a thickness of 5 nm whereas the surface sheet resistance is low in the Ni film with a thickness of 10 nm. It was also verified that the surface sheet resistance becomes lower as the Ni film is made thicker, and the surface sheet resistance can be stably lowered if the Ni film is formed to have a thickness of 15 nm or more. When the Ni film is formed to have a thickness of 40 nm or more, there was no change in the surface sheet resistance. As described in Embodiment 1, the thickness of the silicon film is 66 nm and the whole silicon film is reacted to form Ni silicide by deposition of a Ni film with a thickness of 40 nm or more; therefore, it can be considered that there is no change in the surface sheet resistance. Thus, it can be considered that the thickness of the Ni film having the stable surface sheet resistance depends on the thickness of the Si film.

Embodiment 6

Figure 10:
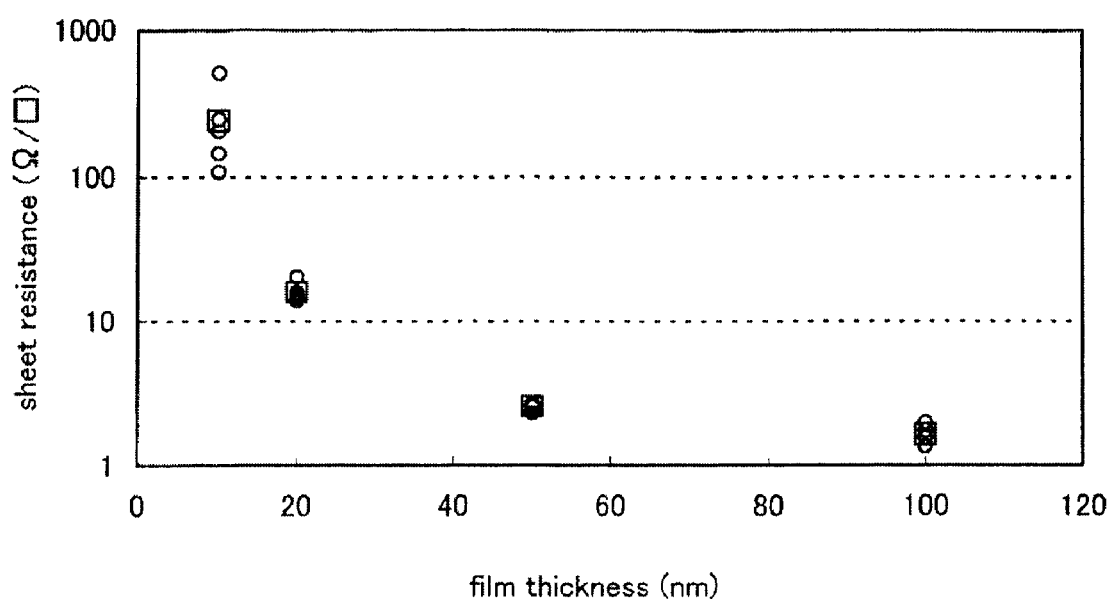
FIG. 10 is a graph showing a relationship between the thickness of a Ni film and the resistance value.

An experiment was made on the thickness of a Ni film in the formation of Ni silicide, using a Si wafer. After removing an oxide film on the surface of a Si wafer, a Ni film was deposited by sputtering with a heater, thereby forming Ni silicide. The thickness of the Ni film at this time was set to 5 to 100 nm. The power density at the film deposition was set to 0.7 W/cm$^2$ and the Ni film deposition temperature (substrate heating temperature) was set to 450° C. After forming the Ni silicide, an unreacted portion of the Ni film was removed and then the surface sheet resistance was measured. FIG. 10 shows the surface sheet resistance after formation of the Ni silicide corresponding to each thickness of the Ni film. ○ indicates the measured value and □ indicates the average value.

Here, it was verified that the surface sheet resistance is low when the Ni film has a thickness of 10 nm. If the Ni film is formed thicker, the surface sheet resistance becomes lower similarly to Embodiment 5.

Figure 11:
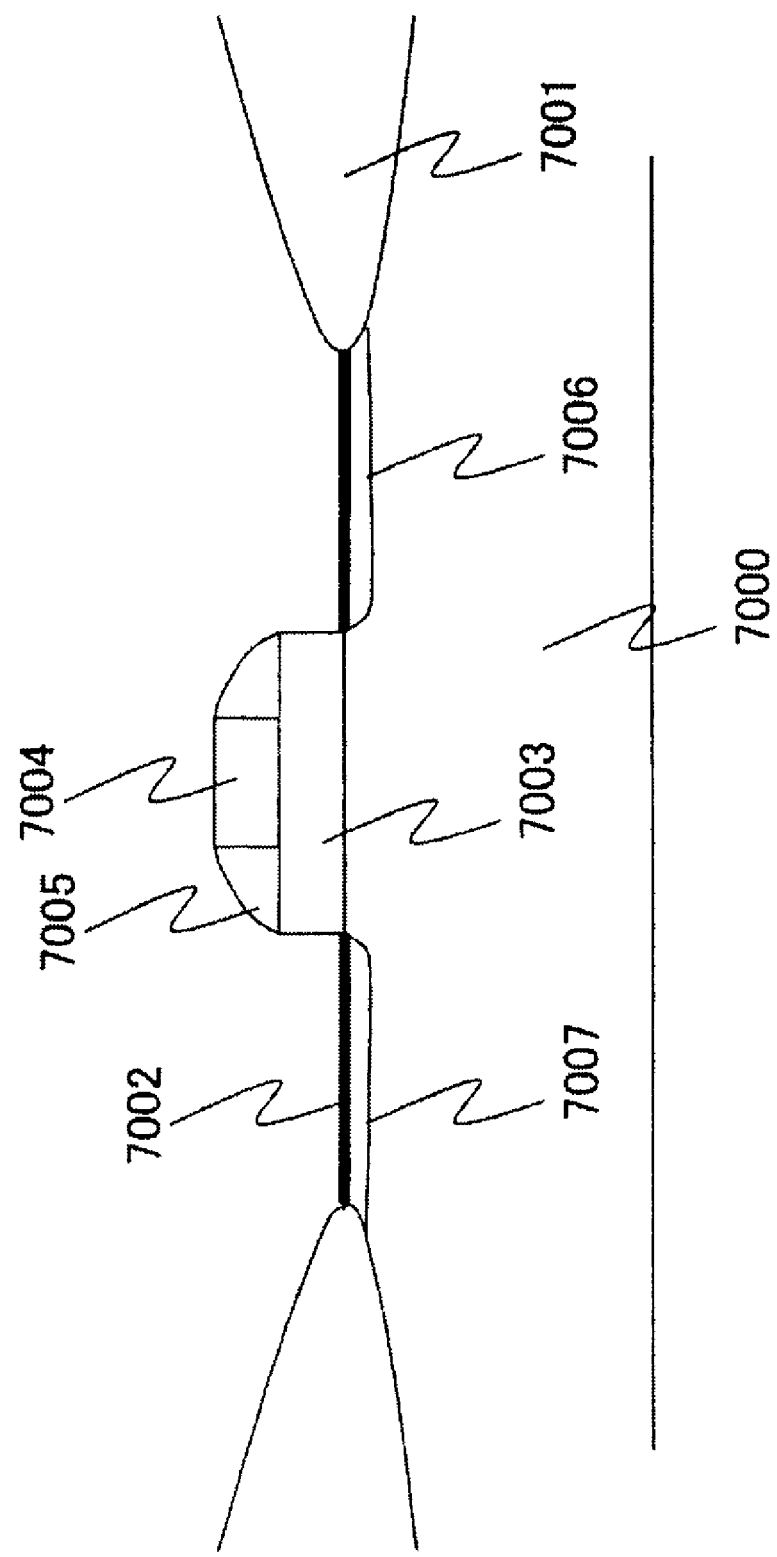
FIG. 11 illustrates a semiconductor device in accordance with the invention.

Description is made below on a method of forming a MOS transistor on a Si wafer in accordance with the invention (FIG. 11). First, a LOCOS oxide film 7001 is formed over a Si substrate 7000. Then, the Si substrate is dried and oxidized to obtain an oxide film, and then patterned to form a gate insulating film 7003.

A gate electrode 7004 is formed by depositing a polycrystalline Si film doped with impurity ions (phosphorus, boron ions or the like) by CVD and patterning it. The invention is not limited to the Si film and a metal film may be used.

Then, a silicon oxide film is formed over the entire surface by thermal CVD, and anisotropically etched to form sidewalls 7005 on side surfaces of the gate electrode 7004.

Using the gate electrode 7004 and the sidewalls 7005 as masks, impurity ions phosphorus, boron, As ions or the like) are added so as to form a source region and a drain region 7006 and 7007 in the Si wafer.

After removing the oxide film on the surface of the Si wafer with hydrofluoric acid, a Ni film is deposited by sputtering so as to form Ni silicide 7002. At this time, the thickness of the Ni film is set to 40 nm. The power density at the film deposition is set to 0.7 W/cm$^2$ and the Ni film deposition temperature (substrate heating temperature) is set to 450° C. After forming the Ni silicide 7002, an unreacted portion of the Ni film is removed. Note that in the case of using Si for the gate electrode, Ni silicide is also formed on the gate electrode.

Then, the source and drain regions 7006 and 7007 are activated by thermal treatment. The thermal treatment can be performed by laser irradiation, RTA, heat treatment using a furnace or the like. Note that in the invention, the resistance of the source and drain regions is sufficiently lowered by the formation of Ni silicide; therefore, the activation step may be omitted. Through the aforementioned steps, a MOS transistor having low-resistant source and drain regions can be formed.

Embodiment 7

Description is made below on an example where a TFT is manufactured in accordance with the invention. Note that a silicon nitride oxide film 40 and a silicon oxynitride film 41 are formed over the substrate 1, over which the crystalline silicon film 10 obtained through the steps up to FIG. 3B is formed.

Figure 12A:
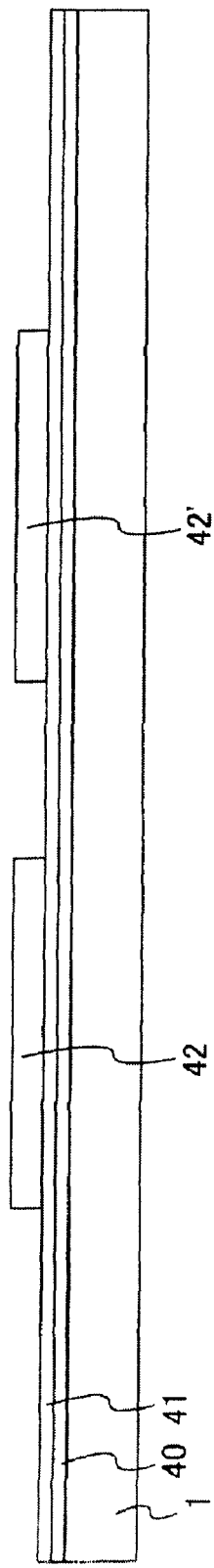
FIG. 12A and FIG. 12B illustrate manufacturing steps of a semiconductor device in accordance with the invention.

First, the crystalline silicon film 10 is formed into island-like crystalline silicon films 42 and 42' by a photolithography step (FIG. 12A). Then, a gate insulating film 43 is formed covering the crystalline silicon films 42 and 42' Here, silicon oxynitride (SiO$_x$N$_y$) (x>y) is deposited with a thickness of 40 nm by plasma CVD.

Then, a first conductive layer and a second conductive layer are stacked over the gate insulating film 43. The first conductive layer is formed by depositing a TaN film with a thickness of 30 nm by sputtering. The second conductive layer is formed by depositing a W film with a thickness of 370 nm by sputtering.

Then, a resist mask is formed by photolithography and etching is applied for forming gate electrodes and gate lines. Thus, conductive layers (also called gate electrode layers) 44 to 47 functioning as gate electrodes are formed.

Figure 12B:
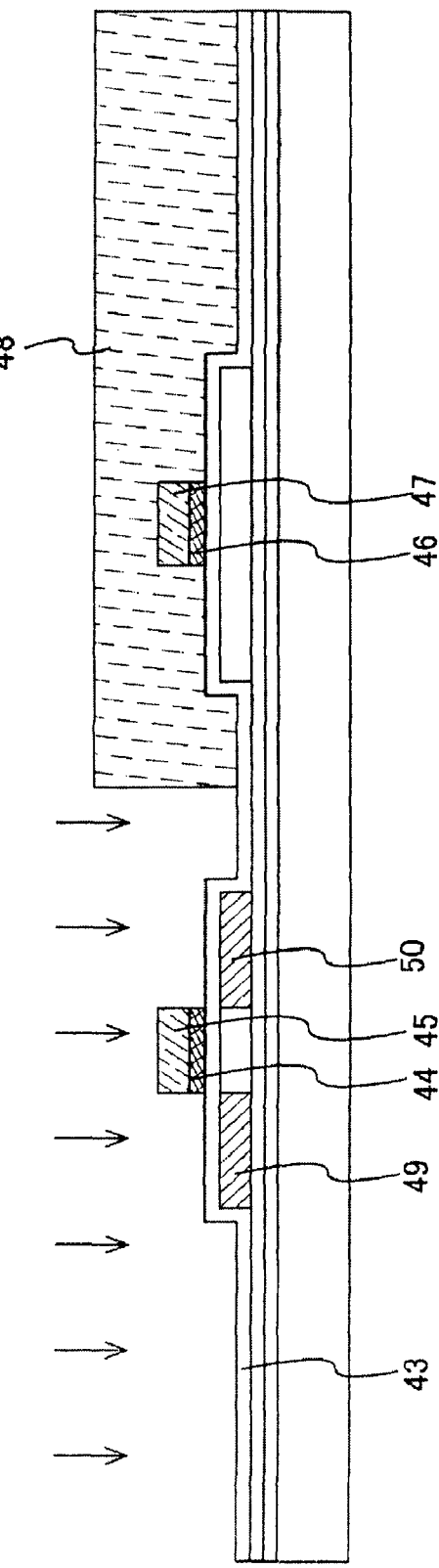

Then, the mask for forming the conductive layers 44 to 47 is removed and another resist mask 48 is formed by photolithography. Subsequently, the crystalline silicon film 42 is doped with a low concentration of n-type impurity elements phosphorus) by ion doping, thereby forming n-type impurity regions 49 and 50 (FIG. 12B).

Then, the resist mask 48 is removed and another resist mask 51 is formed by photolithography (FIG. 3A). Subsequently, the crystalline silicon film 42' is doped with p-type impurity elements (boron), thereby forming p-type impurity regions 52 and 53.

Figure 13A:
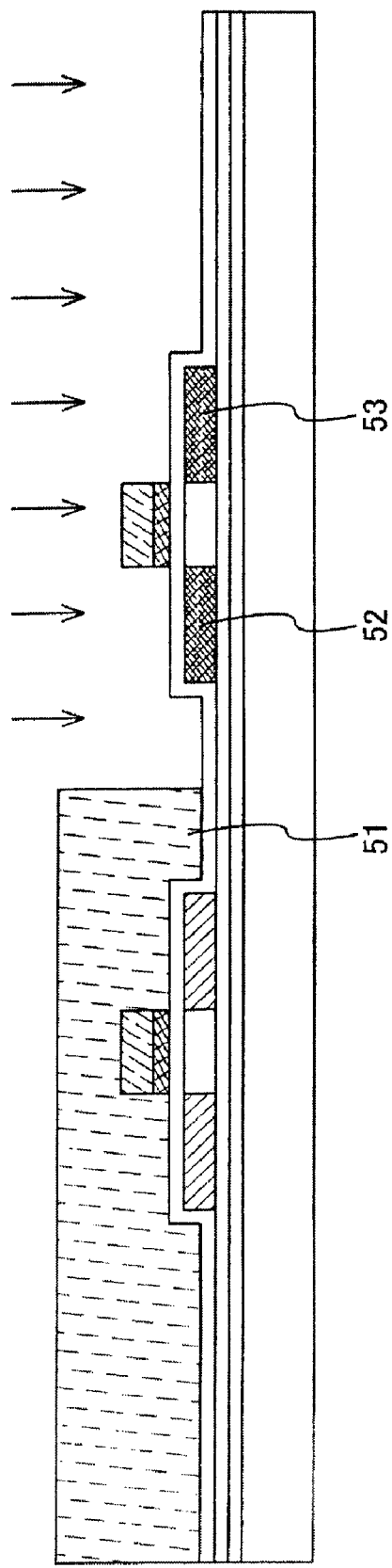
FIG. 13A and FIG. 13B illustrate manufacturing steps of a semiconductor device in accordance with the invention.
Figure 13B:
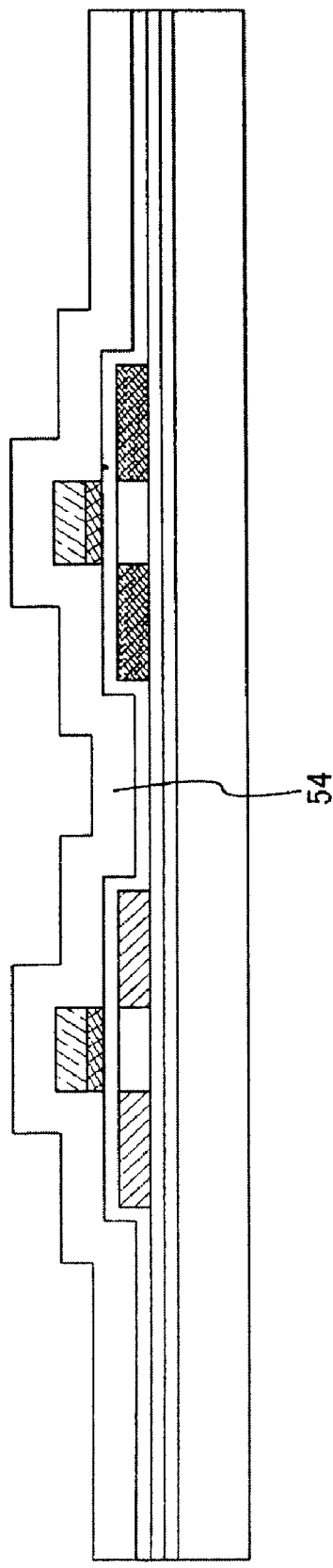

Then, the mask 51 is removed, and an insulating layer 54 is formed so as to cover the gate insulating film 43 and the conductive layers 44 to 47 (FIG. 13B). The insulating layer 54 is formed by depositing a silicon oxynitride film ($SiO_xN_y$ film) (x>y) with a thickness of 100 nm by plasma CVD and depositing a silicon oxide film ($SiO_2$ film) thereover with a thickness of 200 nm by thermal CVD.

Figure 14A:
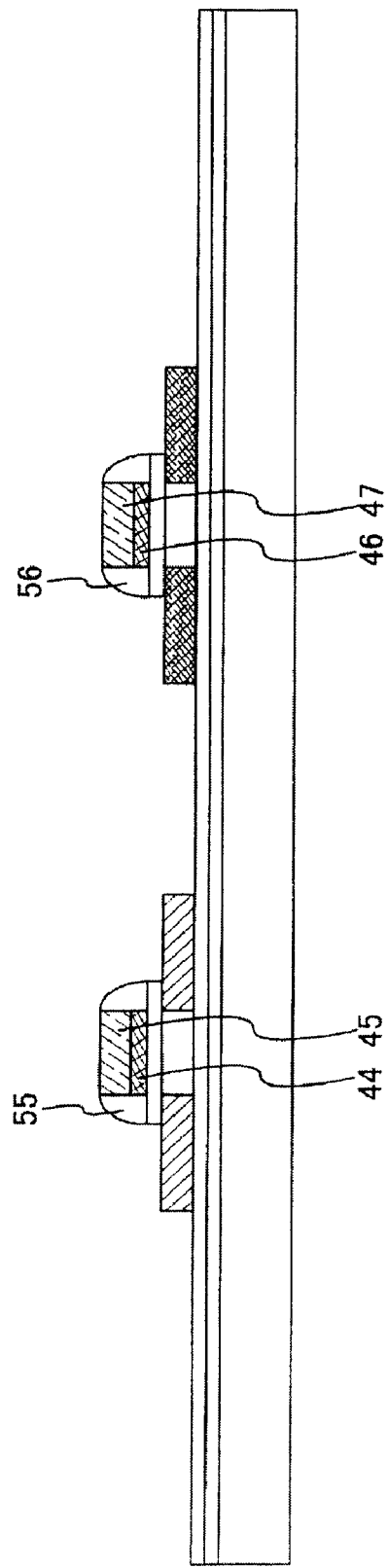
FIG. 14A and FIG. 14B illustrate manufacturing steps of a semiconductor device in accordance with the invention.

Then, the insulating layer 54 is selectively (mainly, in a perpendicular direction) etched by anisotropic etching, thereby forming insulating layers (hereinafter referred to as sidewall insulating layers) 55 and 56 on side surfaces of the conductive layers 44 to 47 (FIG. 14A). The sidewall insulating layers 55 and 56 are used as doping masks for forming LDD regions later. By this etching, the gate insulating film is also partially removed to expose a part of the crystalline silicon film.

Figure 14B:
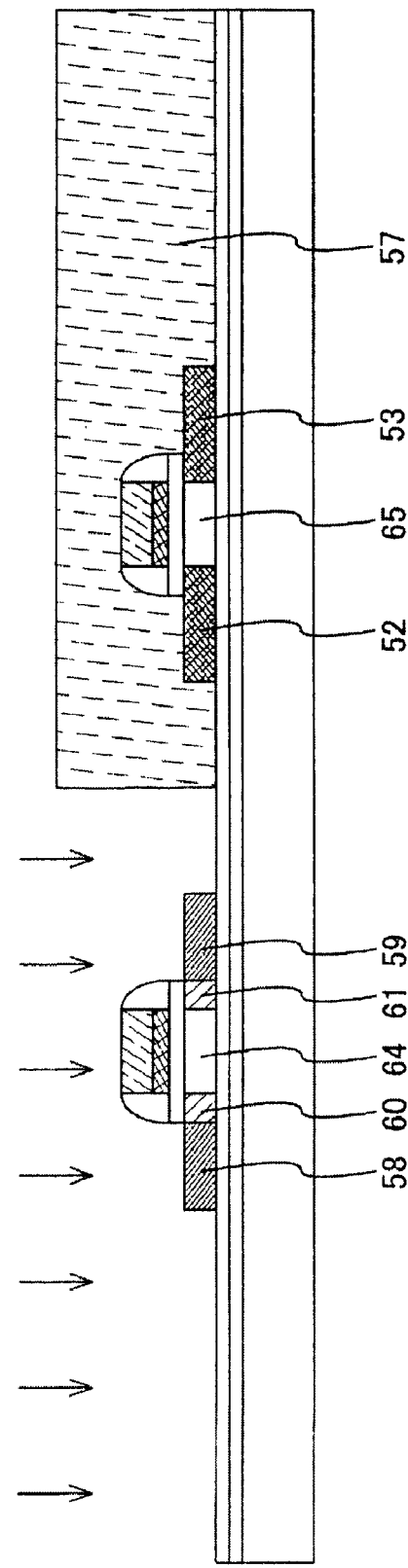

Then, a resist mask 57 is formed by photolithography. Subsequently, the crystalline silicon film 42 is doped with n-type impurity elements (phosphorus) using the sidewall insulating layers 55 and 56 as masks, thereby forming first n-type impurity regions (also referred to as LDD regions) 60 and 61 and second n-type impurity regions 58 and 59 (also referred to as source and drain regions) (FIG. 14B). The concentration of the impurity elements in the first n-type impurity regions 60 and 61 is lower than that in the second n-type impurity regions 58 and 59. After that, the mask 57 is removed.

Then, an oxide film formed on the surface of the crystalline silicon film is removed by etching. Here, the oxide film is removed by dropping a hydrofluoric acid solution which is composed of HF and $H_2O$ at a ratio of 1:99 for 90 seconds while rotating the substrate. Note that the sidewall insulating layers 55 and 56 are each formed of a silicon oxynitride film ($SiO_xN_y$ film) (x>y) and a silicon oxide film ($SiO_2$ film) while the gate insulating film is formed of a silicon oxynitride film ($SiO_xN_y$) (x>y). Therefore, it is concerned that these layers might be etched by the hydrofluoric acid solution. Thus, a comparison was made between the cases where the surface oxide film is removed and not removed. Referring to FIG. 16, it can be seen that there is no big change in the cross-sectional shape, and thus neither of the gate insulating film and the sidewall insulating layers suffers damage.

Figure 15A:
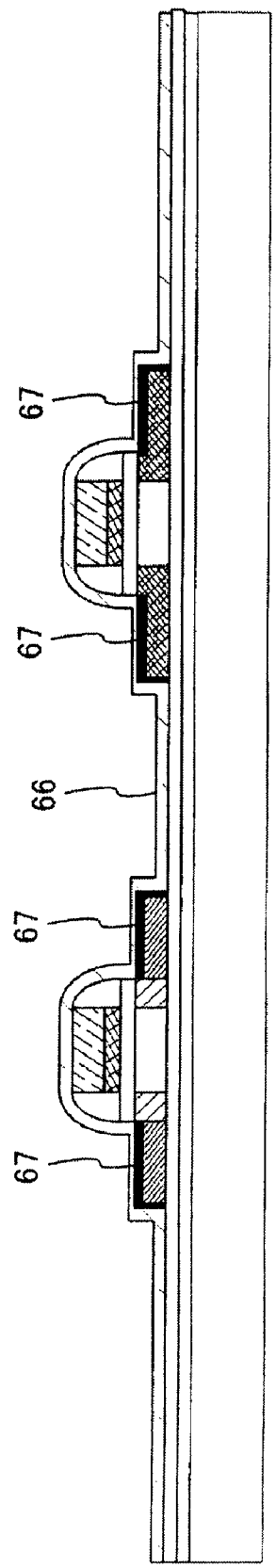
FIG. 15A and FIG. 15B illustrate manufacturing steps of a semiconductor device in accordance with the invention.

After removing the oxide film, a Ni film 66 is deposited by sputtering using a heater (not shown), thereby forming Ni silicide 67 (FIG. 15A). The heating temperature at the Ni film deposition is set to 450° C., the power density at the film deposition is set to 0.7 W/cm², and the thickness of the Ni film is set to 50 nm.

Figure 15B:
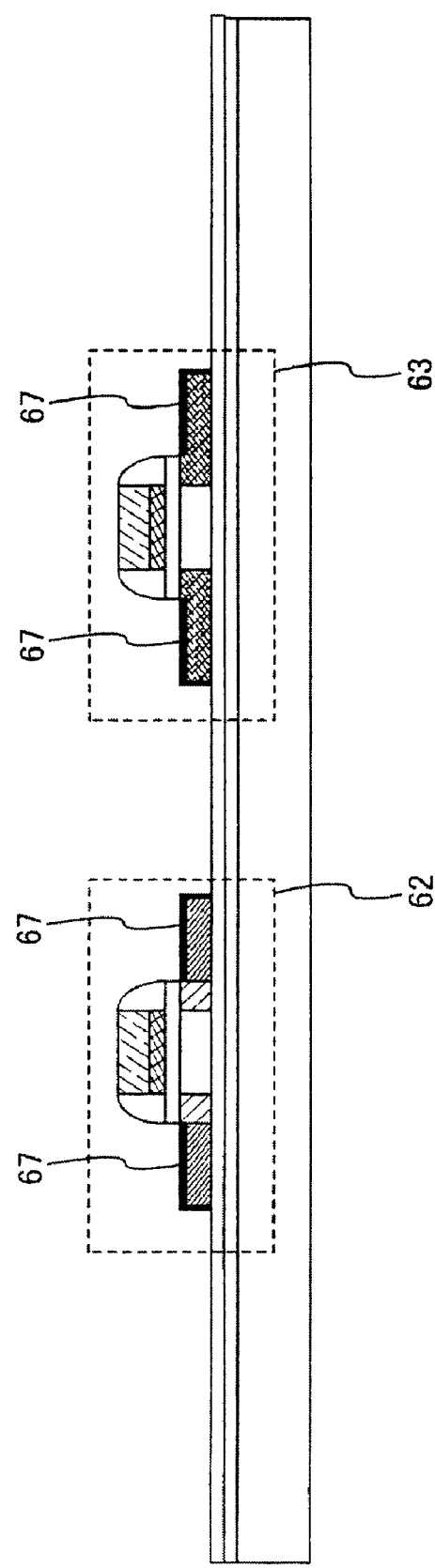

Then, an unreacted portion of the Ni film is removed. Here, it is removed with an etchant composed of HCl:$HNO_3$: $H_2O$=3:2:1. With such an etchant, Ni is etched at a rate of about 100 nm/minute, and W is etched at a rate of about 1 nm/minute; therefore, the gate electrode is not damaged by the etching (FIG. 15B). In the invention, Ni silicide is directly formed by depositing a Ni film while heating a silicon film so that the resistance of the silicon film is lowered; therefore, the source and drain regions are not required to be activated. Note that since heat treatment is applied in hydrogenation of the silicon film as described later, hydrogenation and activation may be performed at the same time.

Through the aforementioned steps, basic structures of an n-channel thin film transistor 62 and a p-channel thin film transistor 63 are completed. The n-channel thin film transistor 62 has a crystalline silicon film including the first n-type impurity regions 60 and 61, the second n-type impurity regions 58 and 59 and a channel region 64; the gate insulating film 43; and the conductive layers 44 and 45 functioning as a gate electrode. Such a structure of the thin film transistor 62 is called an LDD structure.

The p-channel thin film transistor 63 has a crystalline silicon film including the p-type impurity regions 52 and 53 and a channel region 65; the gate insulating film 43; and the conductive layers 46 and 47 functioning as a gate electrode. Such a structure of the thin film transistor 63 is called a single-drain structure.

Each of the thin film transistors 62 and 63 obtained through the aforementioned steps has a channel length of 0.5 to 5 μm, or preferably 1 to 3 μm. With such a characteristic, the response speed can be increased. Note that the channel length may be changed in accordance with the function of each circuit. For example, it is preferable that thin film transistors constituting a power source circuit which does not require a high-speed operation have a channel length of 3 μm while thin film transistors of the other circuits have a channel length of 1 μm.

Figure 17A:
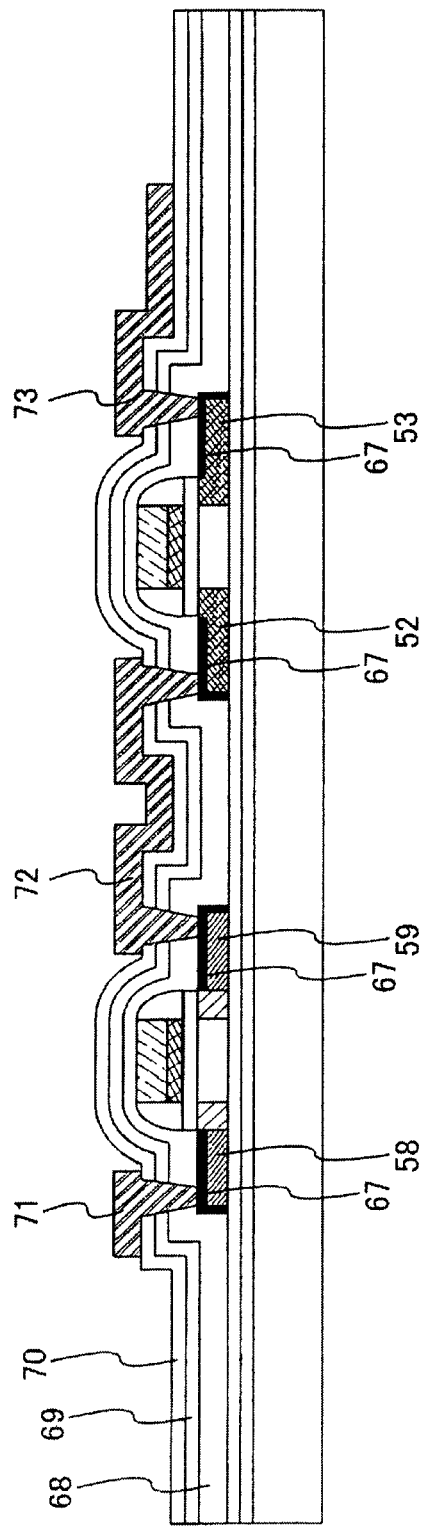
FIG. 17A and FIG. 17B illustrate manufacturing steps of a semiconductor device in accordance with the invention.
Figure 17B:
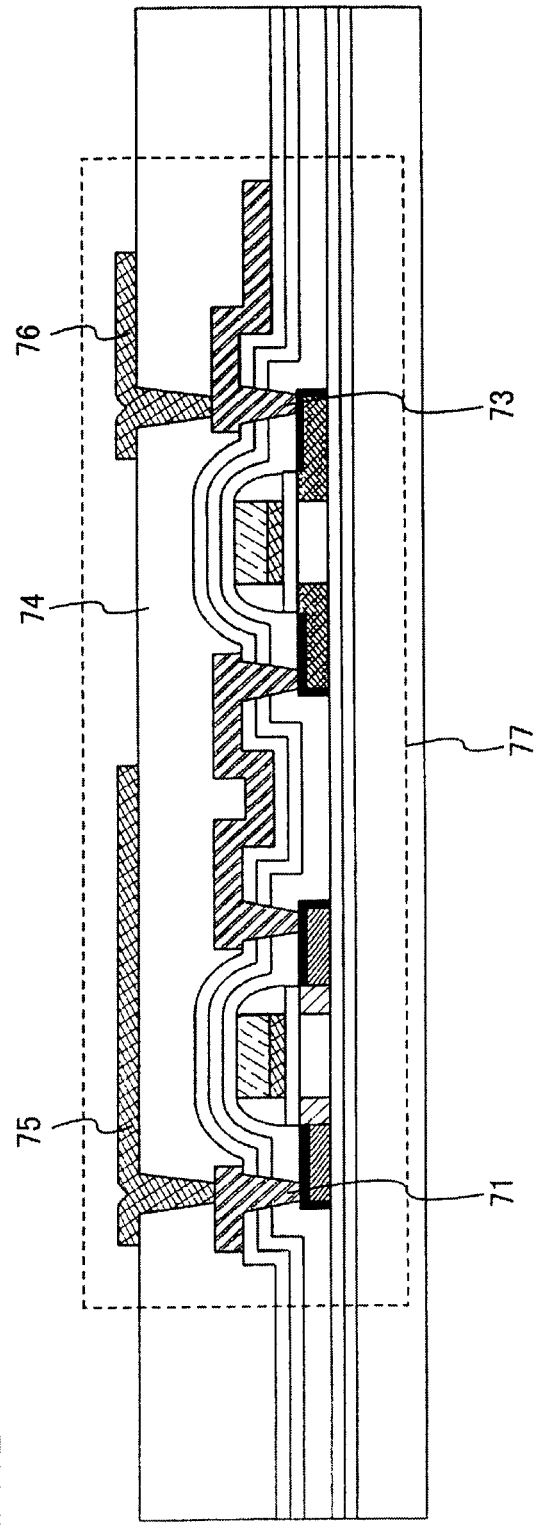

Then, an insulating layer 68 is formed covering the thin film transistors 62 and 63 (FIG. 17). The insulating layer 68 is formed by depositing silicon oxynitride ($SiO_xN_y$) (x>y) with a thickness of 50 nm by plasma CVD.

After forming the insulating layer 68, heat treatment is applied for hydrogenation of the silicon film. Here, heat treatment is applied at 550° C. for 4 hours in a nitrogen atmosphere. By such heat treatment, crystallinity of the silicon film can be recovered as well as the impurity elements added into the silicon film can be activated. Note that the activation step may be omitted as described above since the resistance of the source and drain regions can be sufficiently lowered by using the invention.

Then, a single layer or stacked layers are formed by using an inorganic material such as silicon oxide or silicon nitride, or an organic material such as polyimide, polyamide, benzocyclobutene, acrylic, epoxy or siloxane. Note that siloxane is composed of a skeleton formed by the bond of silicon (Si) and oxygen (O), which contains an organic group containing at least hydrogen (e.g., alkyl group or aromatic hydrocarbon) as a substituent. Alternatively, a fluoro group may be used as the substituent. Further alternatively, both a fluoro group and an organic group containing at least hydrogen may be used as the substituent. In the shown cross-sectional structure, the insulating layer covering the thin film transistors 62 and 63 has a three-layer structure. For example, a layer containing silicon oxide may be formed as the first insulating layer 68, a layer containing silicon nitride may be formed as a second insulating layer 69, and a layer containing silicon oxide may be formed as a third insulating layer 70.

Then, the insulating layers 68 to 70 are etched by photolithography, thereby forming contact holes to expose the p-type impurity regions 52 and 53 and the n-type impurity regions 58 and 59, namely to expose the Ni silicide 67. Subsequently, a conductive layer is formed so as to fill the contact holes, and patterned to form conductive layers 71 to 73 functioning as source or drain wires.

Each of the conductive layers 71 to 73 is formed in a single layer or stacked layers by a known method (e.g., plasma CVD or sputtering) using an element selected from titanium (Ti), aluminum (Al) and neodymium (Nd) or an alloy material or compound material containing such elements as a main component. As the alloy material containing aluminum as a main component, for example, there are a material containing aluminum as a main component and also containing nickel, and a material containing aluminum as a main component and also containing one or both of carbon and silicon. Each of the conductive layers 71 to 73 is preferably formed by stacking, for example, a barrier layer, an aluminum silicon (Al—Si) layer and a barrier layer in this order, or staking a barrier layer, an aluminum silicon (Al—Si) layer, a titanium nitride (TiN) layer and a barrier layer in this order Note that the barrier layer corresponds to a thin film formed of titanium, titanium nitride, molybdenum or molybdenum nitride. Aluminum or aluminum silicon has a low resistance value and is inexpensive; therefore, it is the most preferable material for forming the conductive layers 71 to 73. If barrier layers are provided as the top and bottom layers, hillock generation of aluminum or aluminum silicon can be prevented. In addition, if a barrier layer is provided as the bottom layer, a favorable contact can be obtained between aluminum or aluminum silicon and the crystalline semiconductor layer. Further, titanium has high reducing ability. If the barrier layer is formed of titanium, a thin natural oxide film which may possibly be formed on the crystalline silicon film can be reduced and thus a favorable contact can be obtained between the titanium and the crystalline silicon film. Through the aforementioned steps, TFTs can be completed.

Embodiment 8

This embodiment illustrates an example where a CPU (Central Processing Unit) is manufactured in accordance with the invention. Here, the CPU is manufactured using a TFT which is manufactured in accordance with Embodiment 6. Note that the identical portions to those in the aforementioned embodiments are denoted by the identical reference numerals. First, an insulating layer 74 is formed so as to cover the conductive layers 71 to 73 (cross-sectional view of FIG. 17B). The insulating layer 74 is formed in a single layer or stacked layers by a known method (e.g., SOG method or droplet discharge method) using an inorganic material or an organic material. The insulating layer 74 is a thin film formed in order to alleviate and planarize projections/depressions due to the thin film transistors. Therefore, it is preferably formed using an organic material.

Then, the insulating layer 74 is etched by photolithography to form contact holes which expose a part of the conductive layers 71 and 73. Then, a conductive layer is formed so as to fill the contact holes, and patterned to form conductive layers 75 and 76 functioning as wires or the like. Each of the conductive layers 75 and 76 is formed in a single layer or stacked layers using an element selected from aluminum (Al), titanium (Ti), silver (Ag) and copper (Cu) or an alloy material or compound material containing such elements as a main component. For example, each of the conductive layers 75 and 76 may be formed by stacking a barrier layer and an aluminum layer in this order, or stacking a barrier layer, an aluminum layer and a barrier layer in this order. The barrier layer corresponds to titanium, titanium nitride, molybdenum, molybdenum nitride or the like.

The elements completed through the aforementioned steps such as the thin film transistors 62 and 63, and the conductive layers 75 and 76 functioning as wires or the like are collectively referred to as a thin film integrated circuit 77. Note that though not shown in this step, a protective layer may be formed by a known method so as to cover the thin film integrated circuit 77. The protective layer may be a layer containing carbon such as DLC (Diamond Like Carbon), a layer containing silicon nitride, a layer containing silicon nitride oxide or the like.

In this embodiment, a semiconductor device having a thin film integrated circuit formed in the aforementioned manner, specifically a CPU can be manufactured, which can perform high-speed operation with a driving voltage of 5 V and an operating frequency of 30 MHz.

Description is made below with reference to a block diagram on the configuration of the CPU of this embodiment.

Figure 18:
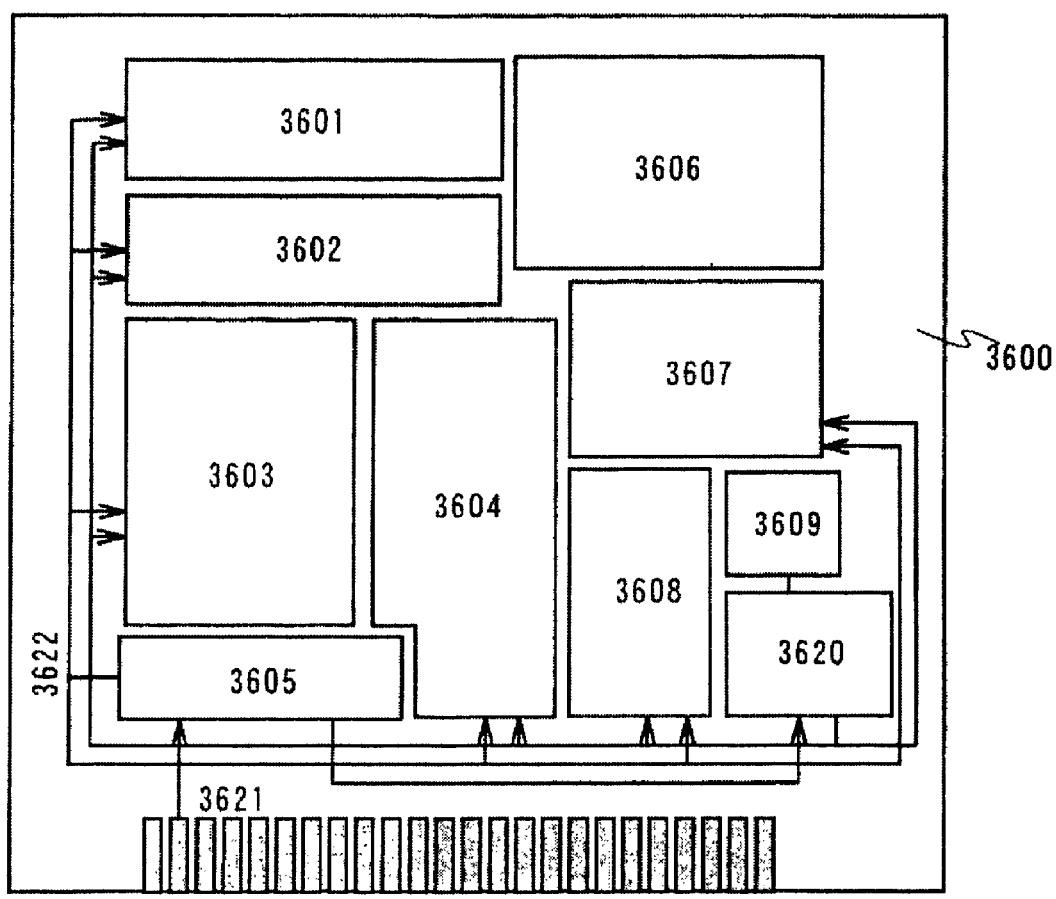
FIG. 18 illustrates a semiconductor device in accordance with the invention.

The CPU shown in FIG. 18 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, a rewritable ROM 3609 and a ROM interface (ROM I/F) 3620, over a substrate 3600. The ROM 3609 and the ROM interface 3620 may be provided in a separate chip as well.

Needless to say, the CPU shown in FIG. 18 is only a schematic configuration example, and the actual CPU may have various configurations depending on each application.

An instruction inputted to the CPU through the bus interface 3608 is once inputted to the instruction decoder 3603 and decoded therein, and then inputted to the ALU controller 3602, the interrupt controller 3604, the register controller 3607 and the timing controller 3605.

The ALU controller 3602, the interrupt controller 3604, the register controller 3607 and the timing controller 3605 perform various controls based on the decoded instruction. Specifically, the ALU controller 3602 generates signals for controlling the drive of the ALU 3601. While the CPU is executing programs, the interrupt controller 3604 determines an interrupt request from an external input/output device or a peripheral circuit based on its priority state and the like, and processes the request. The register controller 3607 generates an address of the register 3606, and reads/writes data from/to the register 3606 in accordance with the state of the CPU.

The timing controller 3605 generates signals for controlling the driving timing of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the clock signal CLK2 to the various aforementioned circuits.

Figure 19:
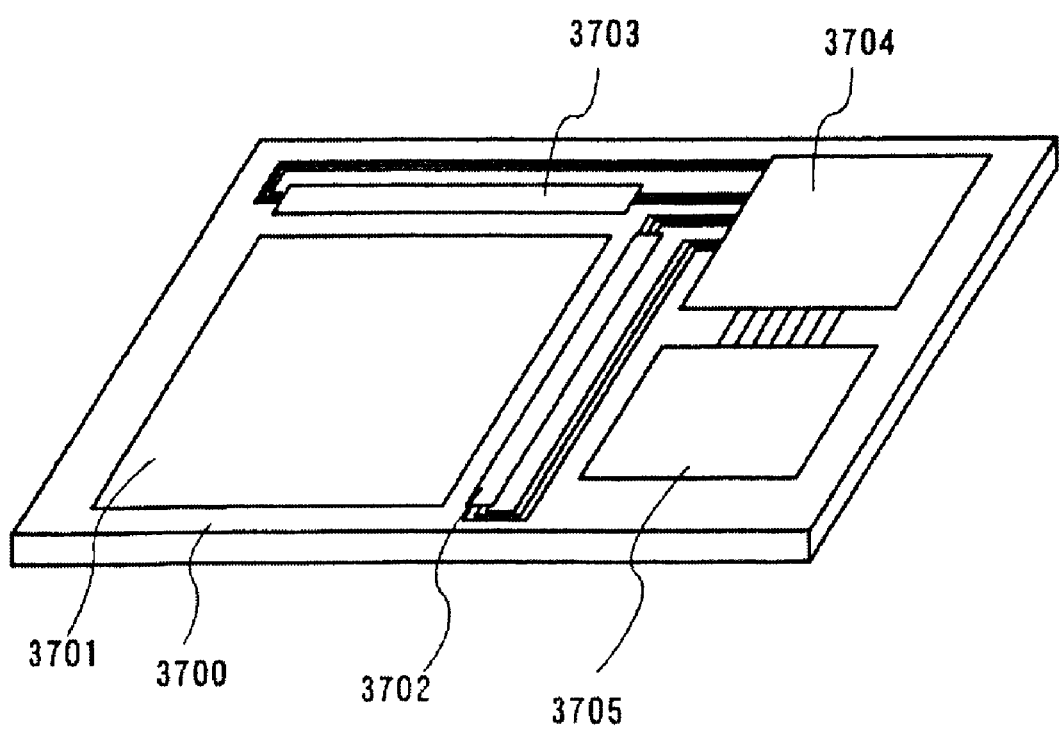
FIG. 19 illustrates a semiconductor device in accordance with the invention.

FIG. 19 shows a display device, a so-called system-on-panel in which a pixel portion, a CPU and other circuits are formed over the same substrate. Over a substrate 3700, a pixel portion 3701, a scan line driver circuit 3702 for selecting a pixel included in the pixel portion 3701, and a signal line driver circuit 3703 for supplying a video signal to the selected pixel are provided. A CPU 3704 is connected to other circuits, for example a control circuit 3705 by wires which are led from the scan line driver circuit 3702 and the signal line driver circuit 3703. Note that the control circuit includes an interface. A connecting portion with an FPC terminal is provided at an edge of the substrate so as to transmit/receive signals to/from external circuits.

As additional circuits, a video signal processing circuit, a power source circuit, a gray scale power source circuit, a video RAM, a memory (DRAM, SRAM, PROM) and the like can be provided over the substrate. Alternatively, these circuits may be formed on IC chips and mounted onto the substrate. Further, the scan line driver circuit 3702 and the signal line driver circuit 3703 may not necessarily be formed over the same substrate. For example, only the scan line driver circuit 3702 may be formed over the same substrate as the pixel portion 3701 while the signal line driver circuit 3703 may be formed on an IC chip and mounted onto the substrate.

Figure 20A:
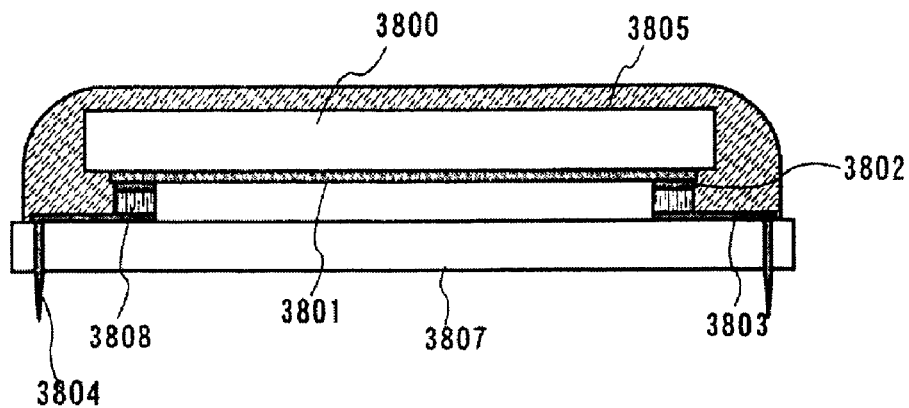
FIG. 20A to FIG. 20C illustrate manufacturing steps of a semiconductor device in accordance with the invention.

FIG. 20A shows a mode of a packaged CPU. A thin film transistor array 3801 having a CPU function which is formed over a substrate 3800 is provided in a face-down position so that an electrode 3802 (a source or drain electrode, or an electrode formed thereover with an insulating film interposed therebetween) provided over the surface of the CPU is positioned to face the bottom side. The substrate 3800 may be formed using glass or plastics. In addition, a wiring board provided with a wire 3803 which is formed of copper or an alloy thereof; for example a printed board 3807 is provided. The printed board 3807 is provided with a connecting terminal (pin) 3804. The electrode 3802 and the wire 3803 are connected to each other with an anisotropic conductive film 3808 or the like. After that, an upper side of the substrate 3800 is covered with a resin 3805 such as an epoxy resin, thereby completing a packaged CPU. Alternatively, the periphery of the substrate may be surrounded with plastics or the like while keeping a hollow space.

Figure 20B:
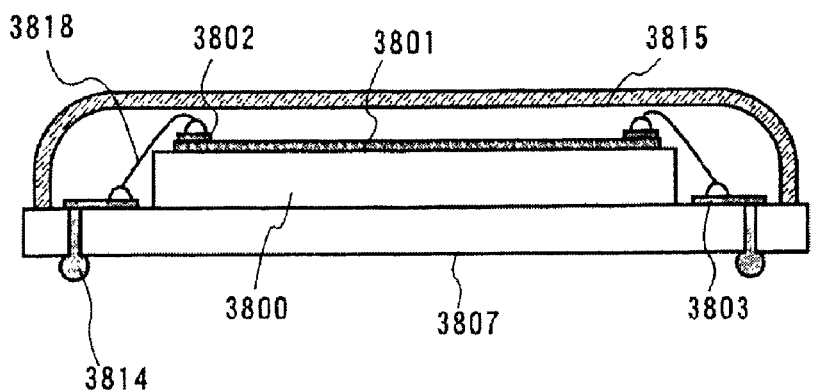

FIG. 20B shows another mode of a packaged CPU in which the electrode 3802 formed over the surface of the CPU is provided in a face-up position, unlike FIG. 20A The substrate 3800 is secured onto the printed board 3807, and the electrode 3802 and the wire 3803 are connected to each other with a wire 3818. Such connection with a wire is called wire bonding. The electrode 3802 and a bump 3814 connected to the wire 3803 are connected to each other. After that, the periphery of the substrate is surrounded with plastic 3815 or the like while keeping a hollow space, thereby completing a packed CPU.

Figure 20C:
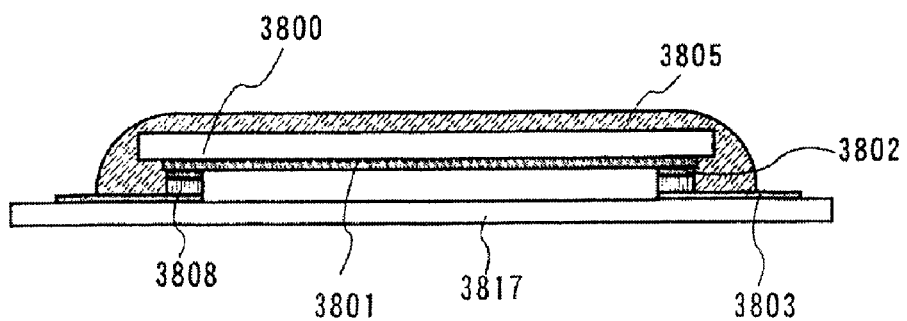

FIG. 20C shows still another mode of a packaged CPU in which the thin film transistor array 3801 having a CPU function is secured onto a flexible substrate, for example an FPC (Flexible Printed Circuit). The thin film transistor array 3801 having a CPU function which is formed over the substrate 3800 is provided in a face-down position so that the electrode 3802 provided over the surface of the CPU is positioned to face the bottom side. The substrate 3800 may be formed using glass, quartz, metals, a bulk semiconductor, or plastics. In FIG. 20C, plastic having high flexibility is preferably employed. In addition, an FPC 3817 having flexibility which is provided with the wire 3803 formed of copper or an alloy thereof is provided. Then, the electrode 3802 and the wire 3803 are connected to each other with the anisotropic conductive film 3808. After that, an upper side of the substrate 3800 is covered with the resin 3805 such as an epoxy resin, thereby completing a packaged CPU.

The CPU packaged in this manner is protected from external shocks, so that it can be easily carried about. In addition, the CPU can be mounted onto a desired position. In particular, if the CPU has flexibility as in FIG. 2C, the mounting position can be determined with high flexibility. Further, the CPU function can be by supplemented by packaging the CPU.

In this manner, a semiconductor device such as a CPU can be manufactured by using the TFT of the invention. Since a CPU formed using thin film transistors is lightweight, it can be carried about or mounted with less load. In addition, by using the CPU described in this embodiment and various display devices manufactured in accordance with the invention, a system-on-panel can be manufactured.

This embodiment can be appropriately implemented in combination with other embodiment modes or embodiments.

Embodiment 9

Figure 21A:
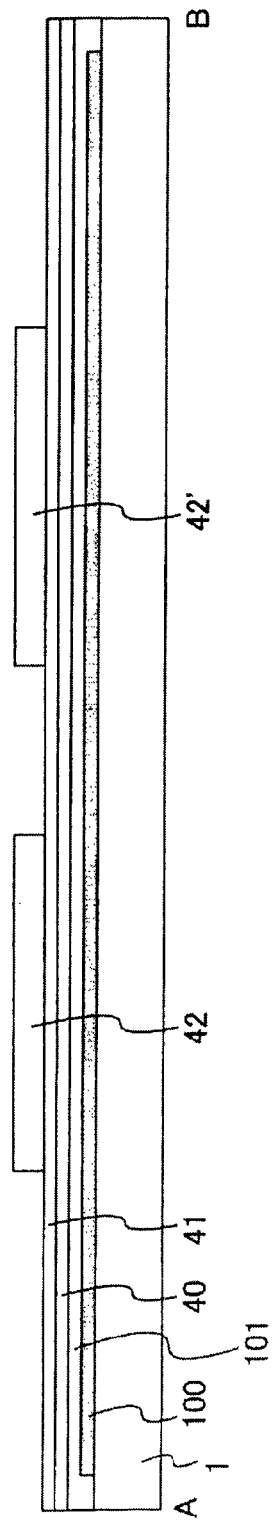
FIG. 21A and FIG. 21B illustrate manufacturing steps of an ID chip in accordance with the invention.
Figure 22:
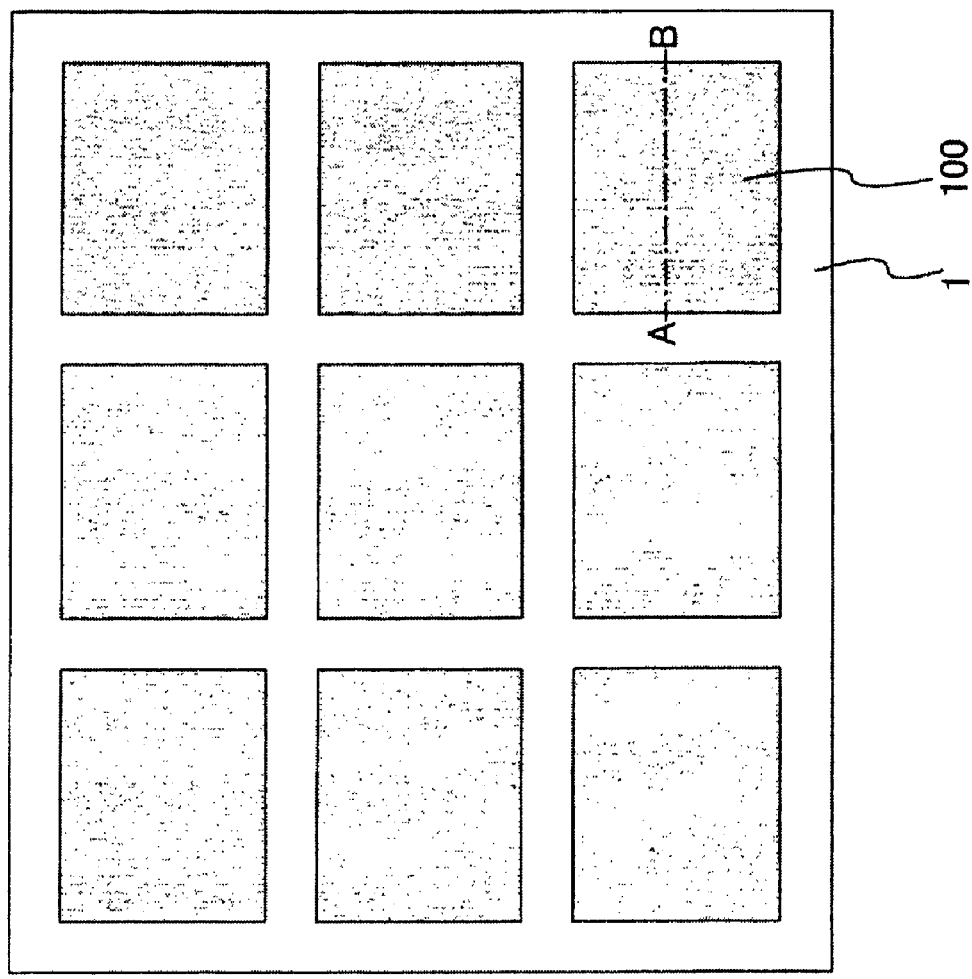
FIG. 22 illustrates a manufacturing step of an ID chip in accordance with the invention.

Description is made below on a method for manufacturing a wireless chip in accordance with the invention. Note that the identical portions to those in the aforementioned embodiments are denoted by the identical reference numerals. First, a separation layer 100 is formed over one surface of the substrate 1 (see a cross-sectional view of FIG. 21A and a top view of FIG. 22; FIG. 21A is a cross-sectional view along A-B of FIG. 22). The substrate 1 is formed using a glass substrate, a quartz substrate, a metal substrate or a stainless substrate over one surface of which is formed an insulating layer, a plastic substrate which is resistant to the processing temperature of the present step, or the like. Such a substrate 1 has no limitation on size or shape. Therefore, if the substrate 1 is formed to have a rectangular shape with one side of 1 meter or longer, the productivity can be drastically improved. Such an advantage is far superior to the case where a wireless chip is taken from a circular silicon substrate. In addition, a thin film integrated circuit formed over the substrate 1 is separated from the substrate 1 later. That is, the wireless chip provided by the invention has no substrate 1. Accordingly, the substrate 1 from which a thin film integrated circuit is separated can be reutilized a number of times. In this manner, if the substrate 1 is reutilized, cost reduction can be achieved. The substrate 1 to be reutilized is desirably a quartz substrate.

Note that in this embodiment, the separation layer 100 is selectively provided by forming a thin film over one surface of the substrate 1, and patterning it by photolithography; however, this step is not necessarily required in the invention. If not necessary, the separation layer is not required to be provided selectively, and it may be provided over the entire surface.

The separation layer 100 is formed in a single layer or stacked layers by a known method (e.g., sputtering or plasma CVD) using an element selected from tungsten (W), molybdenum (Mo), titanium (Ti), tantalum (Ta), niobium (Nb), nickel (Ni), cobalt (Co), zirconium (Zr), zinc (Zr), ruthenium (Ru), rhodium (Rh), lead (Pd), osmium (Os), iridium (Ir) and silicon (Si), or an alloy material or compound material containing such elements as a main component. A layer containing silicon may have any of an amorphous structure, a microcrystalline structure and a polycrystalline structure.

If the separation layer 100 has a single-layer structure, it is preferably formed using a tungsten layer, a molybdenum layer, or a layer containing a mixture of tungsten and molybdenum. Alternatively, the separation layer 100 is formed using a tungsten oxide layer, a tungsten oxynitride layer, a molybdenum oxide layer, a molybdenum oxynitride layer, or a layer containing oxide or oxynitride of a mixture of tungsten and molybdenum. Note that the mixture of tungsten and molybdenum corresponds to, for example, an alloy of tungsten and molybdenum.

If the separation layer 100 has a stacked-layer structure, preferably, a first layer thereof is formed of a tungsten layer, a molybdenum layer, or a layer containing a mixture of tungsten and molybdenum, and a second layer thereof is formed of oxide, nitride, oxynitride or nitride oxide of tungsten, molybdenum or a mixture of tungsten and molybdenum.

Note that in the case where the peeing layer 100 is formed with a stacked-layer structure of a tungsten layer and a tungsten oxide layer, the tungsten layer may be formed first and a silicon oxide layer may be formed thereon so that a tungsten oxide layer is formed in the interface between the tungsten layer and the silicon oxide layer. This is the same as in the case of forming a layer containing nitride, oxynitride or nitride oxide of tungsten. For example, after forming a tungsten layer, a silicon nitride layer, a silicon oxynitride layer or a silicon nitride oxide layer is formed thereover. Note that the silicon oxide layer, the silicon oxynitride layer, the silicon nitride oxide layer or the like which is formed over the tungsten layer functions as a base insulating layer later.

The tungsten oxide is denoted by $WO_x$, where x is 2 to 3. There are cases where x is 2 (the oxide is $WO_2$), x is 2.5 (the oxide is $W_2O_5$), x is 2.75 (the oxide is $W_4O_{11}$), x is 3 (the oxide is $WO_3$) and the like. In forming the tungsten oxide, the x value is not specifically limited to a certain value, and it may be determined based on the etching selectivity or the like. Note that a tungsten oxide layer which is formed by sputtering in an oxygen atmosphere has the best etching selectivity ($WO_x$, $0<x<3$). Thus, in order to reduce the manufacturing time, the separation layer is preferably formed using a tungsten oxide layer by sputtering in an oxygen atmosphere.

Note that the separation layer 100 is formed so as to contact the substrate 1 in the aforementioned step; however, the invention is not limited to this step. For example, after forming a base insulating layer so as to contact the substrate 1, the separation layer 100 may be formed so as to contact the insulating layer.

Then, a base insulating layer is formed covering the separation layer 100. The base insulating layer is formed in a single layer or stacked layers by a known method (e.g., sputtering or plasma CVD) using a silicon oxide layer or a silicon nitride layer. The silicon oxide material is a substance containing silicon (Si) and oxygen (O), which corresponds to silicon oxide, silicon oxynitride, silicon nitride oxide and the like. The silicon nitride material is a substance containing silicon and nitrogen (A), which corresponds to silicon nitride, silicon oxynitride, silicon nitride oxide and the like.

If the base insulating layer has a bilayer structure, for example, a first layer thereof may be a silicon nitride oxide layer while a second layer thereof may be a silicon oxynitride layer. If the base insulating layer has a three-layer structure, a first insulating layer 101 thereof may be a silicon oxide layer, a second insulating layer 40 thereof may be a silicon nitride oxide layer, and a third insulating layer 41 thereof may be a silicon oxynitride layer. Alternatively, the first insulting layer 101 may be a silicon oxynitride layer, the second insulating layer 40 may be a silicon nitride oxide layer, and the third insulating layer 41 may be a silicon oxynitride layer. Here, the base insulating layer with a three-layer structure is exemplarily shown. The base insulating layer functions as a blocking layer for preventing intrusion of impurities from the substrate 1.

Figure 21B:
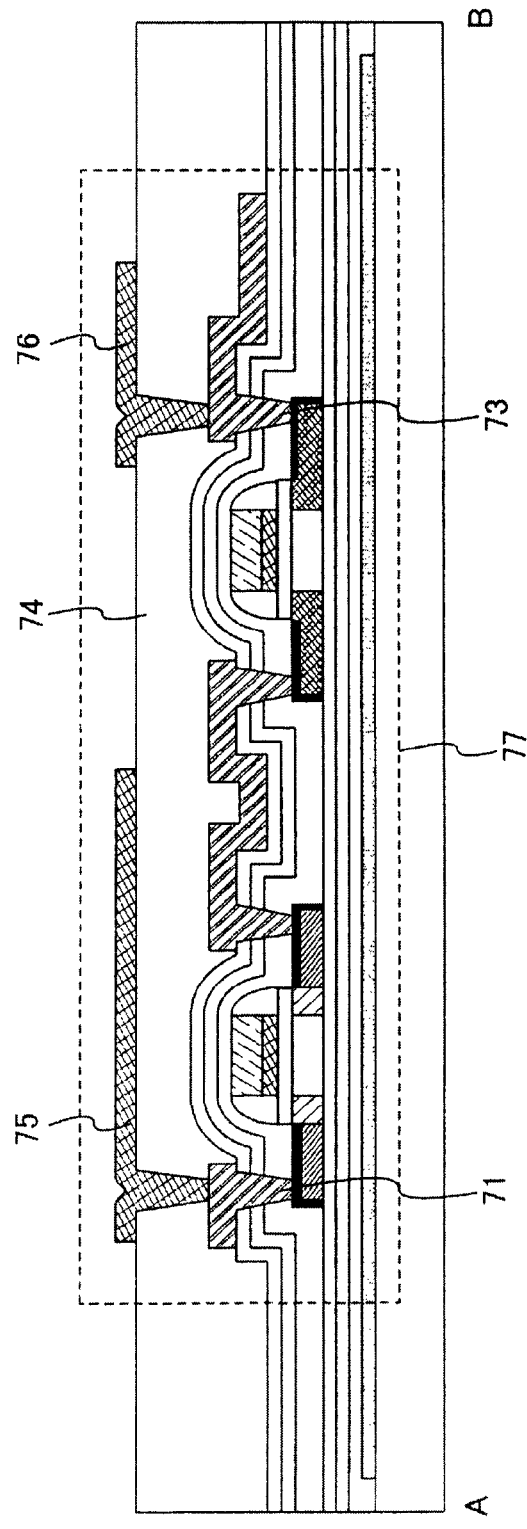
Figure 23:
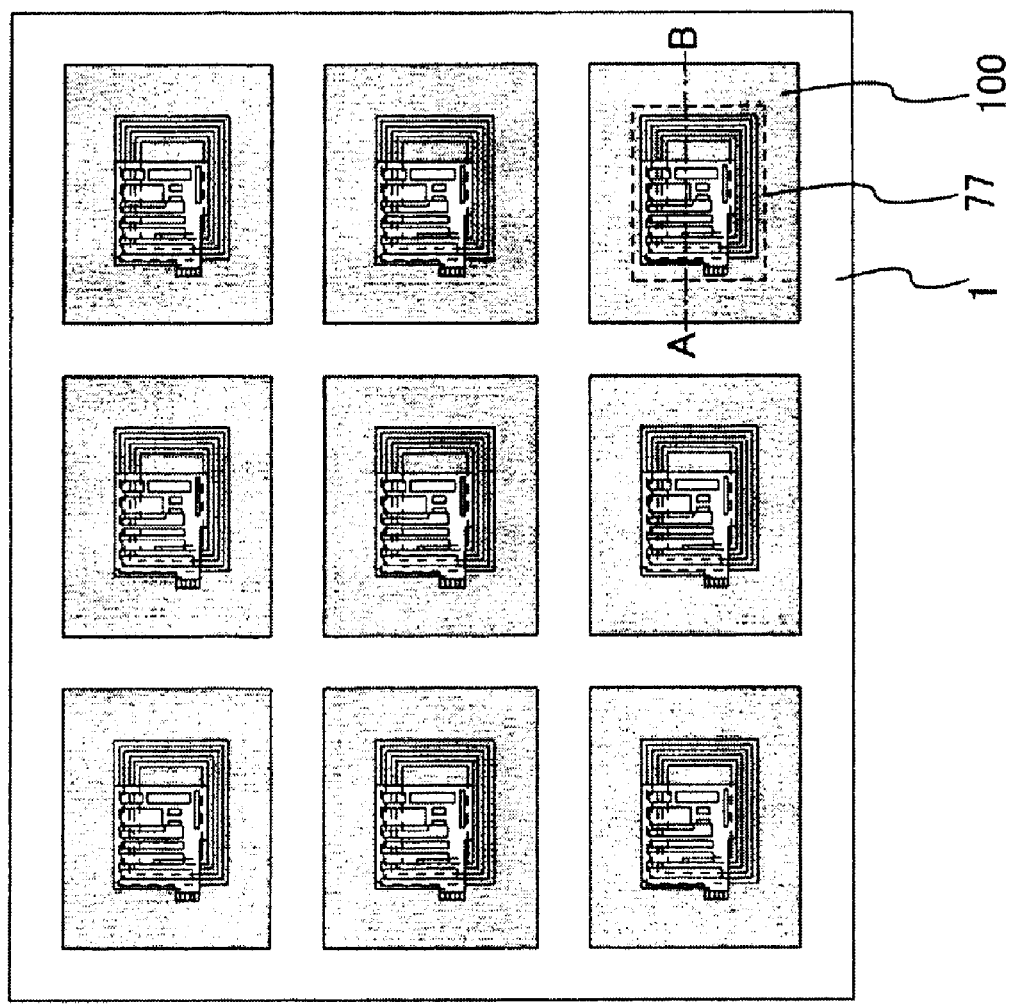
FIG. 23 illustrates a manufacturing step of an ID chip in accordance with the invention.

Then, an amorphous silicon film is formed over the base insulating layer 41 to manufacture TFTs. The TFTs can be manufactured by using the method shown in Embodiment 5; therefore, it is omitted herein. FIG. 21B shows a state in which the TFTs are manufactured. FIG. 21B is different from FIG. 17B in that the base film has three so layers, and a separation layer and a substrate are provided below the base film (see a cross-sectional view of FIG. 21B and a top view of FIG. 23; FIG. 21B is a cross-sectional view along A-B of FIG. 23).

The conductive layers 75 and 76 formed in Embodiment 6 function as antennas. The conductive layers 75 and 76 are each formed in a single layer or stacked layers by using an element selected from aluminum (Al), titanium (Ti), silver (Ag) and copper (Cu), or an alloy material or compound material containing such elements as a main component. For example, the conductive layers 75 and 76 may be formed by stacking a barrier layer and an aluminum layer in this order, or by stacking a barrier layer, an aluminum layer and a barrier layer in this order. The barrier layer corresponds to titanium, titanium nitride, molybdenum, molybdenum nitride or the like.

Next, though not shown here, a protective layer may be formed by a known method so as to cover the thin film integrated circuit 77. The protective layer corresponds to a layer containing carbon such as DLC (Diamond Like Carbon), a layer containing silicon nitride, a layer containing silicon nitride oxide, or the like.

Figure 24A:
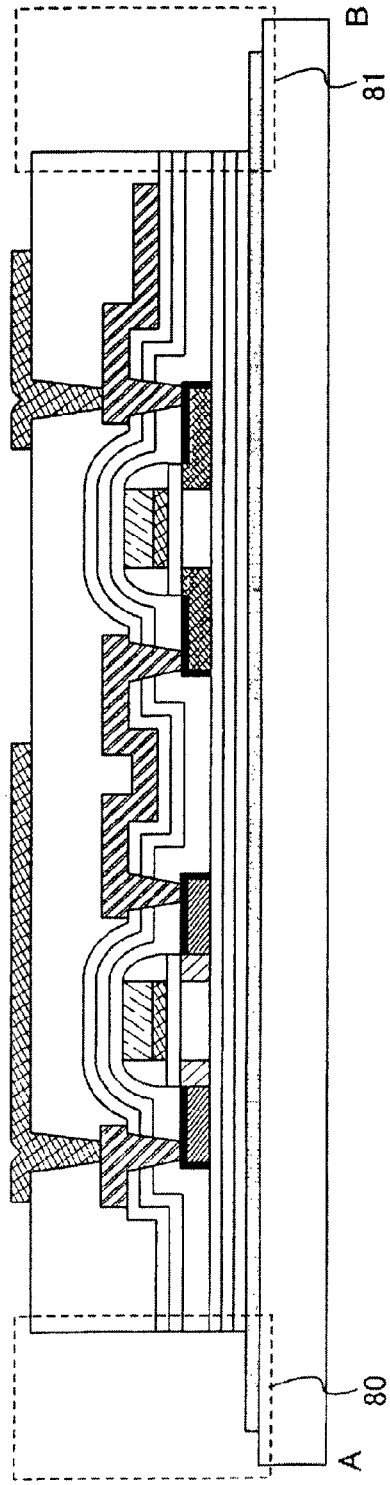
FIG. 24A and FIG. 24B illustrate manufacturing steps of an ID chip in accordance with the invention.
Figure 25:
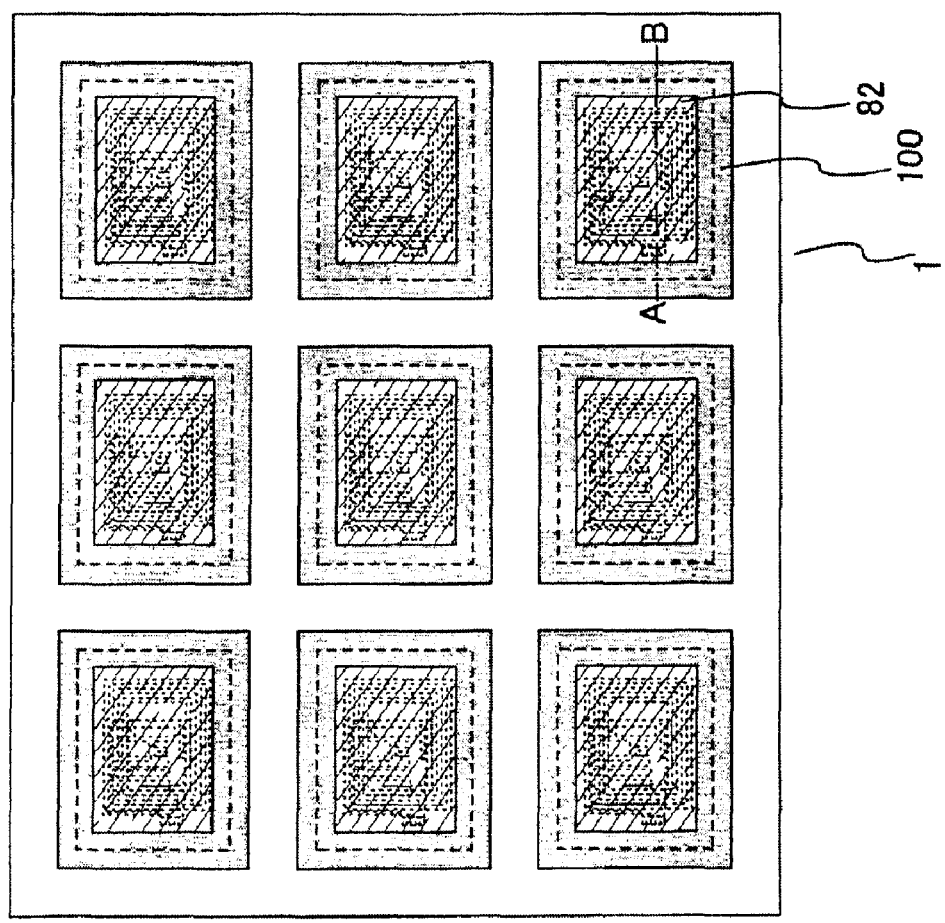
FIG. 25 illustrates a manufacturing step of an ID chip in accordance with the invention.

Then, the insulating layers 101, 40, 41, 43, 68 to 70 and 74 are etched by photolithography so as to expose the separation layer 100, thereby forming openings 80 and 81 (see a cross-sectional view of FIG. 24A and a top view of FIG. 25; FIG. 24A is a cross-sectional view along A-B of FIG. 25).

Figure 24B:
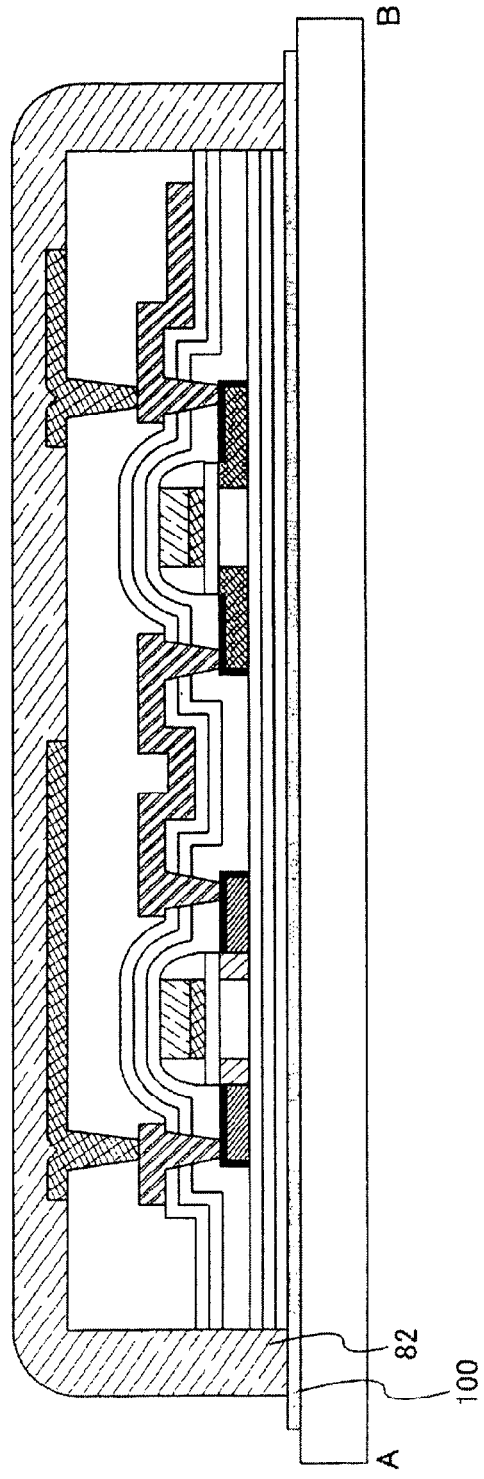

Then, an insulating layer 82 is formed by a known method (e.g., SOG method or droplet discharge method) so as to cover the thin film integrated circuit 77 (see a cross-sectional view of FIG. 24B and a top view of FIG. 25; FIG. 24B is a cross-sectional view along A-B of FIG. 25). The insulating layer 82 is formed using an organic material, preferably an epoxy resin. The insulating layer 82 functions to prevent the thin film integrated circuit 77 from shattering. That is, since the thin film integrated circuit 77 is small and lightweight, it easily shatters after removal of the separation layer as it is not tightly attached to the substrate. However, by forming the insulating layer 82 around the thin film integrated circuit 77, the weight of the thin film integrated circuit 77 can be increased and thus the shattering thereof from the substrate 1 can be prevented. The thin film integrated circuit 77 itself is thin and lightweight; however, by forming the insulating layer 82 around the thin film integrated circuit 77, the thin film integrated circuit 77 can have a certain degree of strength. Note that in the shown structure, the insulating layer 82 is formed over the top surface and side surfaces of the thin film integrated circuit 77; however, the invention is not limited to this structure, and the insulating layer 82 may be formed only over the top surface of the thin film integrated circuit 77. In addition, in the above description, after the step of forming the openings 80 and 81 by etching the insulating layers 101, 40, 41, 43, 68, 69, 70 and 74, the step of forming the insulating layer 82 is carried out; however, the invention is not limited to this order. For example, after the step of forming the insulating layer 82 over the insulating layer 74, the step of forming the openings may be performed by etching the multiple insulating layers. With this order to of the steps, the insulating layer 82 is formed over only the top surface of the thin film integrated circuit 77.

Figure 26A:
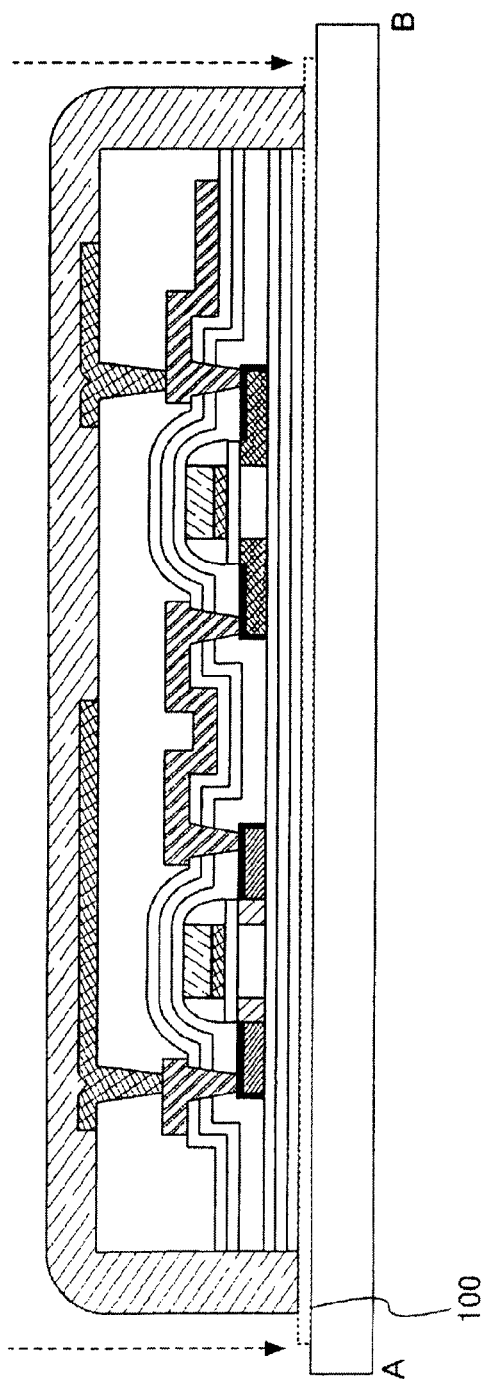
FIG. 26A and FIG. 26B illustrate manufacturing steps of an ID chip in accordance with the invention.
Figure 27:
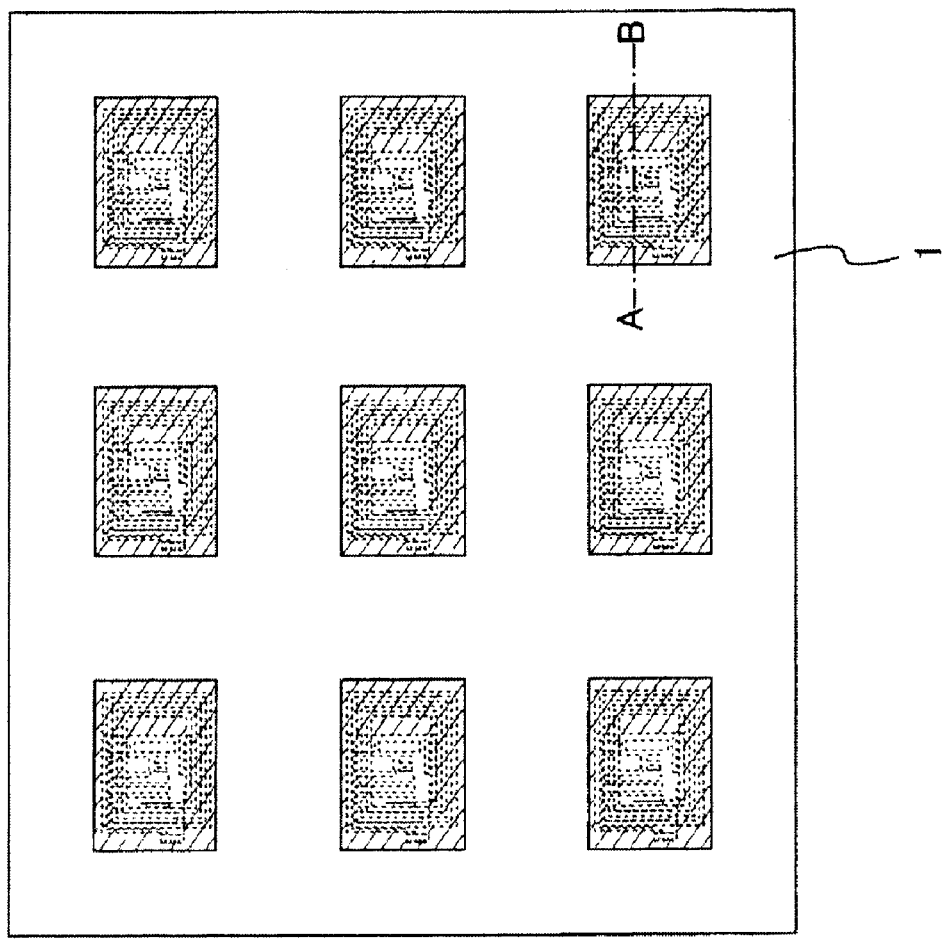
FIG. 27 illustrates a manufacturing step of an ID chip in accordance with the invention.

Then, an etchant is added into the openings 80 and 81, thereby removing the separation layer 100 (see a cross-sectional view of FIG. 26A and a top view of FIG. 27; FIG. 26A is a cross-sectional view along A-B of FIG. 27). As the etchant, a gas or solution containing halogen fluoride or an interhalogen compound is used. For example, chlorine trifluoride ($ClF_3$) is used as a gas containing halogen fluoride. Thus, the thin film integrated circuit 77 is separated from the substrate 1.

Figure 26B:
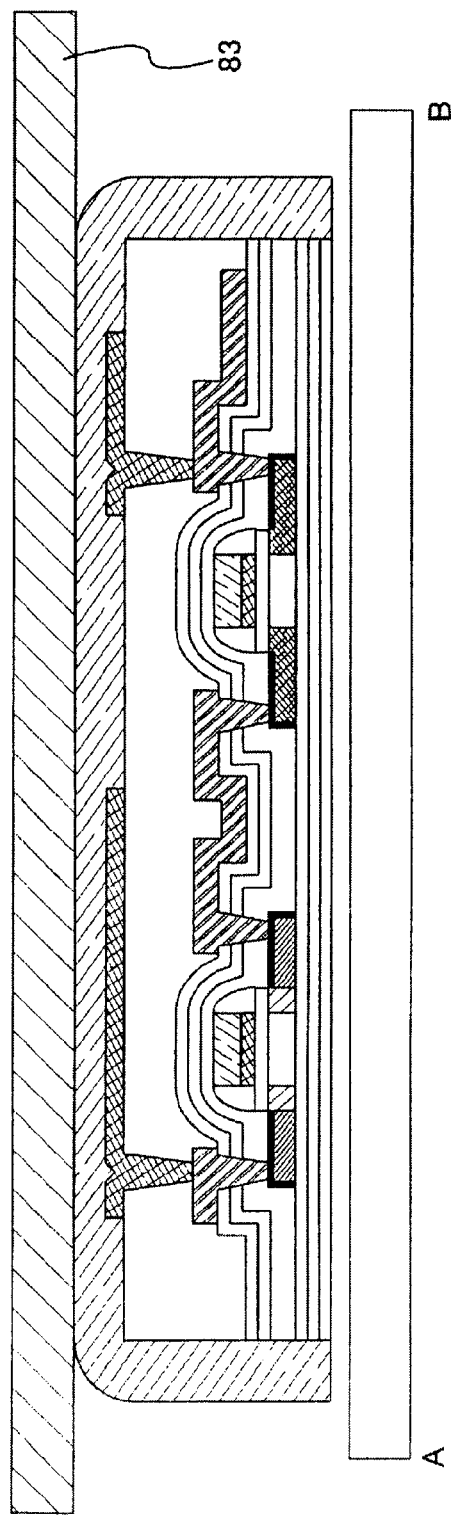

Next, one surface of the thin film integrated circuit 77 is stuck to a first base 83 so that the thin film integrated circuit 77 is completely separated from the substrate 1 (see FIG. 26B. FIG. 26B is a cross-sectional view along A-B of FIG. 27).

Figure 28:
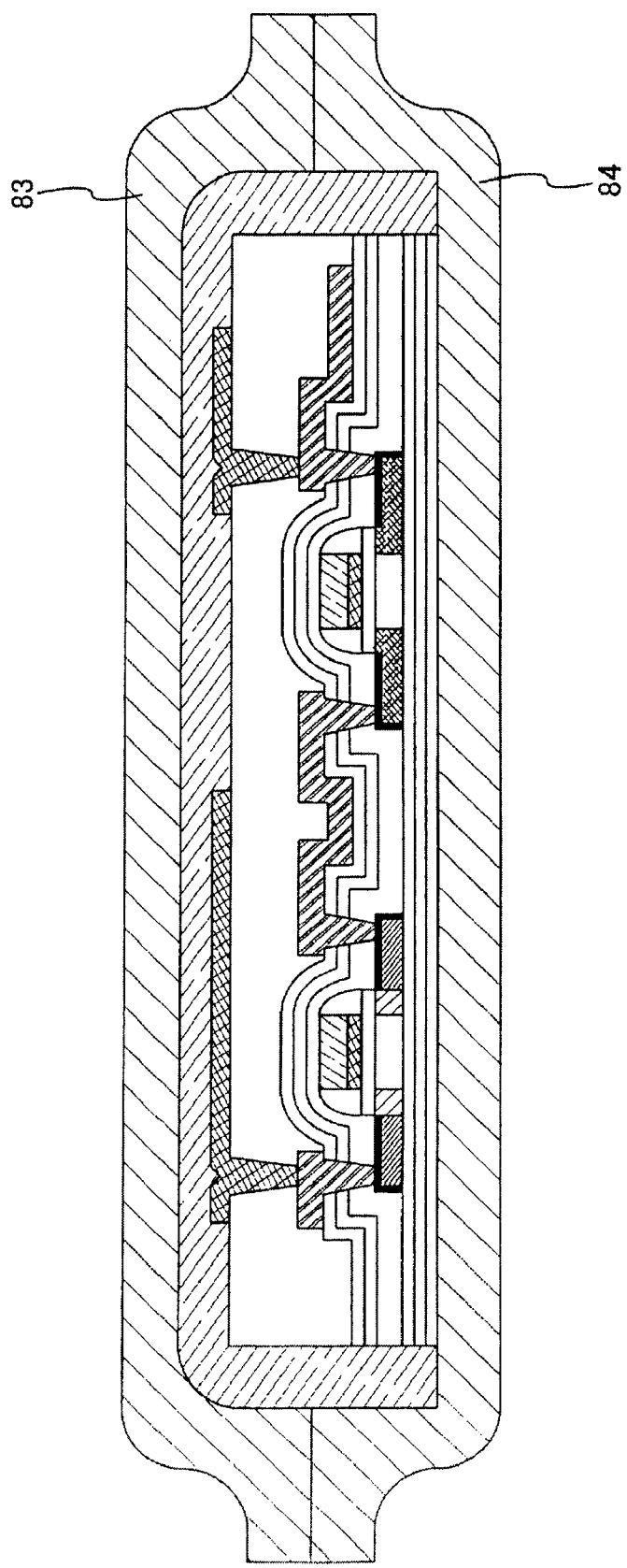
FIG. 28 illustrates a manufacturing step of an ID chip in accordance with the invention.

Subsequently, the opposite surface of the thin film integrated circuit 77 is stuck to a second base 84 so that the thin film integrated circuit 77 is sealed by the first base 83 and the second base 84 (see FIG. 28). Thus, a wireless chip is completed in which the thin film integrated circuit 77 is sealed by the first base 83 and the second base 84.

The first base 83 and the second base 84 each corresponds to a stacked film (which is formed of polypropylene, polyester, vinyl, polyvinyl fluoride, polyvinyl chloride or the like); fibrous paper; a stacked film of a base film (e.g., polyester, polyamide, an inorganic vapor-deposited film or paper) and an adhesive synthetic resin film (e.g., acrylic synthetic resin or epoxy synthetic resin); or the like. The stacked film is stacked over an object by thermal bonding for attachment. When stacking a stacked film over an object for attachment, an adhesive layer provided over the outmost surface of the stacked film or a layer (which is not an adhesive layer) provided over the outmost layer is welded by heat treatment, and pressure is applied thereto for attachment.

Each surface of the first base 83 and the second base 84 may be provided with an adhesive layer or no adhesive layer. The adhesive layer corresponds to a layer containing an adhesive agent such as a heat-curing rein, an ultraviolet-curing resin, an epoxy resin adhesive or a resin adder.

Embodiment 10

Description is made below with reference to FIG. 29A to FIG. 31C on another manufacturing method of a semiconductor device which can be applied to the invention.

Figure 29A:
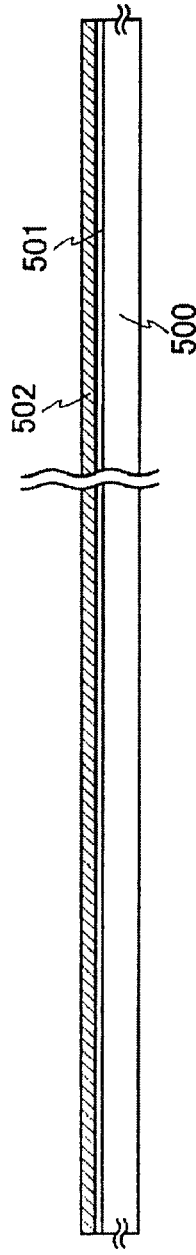
FIG. 29A to FIG. 29D illustrate manufacturing steps of a semiconductor device in accordance with the invention.

First, as shown in FIG. 29A, a base film 501 is deposited over a substrate 500. The substrate 500 may be a glass substrate formed of barium borosilicate glass or alumino borosilicate glass, a quartz substrate, a stainless substrate or the like. Alternatively, a substrate formed of plastics typified by PET, PES and PEN, or a flexible synthetic resin such as acrylic may be used.

The base film 501 is provided in order to prevent alkaline metals such as Na or alkaline earth metals contained in the substrate 500 from diffusing into the semiconductor film, which would adversely affect the characteristics of semiconductor elements. Therefore, the base film 501 is formed of an insulating film such as a silicon nitride film or a silicon oxide film containing nitrogen, which can suppress diffusion of alkaline metals or alkaline earth metals into the semiconductor film. In this embodiment, a silicon oxide film containing nitrogen is deposited with a thickness of 10 to 400 nm (preferably, 50 to 300 nm) by plasma CVD.

The base film 501 may be a single layer of an insulating film formed of silicon oxide, silicon nitride, silicon oxide containing nitrogen, silicon nitride containing oxygen or the like, or stacked insulating films of such materials. In the case of using a glass substrate, a stainless substrate or a plastic substrate which contains even a slight amount of alkaline metals or alkaline earth metals, the provision of the base film is effective in terms of preventing the diffusion of impurities; however, if the diffusion of impurities is not a big problem as in the case of using a quartz substrate, the base film is not necessarily required.

Next, a semiconductor film 502 is formed over the base film 501. The semiconductor film 502 is formed with a thickness of 25 to 100 nm preferably, 30 to 60 nm). Note that the semiconductor film 502 may be either an amorphous semiconductor or a polycrystalline semiconductor. As the semiconductor, not only silicon (Si) but also silicon germanium (SiGe) may be used. In the case of using silicon germanium, the concentration of germanium is preferably about 0.01 to 4.5 atomic %.

Figure 29B:
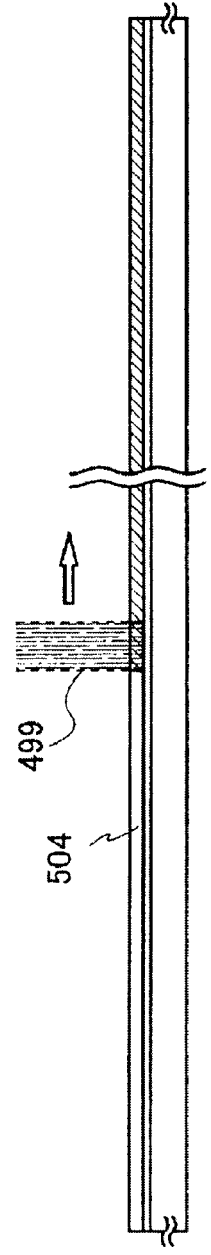

Next, as shown in FIG. 29B, the semiconductor film 502 is irradiated with a linear laser beam 499 to be crystallized. In performing laser crystallization, heat treatment may be applied to the semiconductor film 502 at 500° C. for 1 hour before the laser crystallization in order to increase the resistance of the semiconductor film 502 to the laser beam.

The laser crystallization may be performed using a CW laser or a pulsed laser having a repetition rate of 10 MHz or higher, or preferably 80 MHz or higher as a pseudo-CW laser.

Specifically, the CW laser includes an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a helium cadmium laser or the like.

The pseudo-CW laser may be, as long as a pulse repetition rate of 10 MHz or higher, or preferably 80 MHz or higher can be obtained, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser or a gold vapor laser.

Such a pulsed laser shows substantially the same effect as a CW laser as the repetition rate is increased.

For example, in the case of using a solid-state laser capable of continuous oscillation, crystals with a large grain size can be obtained by irradiation with a laser beam having a second harmonic to a fourth harmonic. Typically, a second harmonic (532 nm) or a third harmonic (355 nm) of a YAG laser (fundamental wave: 1064 nm) is desirably employed. For example, a laser beam emitted from a CW YAG laser is converted into a higher harmonic with a non-linear optical element, so that the semiconductor film 502 is irradiated with the laser beam. The energy density may be about 0.01 to 100 $MW/cm^2$ (preferably, 0.1 to 10 $MW/cm^2$).

Note that the laser beam may be emitted in an atmosphere containing a rare gas or an inert gas such as nitrogen. Accordingly, roughness of the semiconductor surface due to the laser beam irradiation can be suppressed, thereby variations in the threshold voltage caused by the variations in the interface state density can be suppressed.

By the aforementioned laser beam irradiation onto the semiconductor film 502, a crystalline semiconductor film 504 having improved crystallinity is formed.

Figure 29C:
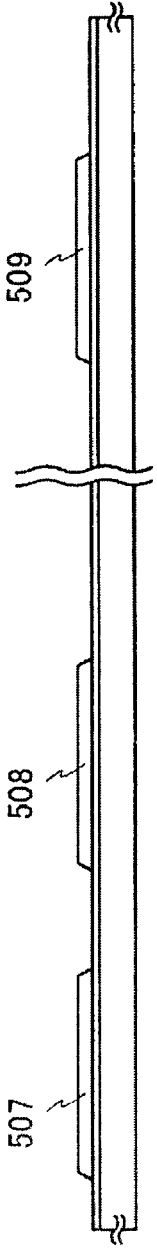

Next, the crystalline semiconductor film 504 is patterned as shown in FIG. 29C, thereby island-like semiconductor films 507 to 509 are formed.

Then, impurities for controlling the threshold voltage are added into the island-like semiconductor films. In this embodiment, diborane ($B_2H_6$) is added so that the island-like semiconductor films are doped with boron (B).

Then, an insulating film 510 is deposited so as to cover the island-like semiconductor films 507 to 509. For the insulating film 510, silicon oxide ($SiO_2$), silicon nitride ($SiN_xH_y$), silicon oxide containing nitrogen (SiON) or the like can be used, for example. As a deposition method, plasma CVD, sputtering or the like can be used.

Next, after depositing conductive films 511, 512 over the insulating film 510, the conductive film is patterned to form gate electrodes 570 to 572.

Each of the gate electrodes 570 to 572 is formed to have a single-layer structure or a stacked-layer structure of two or more layers, using conductive films. In the case of stacking conductive films in two or more layers, each of the gate electrodes 570 to 572 may be formed by stacking an element selected from tantalum (Ta), tungsten (W), titanium (Ti), molybdenum (Mo) and aluminum (Al), or an alloy material or compound material containing such elements as a main component. Alternatively, each gate electrode may be formed by using a semiconductor film typified by a polycrystalline silicon film doped with impurity elements such as phosphorus (P).

Figure 29D:
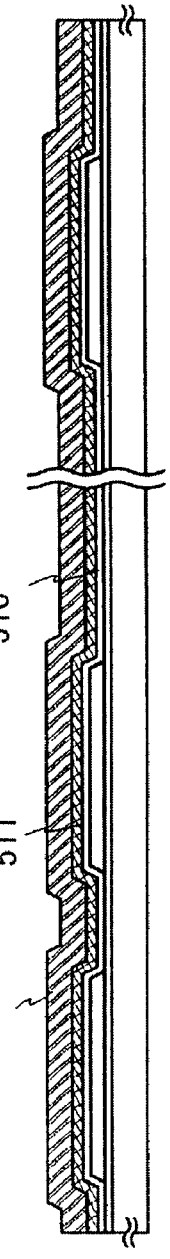

In this embodiment, the gate electrodes 570 to 572 are formed in the following manner. First, as a first conductive film 511, a tantalum nitride (TaN) film is formed with a thickness of 10 to 50 nm, for example 30 nm. Then, as a second conductive film 512, a tungsten (W) film is formed with a thickness of 200 to 400 nm, for example 370 nm, over the first conductive film 511. Thus, a staked film of the first conductive film 511 and the second conductive film 512 is formed (FIG. 29D).

Figure 30A:
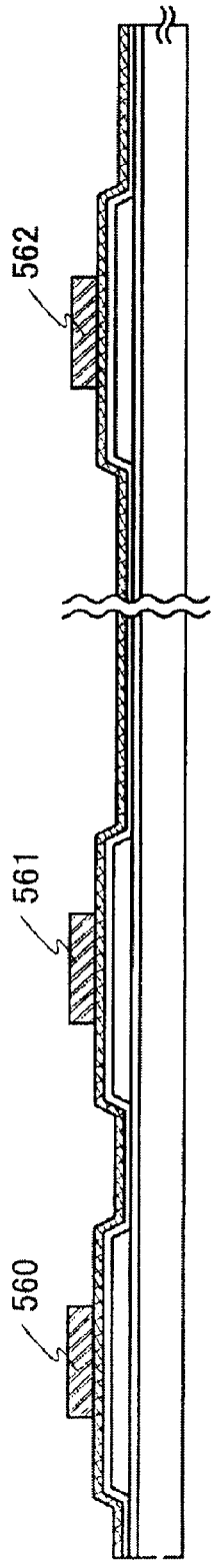
FIG. 30A to FIG. 30C illustrate manufacturing steps of a semiconductor device in accordance with the invention.
Figure 30B:
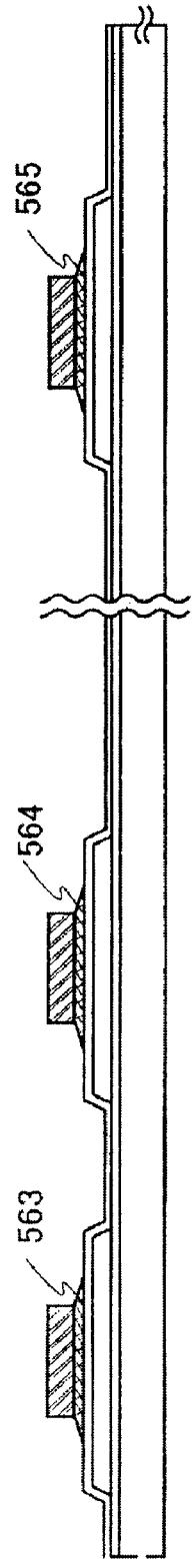

Then, the second conductive film 512 is etched by anisotropic etching to form top-layer gate electrodes 560 to 562 (FIG. 30A). Then, the first conductive film 511 is etched by isotropic etching to form bottom-layer gate electrodes 563 to 565 (FIG. 30B). Accordingly, the gate electrodes 570 to 572 are formed.

The gate electrodes 570 to 572 may be formed as a part of gate wires, or connected to gate wires which are formed separately.

Using as masks the gate electrodes 570 to 572 or a resist which is obtained through film deposition and patterning, the island-like semiconductor films 507 to 509 are each doped with impurities having one conductivity type (n-type or p-type conductivity) to form impurity regions.

First, the island-like semiconductor films are doped with phosphorus' (P) by adding phosphine ($PH_3$) at a dosage of $1\times10^{13}$ to $1\times10^{15}$ cm$^{-2}$ with an acceleration voltage of 60 to 120 keV. At this impurity doping, channel regions 522 and 527 of n-channel TFTs 550 and 552 respectively are formed.

Figure 30C:
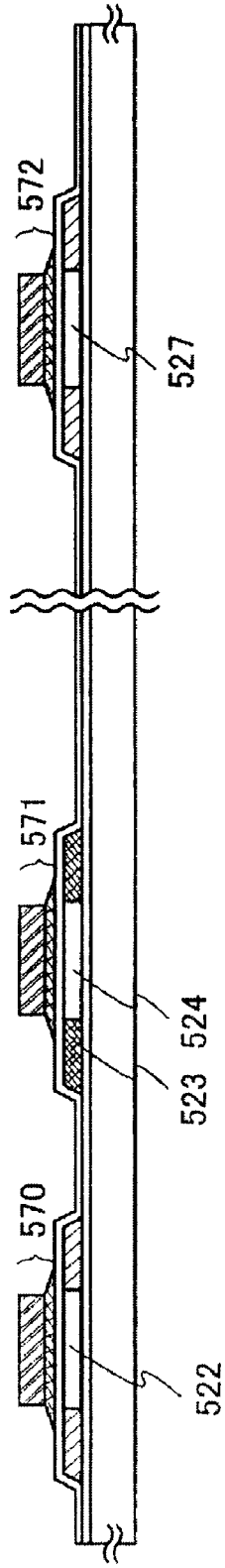

In order to manufacture a p-channel TFT 551, the island-like semiconductor film is doped with boron (B) by adding diborane ($B_2H_6$) at a dosage of $1\times10^{13}$ to $5\times10^{15}$ cm$^{-2}$, for example $3\times10^{15}$ cm$^{-2}$ with an acceleration voltage of 60 to 100 keV, for example 80 keV. Accordingly, a source region or drain region 523 of the p-channel TFT 551 is formed, and a channel region 524 is formed at this impurity doping (FIG. 30C).

Next, the insulating film 510 is patterned to form gate insulating films 580 to 582.

After forming the gate insulating films 580 to 582, the island-like semiconductor films of the n-channel TFTs 550 and 552 are doped with phosphorus (P) by adding phosphine ($PH_3$) at a dosage of $1.0\times10^{15}$ to $2.5\times10^{16}$ cm$^{-2}$, for example $3.0\times10^{15}$ cm$^{-2}$ with an acceleration voltage of 40 to 80 keV, for example 50 keV. Accordingly, low-concentration impurity regions 521 and 526 and source or drain regions 520 and 525 of the n-channel TFTs are formed (FIG. 31A).

In this embodiment, the source regions or drain regions 520 and 525 of the n-channel TFTs 550 and 552 contain phosphorus (P) at a concentration of $1\times10^{19}$ to $5\times10^{21}$ cm$^{-3}$. Meanwhile, the low-concentration impurity regions 521 and 526 of the n-channel TFTs 550 and 552 contain phosphorus (P) at a concentration of $1\times10^{18}$ to $5\times10^{19}$ cm$^{-3}$. In addition, the source or drain region 523 of the p-channel TFT 551 contains boron (B) at a concentration of $1\times10^{19}$ to $5\times10^{21}$ cm$^{-3}$.

Then, after removing an oxide film formed on the exposed surface of each semiconductor film with hydrofluoric acid or the like, a Ni film is deposited with a thickness of 25 to 50 nm by sputtering while heating the substrate at 450° C., thereby Ni silicide 3 is formed on the island-like semiconductor films 507 to 509. The power density at the film deposition is set to 0.7 W/cm$^2$. After that, an unreacted portion of the Ni film is removed with a known etchant (FIG. 31B).

Then, a first interlayer insulating film 530 is formed covering the island-like semiconductor films 507 to 509 and the gate electrodes 570 to 572 (FIG. 31B).

The first interlayer insulating film 530 is formed by plasma CVD or sputtering using an insulating film containing silicon, for example such as a silicon oxide film ($SiO_2$), a silicon nitride film ($SiN_xH_y$), a silicon oxide film containing nitrogen (SiON) or a stacked film thereof. Needless to say, the first interlayer insulating film 530 is not limited to such films, and it may have a single-layer or stacked-layer structure of other insulating films containing silicon.

In this embodiment also, the resistance of the source and drain regions are already lowered sufficiently; therefore, an activation step is not required. However, the impurities may be activated by laser irradiation or RTA. Alternatively, after forming a silicon oxide film containing nitrogen, it may be heated at 550° C. for 4 hours to activate the impurities.

Then, heat treatment is applied entirely at 410° C. for 1 hour to discharge hydrogen from the silicon oxide film containing nitrogen so that hydrogenation is performed. However, this hydrogenation step is not required in the case of applying the aforementioned heat treatment at 550° C. for 4 hours in a nitrogen atmosphere.

Then, a second interlayer insulating film 531 functioning as a planarizing film is formed covering the first interlayer insulating film 530.

The second interlayer insulating film 531 may be formed using a photosensitive or non-photosensitive organic material (e.g., polyimide, acrylic, polyamide, polyimide amide, resist, benzocyclobutene or siloxane) or stacked layers thereof Siloxane is composed of a skeleton formed by the bond of silicon and oxygen (O) (Si—O—Si bond), which contains an organic group containing at least hydrogen (e.g., alkyl group or aromatic hydrocarbon) as a substituent. Alternatively, a fluoro group may be used as the substituent. Further alternatively, both a fluoro group and an organic group containing at least hydrogen may be used as the substituent. As the organic material, a positive photosensitive organic resin or a negative photosensitive organic resin may be used.

In this embodiment, siloxane is formed by spin coating as the second interlayer insulating film 531.

Contact holes are formed in the first interlayer insulating film 530 and the second interlayer insulating film 531 so as to reach the island-like semiconductor films 507 to 509 by etching the first interlayer insulating film 530 and the second interlayer insulating film 531.

Note that a third interlayer insulating film may be formed over the second interlayer insulating film 531 so that contact holes are formed in the first to third interlayer insulating films. The third interlayer insulating film is formed using a film which does not easily transmit moisture or oxygen in comparison with other insulating films. Typically, a silicon nitride film, a silicon oxide film, a silicon nitride film containing oxygen (a SiNO film (composition ratio: N>O) or a SiON film (composition ratio: N<O)), a thin film containing carbon as a main component (e.g., DLC film or CN film) or the like which is obtained by sputtering or CVD can be used.

A third conductive film is formed over the second interlayer insulating film 531 so as to fill the contact holes, and then the third conductive film is patterned to form electrodes or wires 540 to 544.

In this embodiment, the third conductive film is formed of a metal film. The metal film may be a film formed of an element such as aluminum (Al), titanium (Ti), molybdenum (Mo), tungsten (W) or silicon (Si), or an alloy film containing such elements. In this embodiment, after stacking a titanium film (Ti) of 60 nm thick, a titanium nitride film (TiN) of 40 nm thick, a silicon-aluminum alloy film (Al—Si) of 300 nm thick, and a titanium film (Ti) of 100 nm thick, they are patterned into desired shapes by etching, thereby forming the electrodes or wires 540 to 544.

Alternatively, these electrodes or wires 540 to 544 may be formed using at least one of nickel, cobalt and iron, and an aluminum alloy film containing carbon. Such an aluminum alloy film can prevent counter diffusion between silicon and aluminum even when the film contacts silicon. In addition, such an aluminum alloy film does not cause a redox reaction even when the film contacts a light-transmissive film, for example an indium tin oxide (ITO) film. Therefore, the aluminum alloy film can directly contact the light-transmissive conductive film. Further, since such an aluminum alloy film has low resistivity and high heat resistance, it can be effectively used as the wiring material.

The electrodes or wires 540 to 544 may be formed at the same time by using the same material, or may be formed separately and connected to each other.

Through the aforementioned sequence of steps, a semiconductor device which has a CMOS circuit 553 including the n-channel TFT 550 and the p-channel TFT 551, and the n-channel TFT 552 can be formed (FIG. 31C). Note that the manufacturing method of a semiconductor device of the invention is not limited to the aforementioned manufacturing steps which correspond to the post-formation of the island-like semiconductor films.

Embodiment 11

This embodiment illustrates an example of manufacturing a liquid crystal display device (LCD) using the invention.

The manufacturing method of a display device described in this embodiment is a method of simultaneously manufacturing pixel TFTs of a pixel portion and TFTs of a driver circuit portion which is provided around the pixel portion. Note that a CMOS circuit as a base unit is shown as a driver circuit for simplicity.

First, the electrodes or wires 540 to 544 in FIG. 31C are formed in accordance with Embodiment 10. Note that the identical portions to those in the aforementioned embodiments are denoted by the identical reference numerals.

Figure 32:
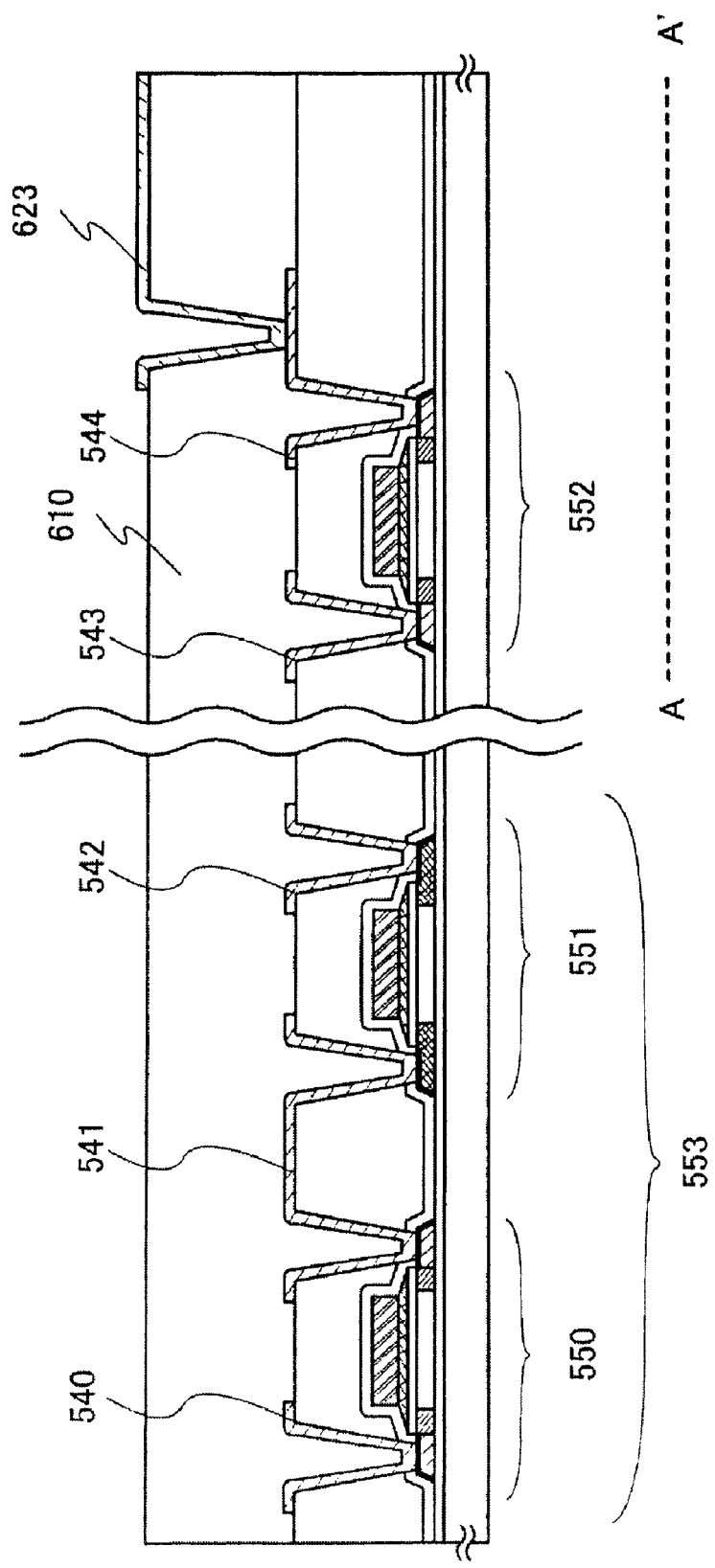
FIG. 32 illustrates a manufacturing step of a liquid crystal display device in accordance with the invention.

Next, a third interlayer insulating film 610 is formed over the second interlayer insulating film 531 and the electrodes or wires 540 to 544. Note that the third interlayer insulating film 610 can be formed using a similar material to the second interlayer insulating film 531 (FIG. 32).

Next, a resist mask is formed using a photomask, and the third interlayer insulating film 610 is partially removed by dry etching so as to form an opening (contact hole). In the formation of this contact hole, carbon tetrafluoride ($CF_4$), oxygen ($O_2$) and helium (He) are used as the etching gas with a flow rate of $CF_4:O_2$: He=50 sccm:50 sccm:30 sccm respectively. Note that the bottom of the contact hole reaches the electrode or wire 544.

Then, after removing the resist mask, a second conductive film is deposited over the entire surface. Then, the second conductive film is patterned using a photomask, thereby forming a pixel electrode 623 which is electrically connected to the electrode or wire 544 (FIG. 32). In this embodiment, a reflective liquid crystal display panel is manufactured; therefore, the pixel electrode 623 is formed by sputtering using a light-reflective metal material such as Ag (silver), Au (gold), Cu (copper), W (tungsten) or Al (aluminum).

In the case of manufacturing a light-transmissive liquid crystal display panel, the pixel electrode 623 is formed using a light-transmissive conductive film such as indium tin oxide (ITO), ITO containing silicon oxide, zinc oxide (ZnO) or tin oxide ($SnO_2$).

Figure 34:
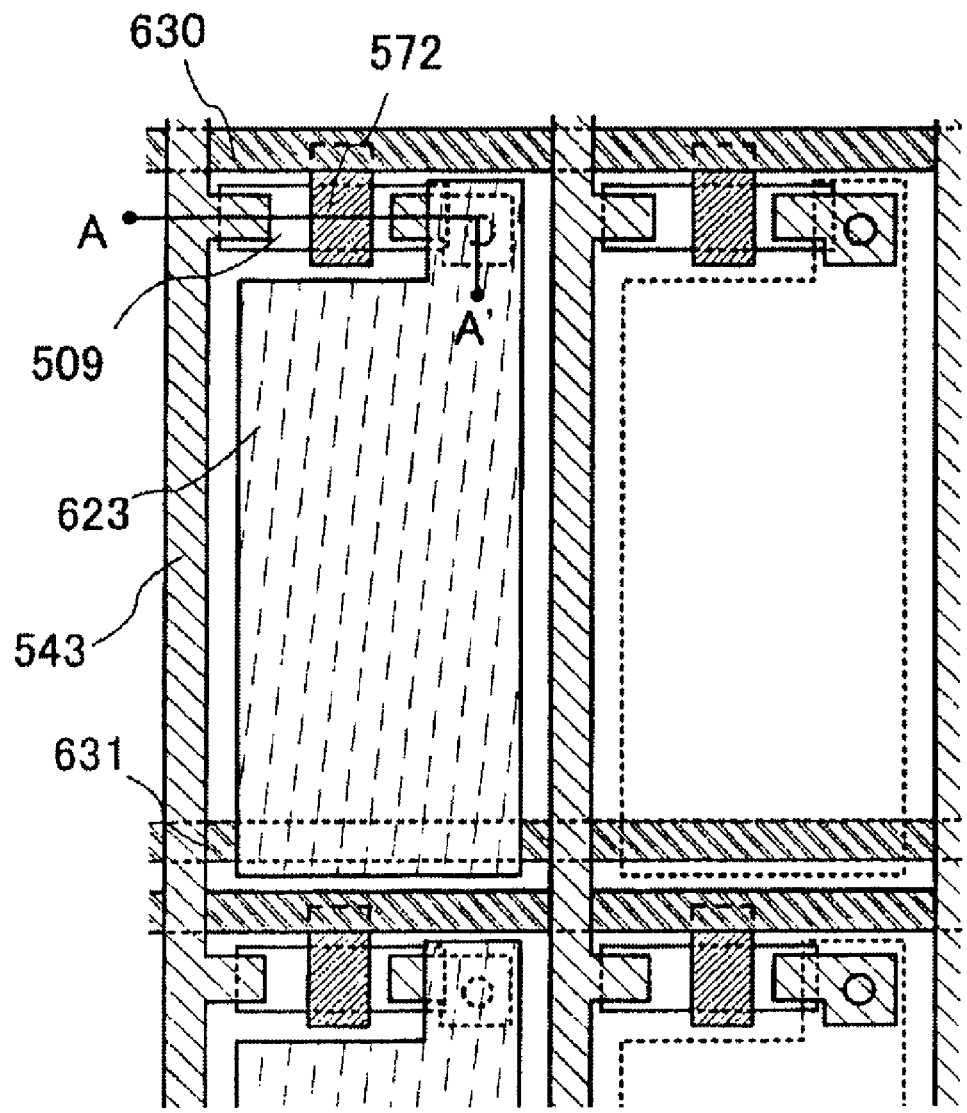
FIG. 34 illustrates a manufacturing step of a liquid crystal display device in accordance with the invention.

FIG. 34 is a top view which shows a partially magnified pixel portion 650 including a pixel TFT. FIG. 34 shows a formation step of a pixel electrode, in which a pixel electrode is formed in the left side pixel while it is not yet formed in the right side pixel. A cross-sectional view along a solid line A-A' of FIG. 34 corresponds to a cross section of the pixel portion in FIG. 32, and portions corresponding to those in FIG. 32 are denoted by the identical reference numerals.

As shown in FIG. 34, the gate electrode 572 is connected to a gate wire 630. The electrode 543 is integrated with a source wire.

In addition, a capacitor wire 631 is provided, and a storage capacitor is formed by utilizing the first interlayer insulating film 530 as a dielectric, the pixel electrode 623 and the capacitor wire 631 which overlaps the pixel electrode 623.

In this embodiment, the second interlayer insulating film 531 and the third interlayer insulating film 610 are etched in the region where the pixel electrode 623 overlaps with the capacitor wire 631 and the storage capacitor is formed by the pixel electrode 623, the first interlayer insulating film 530 and the capacitor wire 631. However, if the second interlayer insulating film 531 and the third interlayer insulating film 610 can also be used as dielectrics, they are not required to be etched. In such a case, the first interlayer insulating film 530, the second interlayer insulating film 531 and the third interlayer insulating film 610 function as dielectrics. Alternatively, the first interlayer insulating film 530 and the second interlayer insulating film 531 may be used as dielectrics by etching only the third interlayer insulating film, 610.

Through the aforementioned steps, a TFT substrate of a liquid crystal display device is completed, where the top-gate pixel TFT 552, the CMOS circuit 553 having the top-gate TFTs 550 and 551, and the pixel electrode 623 are formed over the substrate 500. Although a top-gate TFT is formed in this embodiment, a bottom-gate TFT may be appropriately used.

Figure 33:
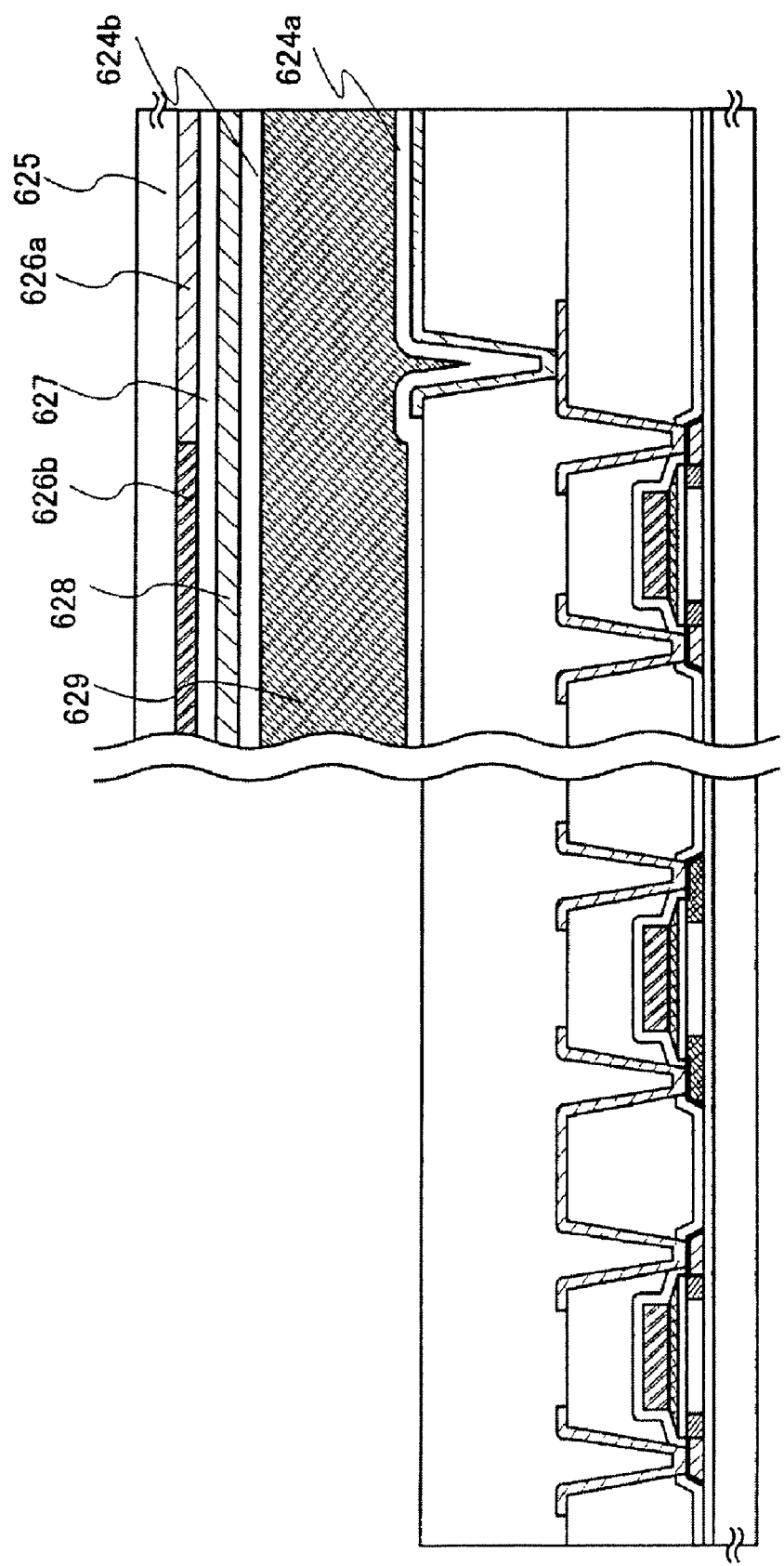
FIG. 33 illustrates a manufacturing step of a liquid crystal display device in accordance with the invention.

Then, an alignment film 624*a* is formed covering the pixel electrode 623 as shown in FIG. 33. Note that the alignment film 624*a* may be formed by a droplet discharge method, a screen printing method or an offset printing method. After that, a rubbing process is applied to the surface of the alignment film 624*a*.

Figure 35A:
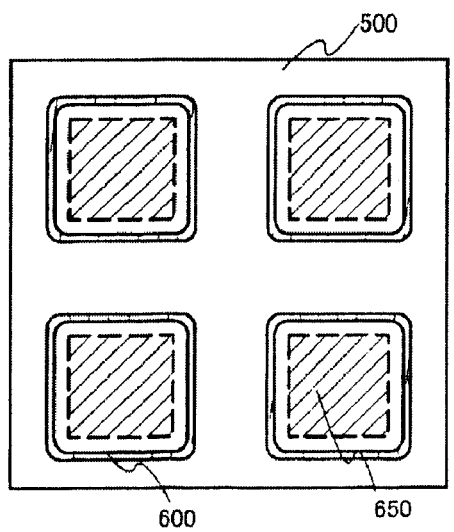
FIG. 35A to FIG. 35D illustrate manufacturing steps of a liquid crystal display device in accordance with the invention.

Over a counter substrate 625, a color filter composed of a colored layer 626*a*, a light-shielding layer (black matrix) 626*b* and an overcoat layer 627 is provided, and a light-transmissive or reflective counter electrode 628 and an alignment film 624*b* are formed thereover. Then, a sealant 600 is formed by a droplet discharge method so as to surround a region overlapping the pixel portion 650 including a pixel TFT (FIG. 35A). Since liquid crystals are dropped here, an example of drawing the sealant 600 in closed loop is shown. However, a dip method (soak method) may be used, in which liquid crystals are soaked up into the gap between the substrates by utilizing the capillary action after attaching the substrate 500 and the counter substrate 625 to each other.

Figure 35B:
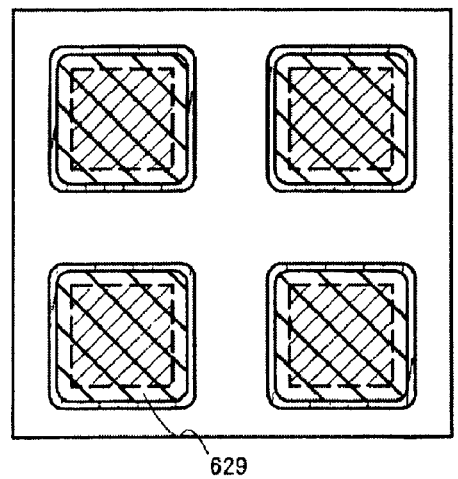
Figure 35C:
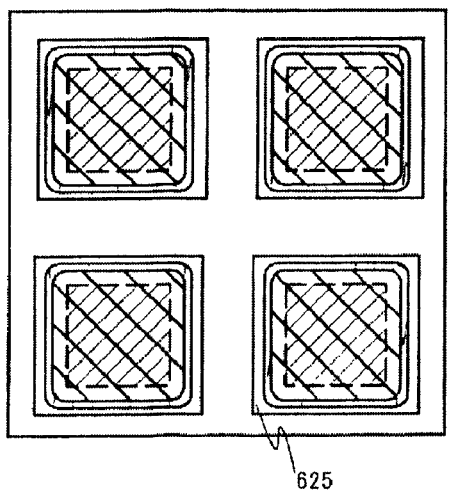

Then, a liquid crystal composition 629 is dropped under the low pressure so that bubbles are not mixed therein (FIG. 35B), thereby both the substrates 500 and 625 are attached to each other (FIG. 35C). Liquid crystals are dropped once or multiple times into the closed loop of the sealant. As an alignment mode of the liquid crystal composition 629, a TN mode is used in which the alignment of liquid crystal molecules is twist-aligned by 90° from the light injection point to the light emission point. The substrates are attached to each other in such a manner that the rubbing directions thereof intersect with each other at right angles.

Note that the distance between the pair of the substrates may be kept even by dispersing a spherical spacer or a columnar spacer formed of a resin, or by providing a filler in the sealant 600. The aforementioned columnar spacer is formed of an organic resin material containing at least one of acrylic, polyimide, polyimide amide and epoxy as a main component, or an inorganic material having one of silicon oxide, silicon nitride and silicon oxide containing nitrogen, or stacked films thereof.

Figure 35D:
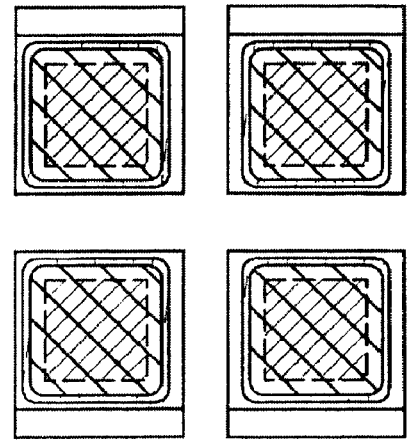

Then, the substrate is sectioned. In the case of obtaining multiple panels from one substrate, the substrate is sectioned into each panel. On the other hand, in the case of obtaining one panel from one substrate, a sectioning step may be omitted by attaching a counter substrate which is cut in advance to the substrate (FIG. 33 and FIG. 35D).

Then, an FPC (Flexible Printed Circuit) is attached with an anisotropic conductive layer using a known technique. Through the aforementioned steps, a liquid crystal display device is completed, In addition, an optical film is attached if necessary. In the case of manufacturing a light-transmissive liquid crystal display device, polarizing plates are attached to the TFT substrate and the counter substrate respectively.

Figure 40A:
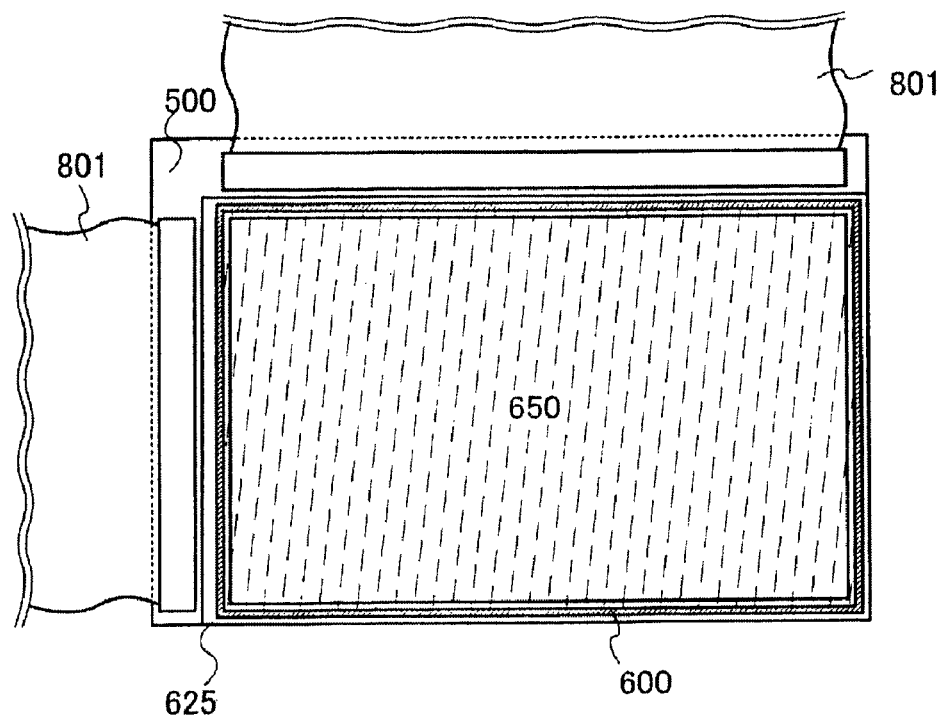
FIG. 40A and FIG. 40B illustrate semiconductor devices in accordance with the invention.
Figure 40B:
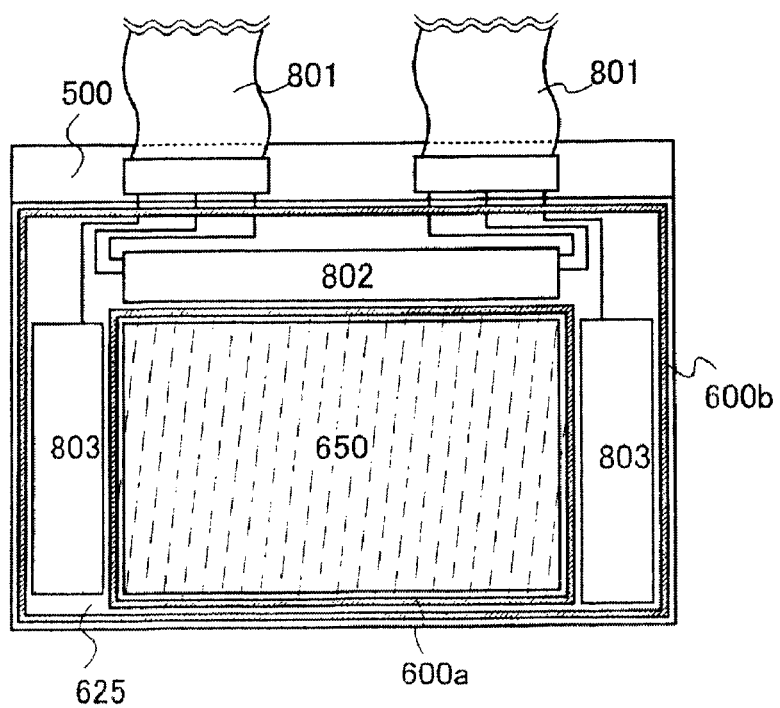

FIG. 40A shows a top view of a liquid crystal display device obtained through the aforementioned steps, and FIG. 40B shows an example of a top view of another liquid crystal display device.

In FIG. 40A, reference numeral 500 denotes a TFT substrate, 625 denotes a counter substrate, 650 denotes a pixel portion, 600 denotes a sealant and 801 denotes an FPC. Note that a liquid crystal composition is discharged by a droplet discharge method, and the pair of the substrates 500 and 625 are attached to each other with the sealant under the low pressure.

In FIG. 40B, reference numeral 500 denotes a TFT substrate, 625 denotes a counter substrate, 802 denotes a source signal line driver circuit, 803 denotes a gate signal line driver circuit, 650 denotes a pixel portion, 600a denotes a first sealant, 600b denotes a second sealant, and 801 denotes an FPC. Note that a liquid crystal composition is discharged by a droplet discharge method, and the pair of the substrates 500 and 625 are attached to each other with the first sealant 600a and the second sealant 600b. Since liquid crystals are not required in the driver circuit portions 802 and 803, liquid crystals are kept only in the pixel portion 650, and the second sealant 600b is provided for reinforcement of the whole panel.

As described above, in this embodiment, a liquid crystal display device can be manufactured using a TFT in accordance with the invention. Accordingly, the manufacturing time and cost can be reduced. The liquid crystal display device manufactured in this embodiment can be used as display portions of various electronic devices.

Note that although a top-gate TFT is used as the TFT in this embodiment, the invention is not limited to this structure, and a bottom-gate (inversely staggered) TFT or a staggered TFT may be appropriately used. Further, the invention is not limited to a single-gate TFT, and a multi-gate TFT having multiple channel regions, for example a double-gate TFT may be used.

This embodiment can be appropriately implemented in combination with the aforementioned embodiment modes or embodiments as required.

Embodiment 12

This embodiment illustrates an example where a droplet discharge method is used for dropping liquid crystals. In this embodiment, an example of obtaining 4 panels from a large substrate 1110 is shown.

FIG. 36A is a cross-sectional view showing a formation step of a liquid crystal layer using a dispenser (or inkjet), in which a liquid crystal composition 1114 is discharged, ejected or dropped from a nozzle 1118 of a droplet discharge apparatus 1116 so as to cover a pixel portion 1111 surrounded by a sealant 1112 over the substrate 1110. The droplet discharge apparatus 1116 is moved in the direction of the arrow in FIG. 36A. Note that although the nozzle 1118 is moved as an example herein, a liquid crystal layer may be formed with a nozzle being fixed while moving the substrate.

FIG. 36B is a perspective view of FIG. 36A. FIG. 36B shows a state in which the liquid crystal composition 1114 is selectively discharged, ejected or dropped onto only a region surrounded by the sealant 1112, and a dropped surface 1115 is moved in accordance with a nozzle scan direction 1113.

FIG. 36C and FIG. 36D are magnified cross-sectional views of a portion 1119 surrounded by a dashed line 1119 in FIG. 36A. In the case where the viscosity of the liquid crystal composition is high, it is discharged continuously, and thus it lands onto the substrate like a single string as shown in FIG. 36C. On the other hand, in the case where the viscosity of the liquid crystal composition is low, it is discharged intermittently, and thus it is dropped as shown in FIG. 36D.

Note that in FIG. 36C, reference numeral 1120 denotes a top-gate TFT and 1121 denotes a pixel electrode. The pixel portion 1111 includes a pixel electrode provided in matrix, a switching element (top-gate TFT here) connected to the pixel electrode, and a storage capacitor.

Note that although a top-gate TFT is used in this embodiment, a bottom-gate TFT may be used as well.

Description is made below on the manufacturing flow of a panel with reference to FIG. 37A to FIG. 38B.

Figure 37A:
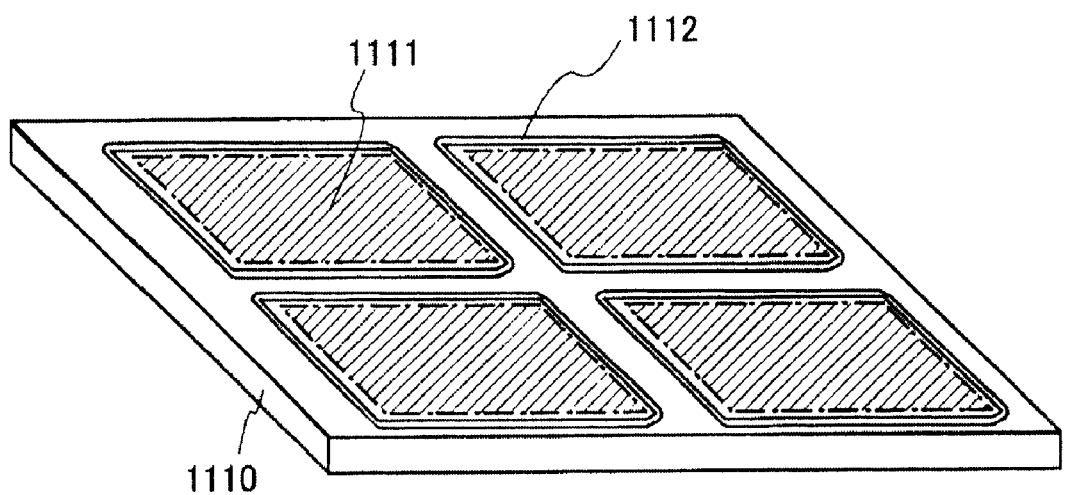
FIG. 37A and FIG. 37B illustrate manufacturing steps of a liquid crystal display device in accordance with the invention, in which a liquid crystal dropping method is used.

First, the first substrate 1110 is prepared, which has an insulating surface over which the pixel portion 1111 is formed. The first substrate 1110 undergoes the formation of an alignment film, rubbing process, dispersion of a spherical spacer, formation of a columnar spacer or formation of a color filter and the like in advance. Then, as shown in FIG. 37A, the sealant 1112 is formed in a predetermined position (pattern surrounding the pixel portion 1111) over the first substrate 1110 under an inert gas atmosphere or low pressure, using a dispenser apparatus or an inkjet apparatus. As the semi-light-transmissive sealant 1112, a material containing a filler (diameter of 6 to 24 µm) and having a viscosity of 40 to 400 Pa·s is used. Note that a material which does not dissolve into a liquid crystal upon contact therewith is preferably used. As the sealant 1112, an acrylic photo-curing resin or an acrylic heat-curing resin may be used. Since the sealant 1112 has a simple pattern, it can be formed by a printing method as well.

Figure 37B:
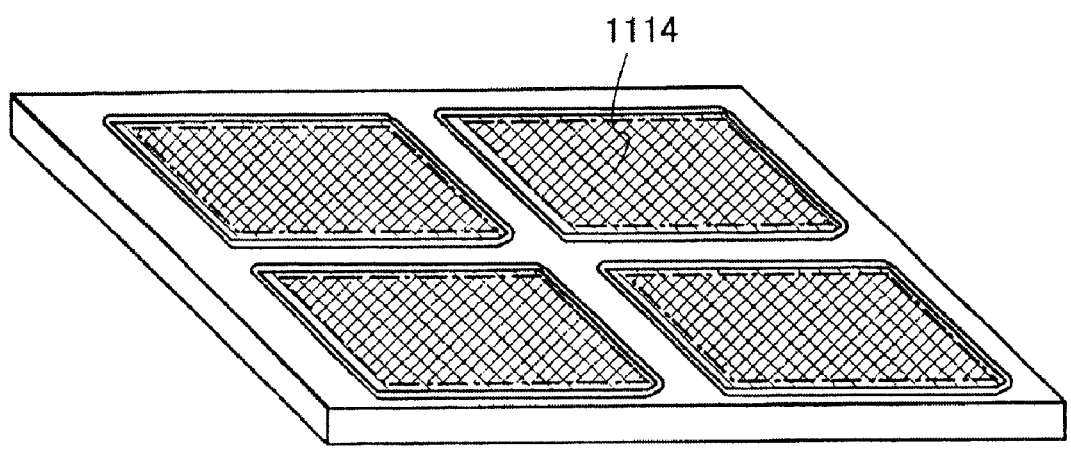

Next, the liquid crystal composition 1114 is dropped onto a region surrounded by the sealant 1112 by an inkjet deposition method (FIG. 37B). Since the viscosity of the liquid crystal composition can be set by controlling the temperature, it is suitable for the inkjet deposition method. By the inkjet deposition method, only a required amount of the liquid crystal composition 1114 can be kept in the region surrounded by the sealant 1112 without waste.

Next, the first substrate 1110 provided with the pixel portion 1111 and a second substrate 1031 provided with a counter electrode and an alignment film are attached to each other under the low pressure so that bubbles are not mixed therein (FIG. 38A). Here, the sealant 1112 is cured by ultraviolet irradiation or heat treatment at the same time as the attachment. Note that heat treatment may be applied in addition to the ultraviolet irradiation.

Figure 39A:
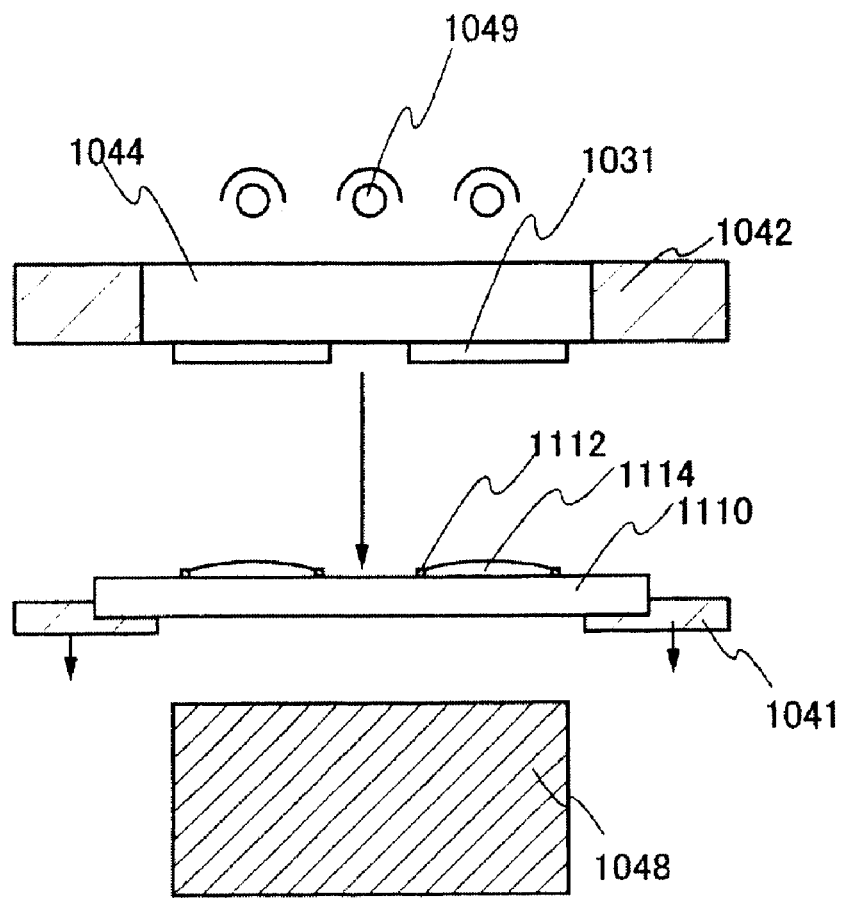
FIG. 39A and FIG. 39B illustrate manufacturing steps of a liquid crystal display device in accordance with the invention, in which a liquid crystal dropping method is used.
Figure 39B:
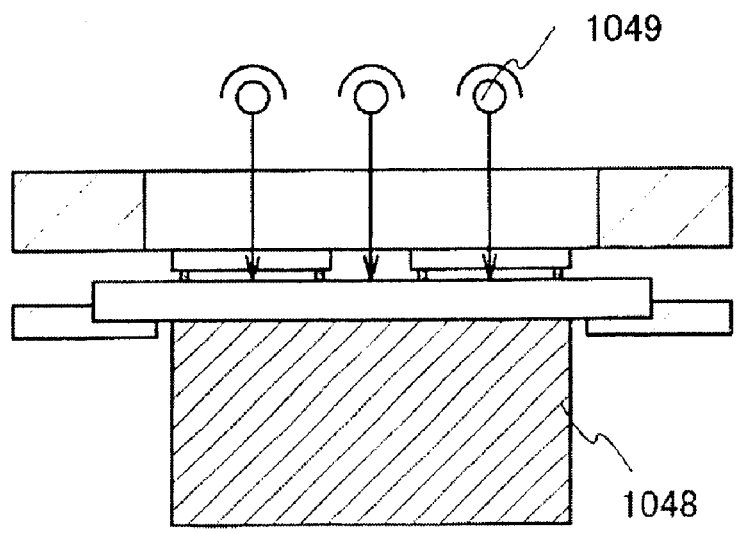

FIG. 39A and FIG. 39B illustrate examples of an attaching apparatus capable of applying ultraviolet irradiation or heat treatment upon attachment or after attachment.

In FIG. 39A and FIG. 39B, reference numeral 1041 denotes a first substrate supporting base, 1042 denotes a second substrate supporting base, 1044 denotes a light-transmissive window, 1048 denotes a bottom-side molding board, and 1049 denotes an ultraviolet light source. Note that in FIG. 39A and FIG. 39B, portions corresponding to those in FIG. 36A to FIG. 38B are denoted by the identical reference numerals.

The bottom-side molding board 1048 is incorporated with a heater, and cures the sealant 1112. The second substrate supporting base 1042 is provided with the light-transmissive window 1044 so as to transmit ultraviolet light from the light source 1049 and the like. Though not shown, the alignment of the substrate is carried out through the window 1044. The second substrate 1031 as a counter substrate is cut in advance into a desired size, and secured onto the second substrate supporting base 1042 by vacuum chuck and the like. FIG. 39B shows a state before attachment.

Upon attachment, the position of the first substrate supporting base 1041 and the second substrate supporting base 1042 is lowered so that pressure is applied to attach the first substrate 1110 and the second substrate 1031 to each other, and then the sealant 1112 is cured by ultraviolet irradiation. FIG. 39B shows a state after attachment.

Then, the first substrate 1110 is cut using a cutting apparatus such as a scriber apparatus, a breaker apparatus or a roll cutter (FIG. 38B). In this manner, four panels can be manufactured out of one substrate. Then, an FPC is attached using a known technique.

Note that each of the first substrate 1110 and the second substrate 1031 may be a glass substrate or a plastic substrate.

This embodiment can be appropriately implemented in combination with the aforementioned embodiment modes or embodiments as required.

Embodiment 13

This embodiment illustrates an example of manufacturing a display device in accordance with the invention, with reference to FIG. 41 to FIG. 44, where light is emitted through a substrate on which thin film transistors are formed and a counter substrate.

First, the island-like semiconductor films 507 to 509 in FIG. 29C are formed in accordance with Embodiment 10. Note that the identical portions to those in the aforementioned embodiments are denoted by the identical reference numerals.

Next, impurities are added into the island-like semiconductor films 507 to 509 for controlling the threshold voltage. In this embodiment, the island-like semiconductor films are doped with boron (B) by adding diborane ($B_2H_6$).

Next, an insulating film 700 is deposited covering the island-like semiconductor films 507 to 509. The insulating film 700 may be formed using, for example, silicon oxide (SiO), silicon nitride (SiN), silicon oxide containing nitrogen (SiON) or the like. As a deposition method, plasma CVD, sputtering or the like can be used.

Then, after depositing a conductive film over the insulating film 700, the conductive film is patterned to form gate electrodes 707 to 709.

Each of the gate electrodes 707 to 709 is formed to have a single-layer structure or a stacked-layer structure of two or more layer, using conductive films. In the case of stacking conductive films in two or more layers, each of the gate electrodes 707 to 709 may be formed by stacking an element selected from tantalum (Ta), tungsten (W), titanium (Ti), molybdenum (Mo) and aluminum (Al), or an alloy material or compound material containing such elements as a main component. Alternatively, each gate electrode may be formed by using a semiconductor film typified by a polycrystalline silicon film doped with impurity elements such as phosphorus (P).

In this embodiment, each of the gate electrodes 707 to 709 is formed by stacking a tantalum nitride (TaN) film of 30 nm thick and a tungsten (W) film of 370 nm thick. In this embodiment, top-layer gate electrodes 701 to 703 are formed using tungsten (W) while bottom-layer gate electrodes 704 to 706 are formed using tantalum nitride (TaN).

The gate electrodes 707 to 709 may be formed as a part of gate wires, or connected to gate wires which are formed separately.

Using as masks the gate electrodes 707 to 709 or a resist which is obtained through film deposition and patterning, the island-like semiconductor films 507 to 509 are each doped with impurities having n-type or p-type conductivity to form a source region, a drain region, a low-concentration impurity region and the like.

First, the island-like semiconductor films are doped with phosphorus (P) by adding phosphine ($PH_3$) at a dosage of $1 \times 10^{13}$ to $1 \times 10^{15}$ $cm^{-2}$ with an acceleration voltage of 60 to 120 keV. At this impurity doping, channel regions 713 and 716 of n-channel TFTs 761 and 762 respectively are formed.

In order to manufacture a p-channel TFT 763, the island-like semiconductor film is doped with boron (B) by adding diborane ($B_2H_6$) at a dosage of $1 \times 10^{13}$ to $5 \times 10^{15}$ $cm^{-2}$, for example $3 \times 10^{15}$ $cm^{-2}$ with an acceleration voltage of 60 to 100 keV, for example 80 keV. Accordingly, a source region or drain region 717 of the p-channel TFT 763 is formed, and a channel region 718 is formed by this impurity doping (FIG. 41B).

Next, the insulating film 700 is patterned to form gate insulating films 721 to 723. Accordingly, the semiconductor films are partially exposed.

Then, the island-like semiconductor films 507 and 508 of the n-channel TFTs 761 and 762 respectively are doped with phosphorus (P) by adding phosphine ($PH_3$) at a dosage of $1.0 \times 10^{15}$ to $2.5 \times 10^{16}$ $cm^{-2}$, for example $3.0 \times 10^{15}$ $cm^{-2}$ with an acceleration voltage of 40 to 80 keV, for example 50 keV. Accordingly, low-concentration impurity regions 712 and 715 and source or drain regions 711 and 714 of the n-channel TFTs 761 and 762 are formed (FIG. 41A).

In this embodiment, the source regions or drain regions 711 and 714 of the n-channel TFTs 761 and 762 contain phosphorus (P) at a concentration of $1 \times 10^{19}$ to $5 \times 10^{21}$ $cm^{-3}$. Meanwhile, the low-concentration impurity regions 712 and 715 of the n-channel TFTs 761 and 762 contain phosphorus (P) at a concentration of $1 \times 10^{18}$ to $5 \times 10^{19}$ $cm^{-3}$. In addition, the source or drain region 717 of the p-channel TFT 763 contains boron (B) at a concentration of $1 \times 10^{19}$ to $5 \times 10^{21}$ $cm^{-3}$.

Then, after removing an oxide film formed on the exposed surface of each semiconductor film with hydrofluoric acid or the like, a Ni film is deposited with a thickness of 25 to 50 nm by sputtering while heating the substrate at 450° C., thereby Ni silicide 3 is formed on the island-like semiconductor films 507 to 509. The power density at the film deposition is set to 0.7 W/cm². At this time, in the case where the gate electrodes 707 to 709 are formed using a semiconductor film typified by a polycrystalline silicon film doped with impurity elements such as phosphorus (P), Ni silicide is formed on the gate electrodes as well. After that, an unreacted portion of the Ni film is removed with a known etchant (FIG. 41B).

In this embodiment, the p-channel TFT 763 is used as a pixel TFT of the display device. In addition, the n-channel TFTs 761 and 762 are used as TFTs of a driver circuit which drives the pixel TFT 763. Note that the pixel TFT is not necessarily required to be a p-channel TFT and an n-channel TFT may be used. In addition, the driver circuit is not required to be the one combining multiple n-channel TFTs, and a circuit in which an n-channel TFT and a p-channel TFT are combined in a complementary manner, or a circuit combining multiple p-channel TFTs may be used.

Next, an insulating film 730 containing hydrogen is deposited. The insulating film containing hydrogen is a silicon oxide film containing nitrogen (SiON film) which is obtained by PCVD. Alternatively, a silicon nitride film containing oxygen (SiON film) may be used. Note that the insulating film 730 containing hydrogen is a first interlayer insulating film, which is a light-transmissive insulating film containing silicon oxide.

In the invention, Ni silicide is formed; therefore, the resistance of the source and drain regions is sufficiently lowered. Thus, an activation step of the impurity elements added into the island-like semiconductor films is not required. However, it is needless to mention that an activation step of the impurity elements added into the island-like semiconductor films may be performed. This activation step of impurities may be performed by laser irradiation, RTA or heat treatment at 550° C. for 4 hours in a nitrogen atmosphere. In the case of crystallizing the semiconductor films using a metal element which promotes crystallization, typically nickel, gettering can be performed at the same time as the activation, by which nickel in the channel regions can be reduced.

After that, by applying heat treatment at 410° C. for 1 hour, the island-like semiconductor films are hydrogenated. Note that this heat treatment is not required in the case of applying the aforementioned heat treatment at 550° C. for 4 hours in a nitrogen atmosphere.

Next, a planarizing film as a second interlayer insulating film 731 is formed, The planarizing film is formed using a light-transmissive inorganic material (e.g., silicon oxide, silicon nitride or silicon nitride containing oxygen), a photosensitive or non-photosensitive organic material (e.g., polyimide, acrylic, polyamide, polyimide amide, resist or benzpcyclobutene), or stacked layers thereof. Alternatively, the planarizing film may be formed using a light-transmissive film such as an insulating film formed of a $SiO_x$ film containing an alkyl group obtained by a coating method. For example, there is an insulating film formed using silica glass, alkyl siloxane polymers, alkylsilsesquioxane polymers, hydrogenated silsesquioxane polymers, hydrogenated alkylsilsesquioxane polymers or the like. As an example of the siloxane-based polymers, there are insulating film materials such as PSB-K1 or PSB-K31 (product of Toray industries, Inc.) and a coating insulating film material such as ZRS-5PH (product of Catalysts & Chemicals Industries Co., Ltd.).

Then, a third light-transmissive interlayer insulating film 732 is formed. The third interlayer insulating film 732 is provided as an etching stopper film for protecting the planarizing film as the second interlayer insulating film 731 when patterning a light-transmissive electrode 750 in a subsequent step. Note that the third interlayer insulating film 732 is not required if the second interlayer insulating film 731 functions as an etching stopper film when patterning the light-transmissive electrode 750.

Then, using a new mask, contact holes are formed in the first interlayer insulating film 730, the second interlayer insulating film 731 and the third interlayer insulating film 732. Then, after removing the mask, a conductive film (stacked film of TiN, Al and TiN) is formed, and it is etched (dry etching with a mixed gas of $BCl_3$ and $Cl_2$) using another mask so as to form electrodes or wires 741 to 745 (source and drain wires of TFTs, current supply wires and the like) (FIG. 41C). Although the electrodes and wires are integrated in this embodiment, they may be formed separately and electrically connected to each other, Note that TiN is one of materials which have high adhesion to a highly heat-resistant planarizing film. Additionally, the amount of N in TiN is preferably less than 44 atomic % in order to form a favorable ohmic contact with the source or drain regions of the TFTs.

Then, the light-transmissive electrode 750, namely an anode of an organic light-emitting element is formed with a thickness of 10 to 800 nm using another mask, The light-transmissive electrode 750 may be formed using a light-transmissive conductive material having a high work function (4.0 eV or higher) such as indium tin oxide (ITO), ITO containing Si elements (ITSO), or IZO (Indium Zinc Oxide) obtained by mixing zinc oxide (ZnO) with indium oxide (FIG. 42A).

Then, an insulator (called a partition wall or the like) 733 is formed using another mask so as to cover an edge of the light-transmissive electrode 750. The insulator 733 is formed by a coating method using a photosensitive or non-photosensitive organic material (e.g., polyimide, acrylic, polyamide, polyimide amide, resist or benzocyclobutene), or an SOG film (e.g., a $SiO_x$ film containing an alkyl group) with a thickness of 0.8 to 1 μm.

Then, organic-compound-containing layers 751 to 755 are formed by a vapor deposition method or a coating method. Note that degasification is preferably performed by vacuum heating before forming the organic-compound-containing layer 751 in order to improve the reliability of the light-emitting element. For example, before vapor-depositing an organic compound material, heat treatment is desirably performed at 200 to 300° C. in a low pressure atmosphere or an inert atmosphere in order to remove the gas contained in the substrate. Note that in the case of forming the interlayer insulating film and the partition wall using a highly heat-resistant SiOx film, heat treatment can be applied with an even higher temperature (410° C.).

First, a first organic-compound-containing layer 751 (first layer) is formed by selectively co-depositing molybdenum oxide ($MoO_x$), 4,4'-bis[N-(1-naphthyl)-N-phenyl-amino]-biphenyl (a-NPD) and rubrene with a vapor-deposition mask.

Note that other than $MoO_x$, a material having a high hole-injection property may be used, such as copper phthalocyanine (CuPC), vanadium oxide ($VO_x$), ruthenium oxide $RuO_x$) or tungsten oxide ($WO_x$). Alternatively, the first organic-compound-containing layer 751 may be formed by depositing a polymer material having a high hole-injection property by a coating method, such as a solution including polyethylene dioxythiophene (PEDOT) and polystyrene sulfonate (PSS).

Then, the hole-transporting layer (second layer) 752 is formed over the first organic-compound-containing layer 751 by selectively vapor-depositing a-NPD using a vapor-deposition mask. Note that other than a-NPD, a material having a high hole-transporting property typified by an aromatic amine compound may be used, such as N,N'-bis(3-methylphenyl)-N,N'-diphenyl-1,1-biphenyl-4,4'-diamine (abbreviated as TPD); 4,4',4"-tris(N,N-diphenyl-amino)-triphenylamine (abbreviated as TDATA); or 4,4',4"-tris[N-(3-methylphenyl)-N-phenyl-amino]-triphenylamine (abbreviated as MTDATA).

Then, the light-emitting layer 753 (third layer) is selectively formed. In order to form a full-color display device, the light-emitting layer 753 is selectively vapor-deposited for each light-emission color (R, G, B) by aligning a vapor-deposition mask.

As a light-emitting layer 753R which emits red light, material such as $Alq_3$ and DCM are used, or material such as $Alq_3$, rubrene, and BisDCJTM are used. As a light-emitting layer 753G which emits green light, material such as $Alq_3$ and DMQD (N,N'-dimethyl quinacridone) is used, or material such as $Alq_3$ and coumarin 6 are used. As a light-emitting layer 753B which emits blue light, a material such as a —NPD or tBu-DNA is used.

Next, the electron-transporting layer (fourth layer) 754 is formed over the light-emitting layer 753 by selectively vapor-depositing $Alq_3$ (tris(8-quinolinolato) aluminum) using a vapor-deposition mask. Other than $Alq_3$, a material having a high electron-transporting property typified by a metal complex having quinoline skeleton or bezoquinoline skeleton can be used, such as tris(5-methyl-8-quinolinolato) aluminum (abbreviated as $Almq_3$); bis(10-hydroxybenzo[h]quinolinato)beryllium (abbreviated as $BeBq_2$); or bis(2-methyl-8-quinolinolato)-4-phenylphenolato-aluminum (abbreviated as BAlq). Alternatively, a metal complex having oxazole ligands or thiazole ligands can be used, such as bis[2-(2-hydroxyphenyl)-benzoxazolato]zinc (abbreviated as $Zn(BOX)_2$); or bis[2-(2-hydroxyphenyl)-benzothiazolato]zinc (abbreviated as $Zn(BTZ)_2$). In addition to such metal complexes, the following materials having a high electron-transporting property can be used as the electron-transporting layer 754: 2-(4-biphenylyl)-5-(4-tert-buthylphenyl)-1,3,4-oxadiazole (abbreviated as PBD); 1,3-bis[5-p-tert-butylphenyl)-1,3,4-oxadiazole-2-yl]benzene (abbreviated as OXD-7); 3-(4-tert-butylphenyl)-4-phenyl-5-(4-biphenylyl)-1,2,4-triazole (abbreviated as TAZ); 3-(4-tert-butylphenyl)-4-(4-ethylphenyl)-5-(4-biphenylyl)-1,2,4-triazole (abbreviated as p-EtTAZ); bathophenanthroline (abbreviated as BPhen); or bathocuproine (abbreviated as BCP).

Next, the electron-injection layer (fifth layer) 755 is formed over the entire surface of the electron-transporting layer and the insulator by co-depositing 4,4'-bis(5-methylbenzoxazol-2-yl)stilbene (abbreviated as BzOs) and lithium (Li). The use of the benzoxazole derivative (BzOa) can suppress the damage caused by a subsequent sputtering step in the formation of a light-transmissive electrode 756. Note that in addition to BzOs:Li, a material having a high electron-injection property typified by alkaline metal compounds or alkaline earth metal compounds can be used, such as $CaF_2$, lithium fluoride (LiF) or cesium fluoride (CsF). Further, a mixture of $Alq_3$ and magnesium (Mg) can be used.

Then, the light-transmissive electrode 756, namely a cathode of an organic light-emitting element is formed with a thickness of 10 to 800 nm over the fifth layer 755. The light-transmissive electrode 756 may be formed using indium tin oxide (ITO), ITO containing Si elements (ITSO) or IZO (Indium Zinc Oxide) obtained by mixing zinc oxide (ZnO) with indium oxide.

In this manner, a light-emitting element is manufactured. Each material and thickness of the anode, the organic-compound-containing layers (first to fifth layers) and the cathode which constitute the light-emitting element are appropriately selected. It is desirable that the anode and the cathode be formed of the same material and have about the same thickness, or preferably about 100 nm.

If necessary, a light-transmissive protective layer 757 is formed covering the light-emitting element in order to prevent the moisture intrusion. The light-transmissive protective layer 757 may be formed using a silicon nitride film, a silicon oxide film, a silicon nitride film containing oxygen (SiNO film (composition ratio: N>O)) a silicon oxide film containing nitrogen (SiON film (composition ratio: N<O), a thin film containing carbon as a main component (e.g., DLC film or CN film), or the like which is obtained by sputtering or CVD (FIG. 42B).

Then, a second substrate 770 is attached to the substrate 500 with a sealant containing a gap material for keeping an even distance between the substrates. The second substrate 770 may be formed using a light-transmissive glass substrate or quartz substrate as well. Note that the space between the pair of the substrates may be kept as air gaps (inert gas) and provided with a drying agent, or filled with a light-transmissive sealant (e.g., ultraviolet-curing resin or epoxy resin).

Since the light-transmissive electrodes 750 and 756 of the light-emitting element are formed of light-transmissive materials, the light-emitting element can emit light in two directions, that is, light can be extracted from both sides.

By adopting the aforementioned panel structure, light emitted from the top side and light emitted from the bottom side can have substantially an equal amount.

Figure 43:
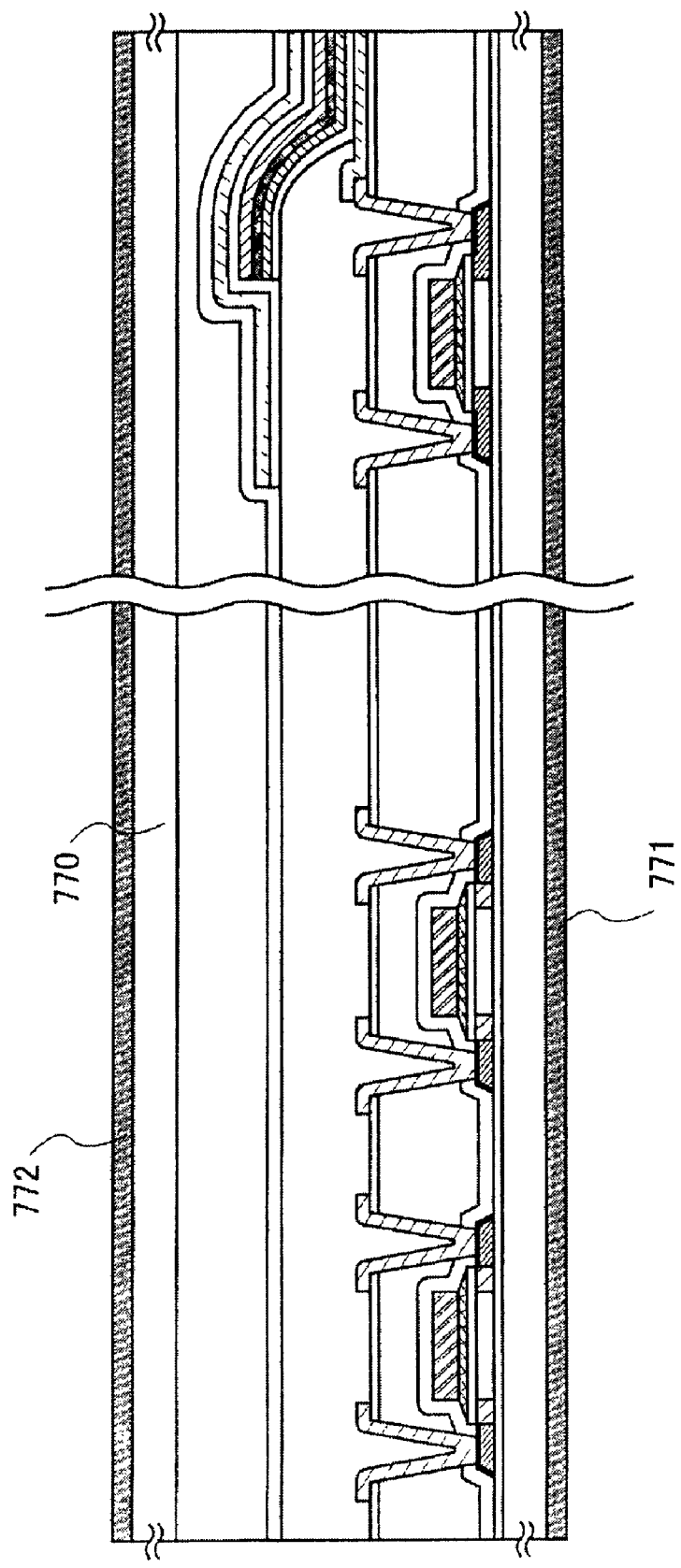
FIG. 43 illustrates a manufacturing step of an EL display device in accordance with the invention.

At the end, optical films (polarizing plate or circular polarizing plate) 771 and 772 are provided to improve the contrast (FIG. 43).

Figure 44:
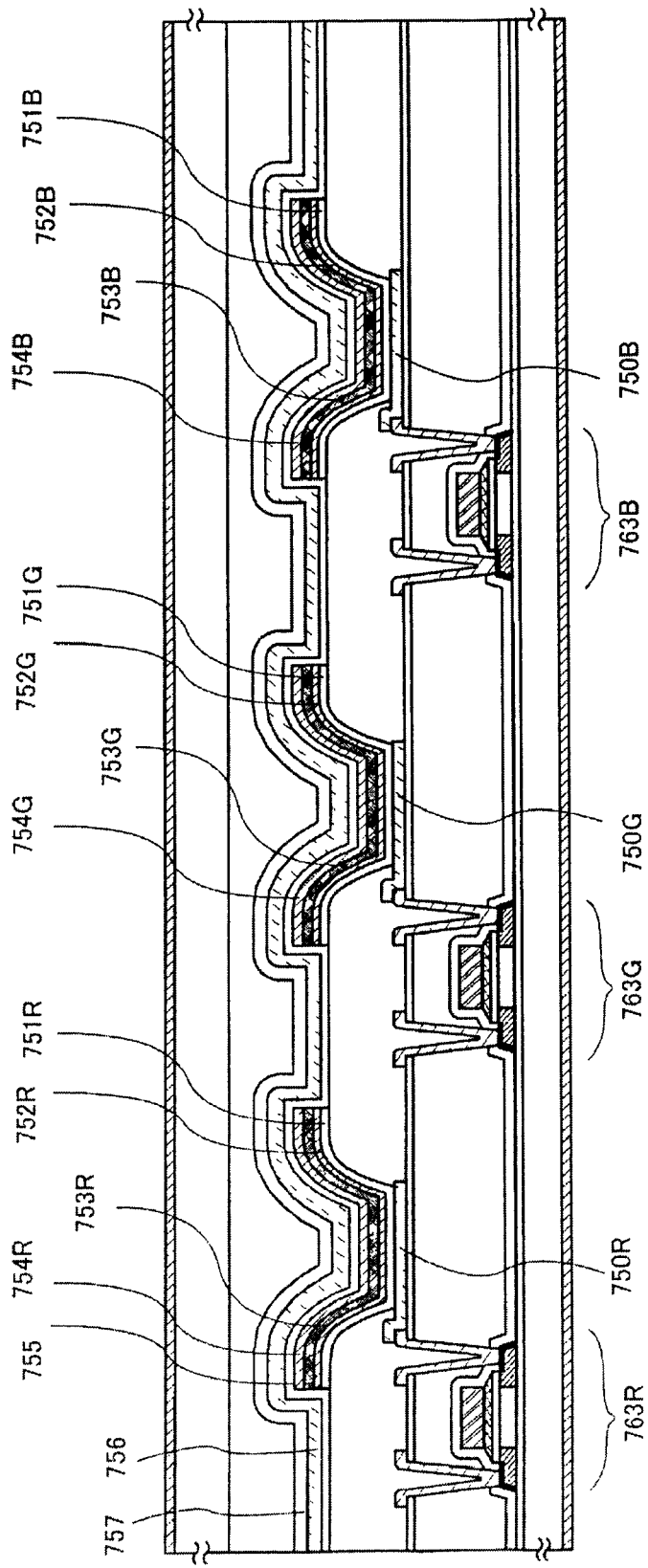
FIG. 44 illustrates a manufacturing step of an EL display device in accordance with the invention.

FIG. 44 is a cross-sectional view of light-emitting elements for the respective light-emission colors (R, G and B). A red (R) light-emitting element has a pixel TFT 763R, a light-transmissive electrode (anode) 750R, a first layer 751R, a second layer (hole-transporting layer) 752R, a third layer (light-emitting layer) 753R, a fourth layer (electron-transporting layer) 754R, a fifth layer (electron-injection layer) 755, a light-transmissive electrode (cathode) 756 and a light-transmissive protective layer 757.

A green (G) light-emitting element has a pixel TFT 763G, a light-transmissive electrode (anode) 750G, a first layer 751Q, a second layer (hole-transporting layer) 752C, a third layer (light-emitting layer) 753G, a fourth layer (electron-transporting layer) 754G, a fifth layer (electron-injection layer) 755, a light-transmissive electrode (cathode) 756 and a light-transmissive protective layer 757.

A blue (B) light-emitting element has a pixel TFT 763B, a light-transmissive electrode (anode) 750B, a first layer 751B, a second layer (hole-transporting layer) 7521, a third layer (light-emitting layer) 753B, a fourth layer (electron-transporting layer) 754B, a fifth layer (electron-injection layer) 755, a light-transmissive electrode (cathode) 756 and a light-transmissive protective layer 757.

Note that although a top-gate TFT is used as the TFT in this embodiment, the invention is not limited to this structure, and a bottom-gate (inversely staggered) TFT or a staggered TFT may be appropriately used. Further, the invention is not limited to a single-gate TFT, and a multi-gate TFT having multiple channel regions, for example a double-gate TFT may be used.

This embodiment can be appropriately implemented in combination with the aforementioned embodiment modes or embodiments as required.

Embodiment 14

As examples of an electronic device to which the invention can be applied, there are a camera (e.g., video camera or digital camera), a goggle display, a navigation system, an audio reproducing device (e.g., car audio component set), a computer, a game machine, a portable information terminal (e.g., mobile computer, portable phone, portable game machine or electronic book), an image reproducing device provided with a recording medium (specifically, a device which reproduces a recording medium such as a digital versatile disc (DVD) and is provided with a display for displaying the reproduced image), and the like. FIG. 45 to FIG. 50E illustrate specific examples of such electronic devices.

Figure 45:
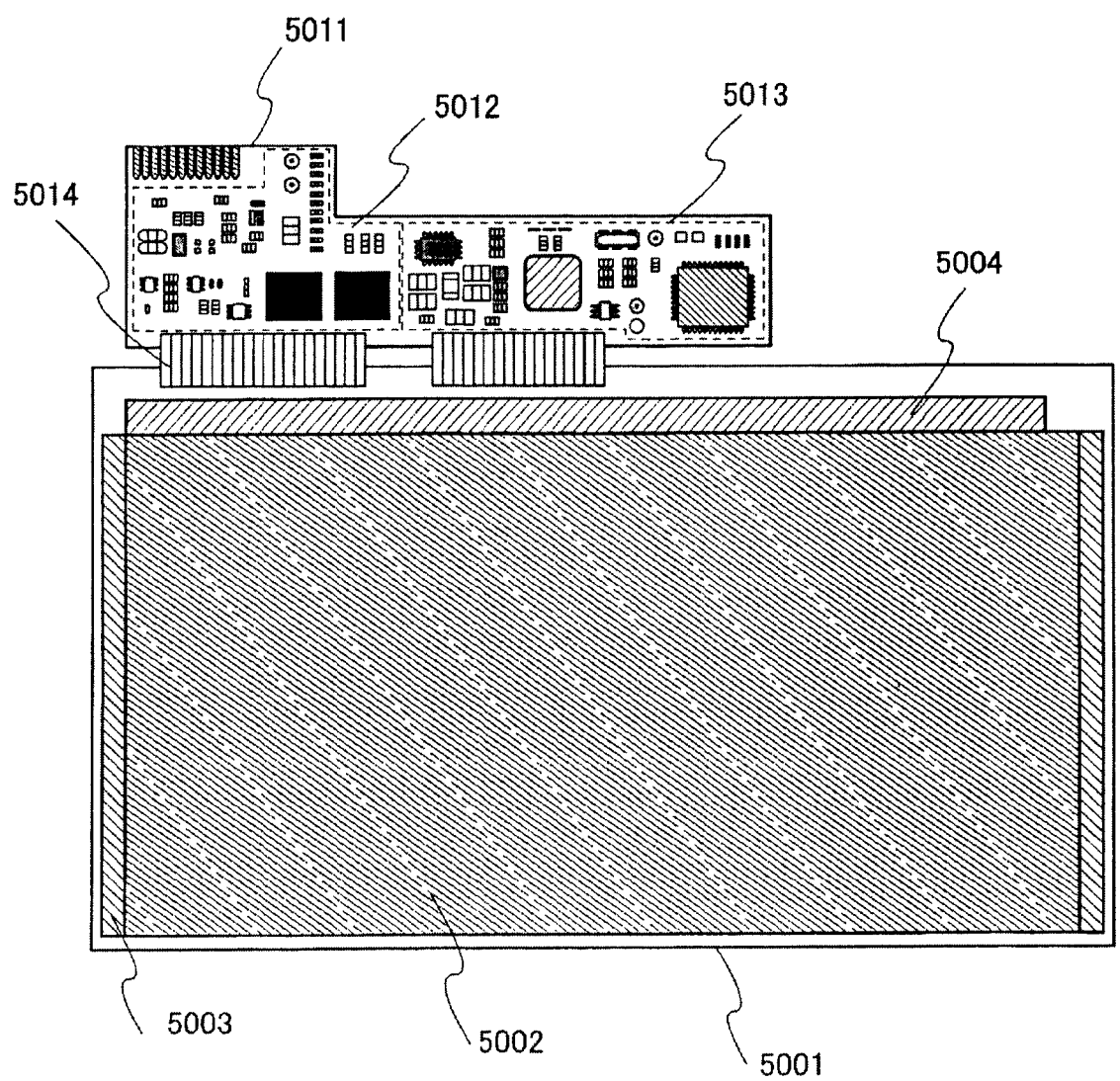
FIG. 45 illustrates an example of an electronic device to which the invention is applied.

FIG. 45 shows a liquid crystal module or an EL module in which a display panel 5001 and a circuit board 5011 are combined. The circuit board 5011 includes a control circuit 5012, a signal dividing circuit 5013 and the like, and is electrically connected to the display panel 5001 with a connecting wire 5014.

The display panel 5001 is provided with a pixel portion 5002 having multiple pixels, a scan line driver circuit 5003, and a signal line driver circuit 5004 for supplying a video signal to a selected pixel. Note that in the case of manufacturing a liquid crystal module or an EL module, the display panel 5001 may be manufactured in accordance with the aforementioned embodiment modes and embodiments. In addition, a driver circuit portion as a controller such as the scan line driver circuit 5003 and the signal line driver circuit 5004 may be manufactured using TFTs which are formed in accordance with the invention.

Figure 46:
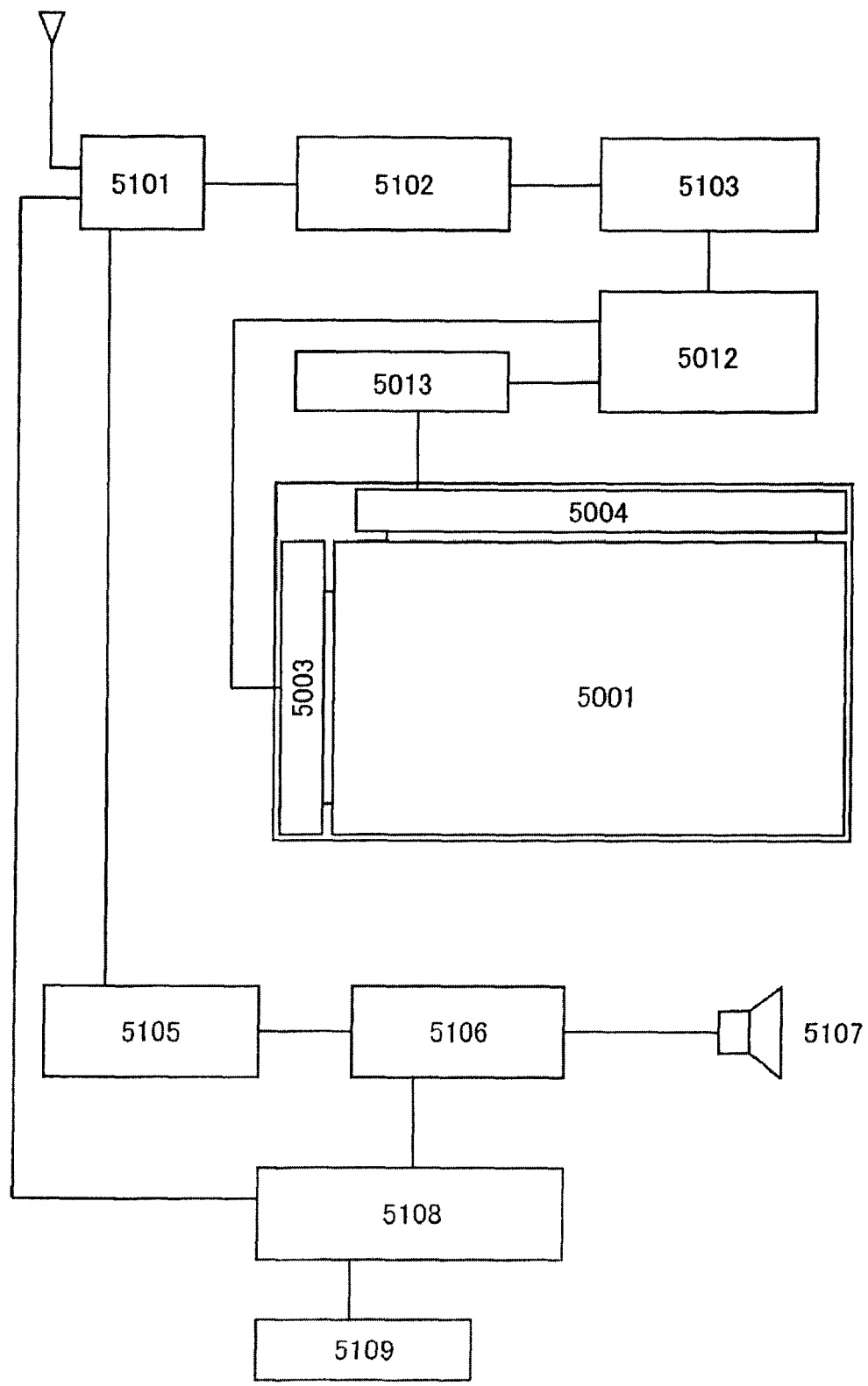
FIG. 46 illustrates an example of an electronic device to which the invention is applied.

By the liquid crystal module or the EL module shown in FIG. 45, a liquid crystal television receiver or an EL television receiver can be completed. FIG. 46 is a block diagram showing a main configuration of a liquid crystal television receiver or an EL television receiver. A tuner 5101 receives video signals and audio signals. Video signals are processed by a video signal amplifier circuit 5102, a video signal processing circuit 5103 which converts an output signal of the video signal amplifier circuit 5102 into a color signal corresponding to each color of red, green and blue, and the control circuit 5012 which converts the video signal to meet the input specification of a driver IC. The control circuit 5012 outputs signals to a scan line side and a signal line side respectively. In the case of digital driving, the signal line side may be provided with a signal dividing circuit 5013 so that an input digital signal is divided into m signals to be supplied.

Among signals received by the tuner 5101, audio signals are transmitted to an audio signal amplifier circuit 5105, and an output thereof is supplied to a speaker 5107 through an audio signal processing circuit 5106. The control circuit 5108 receives control data of a receiving station (reception frequency) or sound volume from an input portion 5109, and transmits signals to the tuner 5101 and the audio signal processing circuit 5106.

Figure 47A:
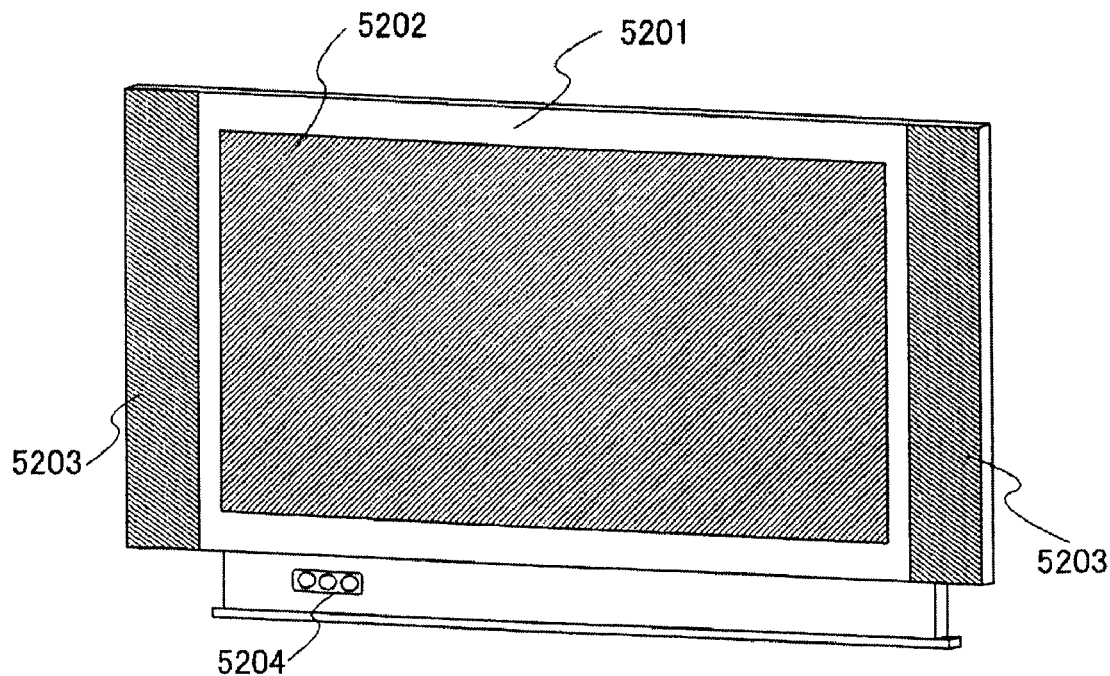
FIG. 47A and FIG. 47B illustrate examples of an electronic device to which the invention is applied.

As shown in FIG. 47A, a television receiver can be completed by incorporating a liquid crystal module or an EL module into a housing 5201. A display screen 5202 is formed by the liquid crystal module or the EL module. In addition, a speaker 5203, an operating switch 5204 and the like are appropriately provided.

Figure 47B:
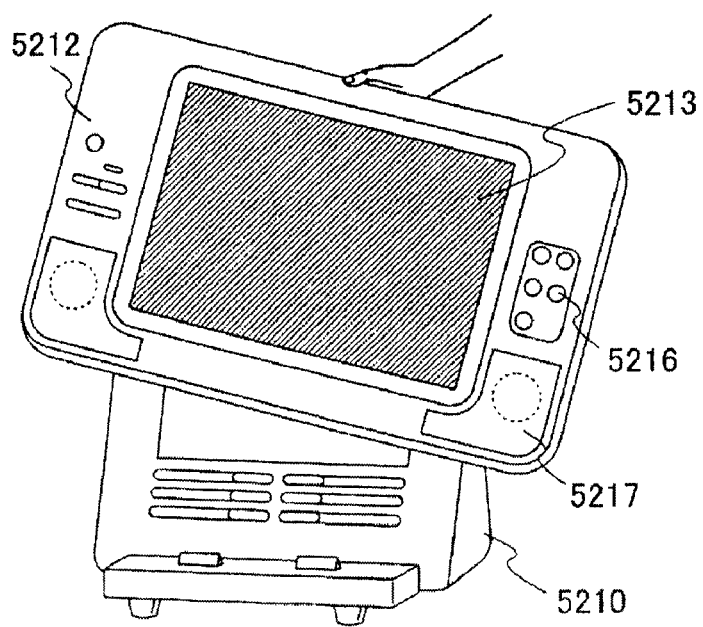

FIG. 47B shows a television receiver having a display portion which can be carried about wirelessly. A battery and a signal receiver are incorporated into a housing 5212, and a display portion 5213 and a speaker portion 5217 are driven with the battery. The battery can be repeatedly charged with a battery charger 5210. In addition, the battery charger 5210 can transmit/receive video signals, and the video signals can be transmitted to the signal receiver of the display. A housing 5212 is controlled with an operating key 5216. The device shown in FIG. 47B can also transmit signals from the housing 5212 to the battery charger 5210 by operating the operating key 5216; therefore, it can be called a two-way image and audio communication device. In addition, by transmitting a signal from the housing 5212 to the battery charger 5210 by operating the operating key 5216 so that the battery charger 5210 can transmit the signal to other electronic devices, the other electronic devices can be controlled. Thus, the device in FIG. 47B can also be called a general-purpose remote-control device. The invention can be applied to the display portion 5213, a control circuit portion and the like.

By applying the invention to the television receivers shown in FIG. 45 to FIG. 47B, simple manufacturing steps can be achieved with high accuracy. Further, television receivers can be manufactured with high throughput and yield while the manufacturing time and cost can be suppressed. In addition, by attaching an ID chip manufactured in accordance with the aforementioned embodiments to the television receivers in this embodiment, distribution routes and the like can be accurately controlled.

Needless to say, the invention is not limited to the television receivers, and it can be applied to various objects, specifically to large-area display mediums such as a monitor of a personal computer, an information display board at the train station or airport, and an advertisement display board on the street.

Figure 48A:
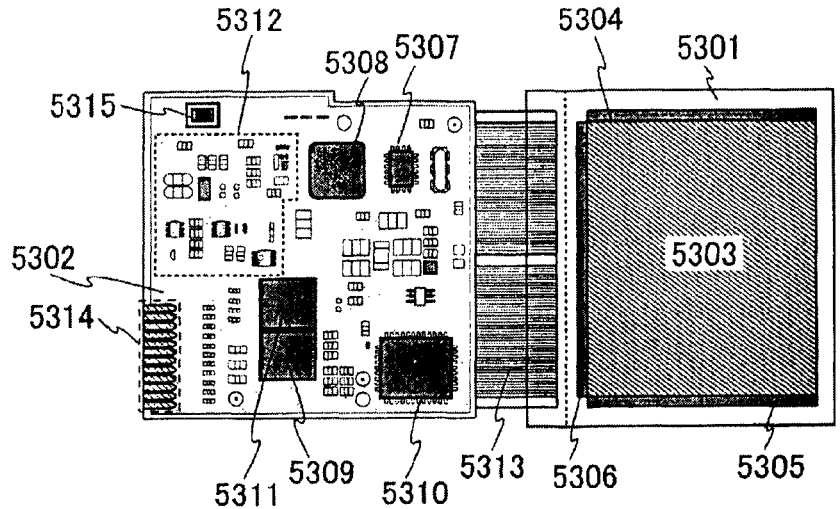
FIG. 48A and FIG. 48B illustrate examples of an electronic device to which the invention is applied.

FIG. 48A shows a module where a display panel 5301 and a printed wiring board 5302 are combined. The display panel 5301 is provided with a pixel portion 5303 having a plurality of pixels, a first scan line driver circuit 5304, a second scan line driver circuit 5305, and a signal line driver circuit 5306 for supplying a video signal to a selected pixel.

The printed wiring board 5302 is provided with a controller 5307, a central processing unit (CPU) 5308, a memory 5309, a power source circuit 5310, an audio processing circuit 5311, a transmission/reception circuit 5312 and the like. The printed wiring board 5302 and the display panel 5301 are connected to each other with a flexible printed wiring board (FPC) 5313. The printed wiring board 5302 is provided with a capacitor, a buffer circuit and the like so that noise interruptions in a power source voltage or signals can be prevented as well as a delay of the signal rising can be prevented. Further, the controller 5307, the audio processing circuit 5311, the memory 5309, the CPU 5308, the power source circuit 5310 and the like may be mounted onto the display panel 5301 by a COG (Chip On Glass) bonding method. The scale of the printed wiring board 5302 can be reduced by adopting the COG bonding method.

Various control signals are inputted/outputted through an interface (VP) portion 5314 provided on the printed wiring board 5302. The printed wiring board 5302 is also provided with an antenna port 5315 for transmitting/receiving signals to/from an antenna.

Figure 48B:
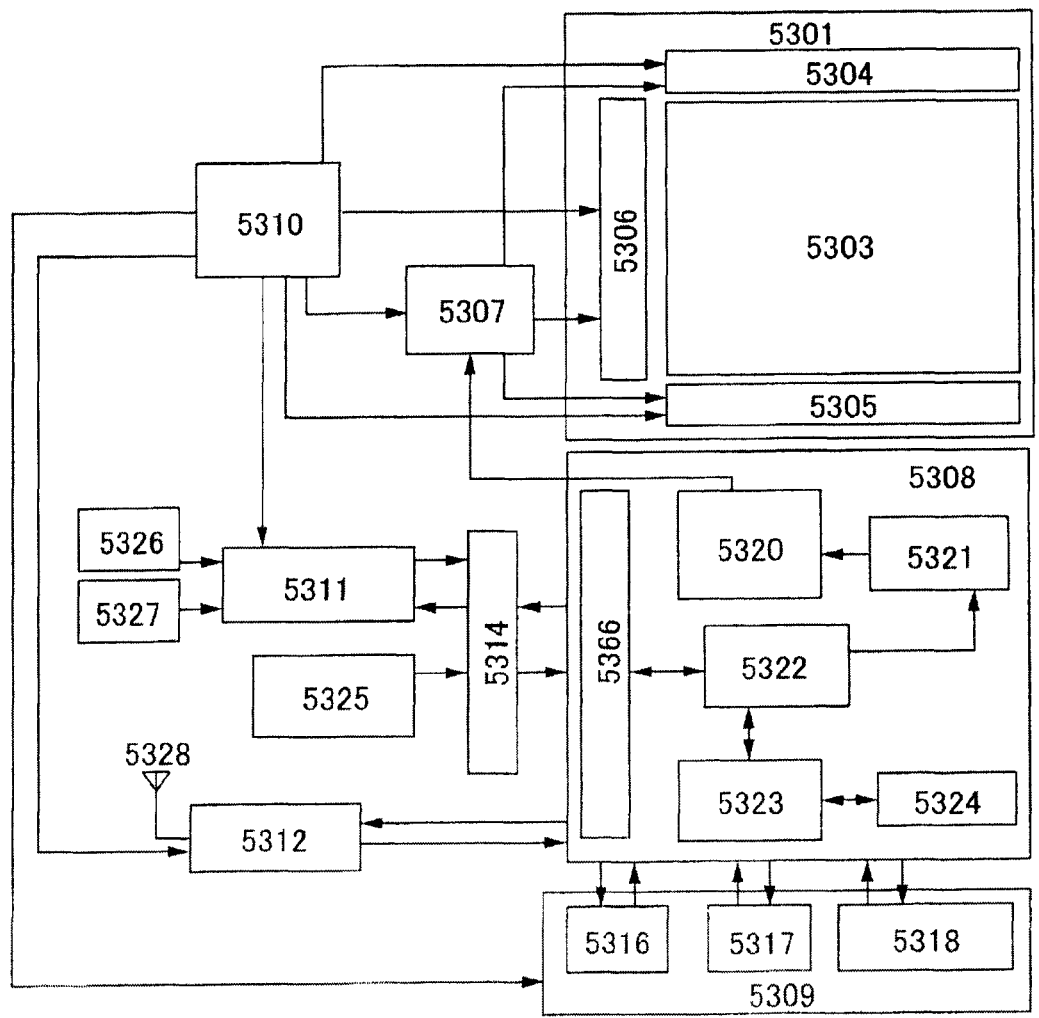

FIG. 48B is a block diagram of the module shown in FIG. 48A. The module includes a VRAM 5316, a DRAM 5317 and a flash memory 5318 as the memory 5309. The VRAM 5316 stores image data displayed on the panel, the DRAM 5317 stores image data or audio data, and the flash memory stores various programs.

The power source circuit 5310 supplies power to operate the display panel 5301, the controller 5307, the CPU 5308, the audio processing circuit 5311, the memory 5309 and the transmission/reception circuit 5312. Depending on a panel specification, the power source circuit 5310 may be provided with a current source.

The CPU 5308 includes a control signal generating circuit 5320, a decoder 5321, a register 5322, an arithmetic circuit 5323, a RAM 5324, an interface 5366 for the CPU 5308, and the like. Various signals inputted to the CPU 5308 through the interface 5366 are once stored in the register 5322, and then inputted to the arithmetic circuit 5323, the decoder 5321 and the like. The arithmetic circuit 5323 performs arithmetic operations based on the inputted signal, and specifies the address to send various instructions. On the other hand, the signals inputted to the decoder 5321 are decoded and then inputted to the control signal generating circuit 5320. The control signal generating circuit 5320 generates signals containing various instructions based on the inputted signals, and then transmits the signals to the address specified by the arithmetic circuit 5323, specifically the memory 5309, the transmission/reception circuit 5312, the audio processing circuit 5311, the controller 5307 and the like.

Each of the memory 5309, the transmission/reception circuit 5312, the audio processing circuit 5311 and the controller 5307 operates in accordance with the received instruction. Brief description is made below on the operation thereof.

A signal inputted from an input means 5325 is transmitted to the CPU 5308 mounted on the printed wiring board 5302 through the I/F portion 5314. The control signal generating circuit 5320 converts the image data stored in the VRAM 5316 into a predetermined format in accordance with the signal transmitted from the input means 5325 such as a pointing device or a keyboard, and then transmits the data to the controller 5307.

The controller 5307 processes the signal containing image data which is transmitted from the CPU 5308 in accordance with the panel specification, and then supplies the signal to the display panel 5301. The controller 5307 generates a Hsync signal, a Vsync signal, a clok signal CLK, an AC voltage (AC Cont) and a switching signal L/R based on the power source voltage inputted from the power source circuit 5310 or various signals inputted from the CPU 5308, and then supplies the signals to the display panel 5301.

The transmission/reception circuit 5312 processes signals transmitted/received as radio waves to/from the antenna 5328. Specifically, the transmission/reception circuit 5312 includes high frequency circuits such as an isolator, a bandpass filter, a VCO (Voltage Controlled Oscillator), an LPF (Low Pass Filter), a coupler and a balun. Among signals transmitted/received to/from the transmission/reception circuit 5312, a signal containing audio data is inputted to the audio processing circuit 5311 in accordance with an instruction from the CPU 5308.

The signal containing audio data which is transmitted in accordance with the instruction from the CPU 5308 is demodulated into an audio signal in the audio processing circuit 5311, and then transmitted to a speaker 5327. An audio signal transmitted from a microphone 5326 is modulated in the audio processing circuit 5311, and then transmitted to the transmission/reception circuit 5312 in accordance with an instruction from the CPU 5308.

The controller 5307, the CPU 5308, the power source circuit 5310, the audio processing circuit 5311 and the memory 5309 can be integrated as a package of this embodiment. This embodiment can be applied to any circuit other than high frequency circuits such as an isolator, a bandpass filter, a VCO (Voltage Controlled Oscillator), an LPF (Low Pass Filter), a coupler and a balun.

Figure 49:
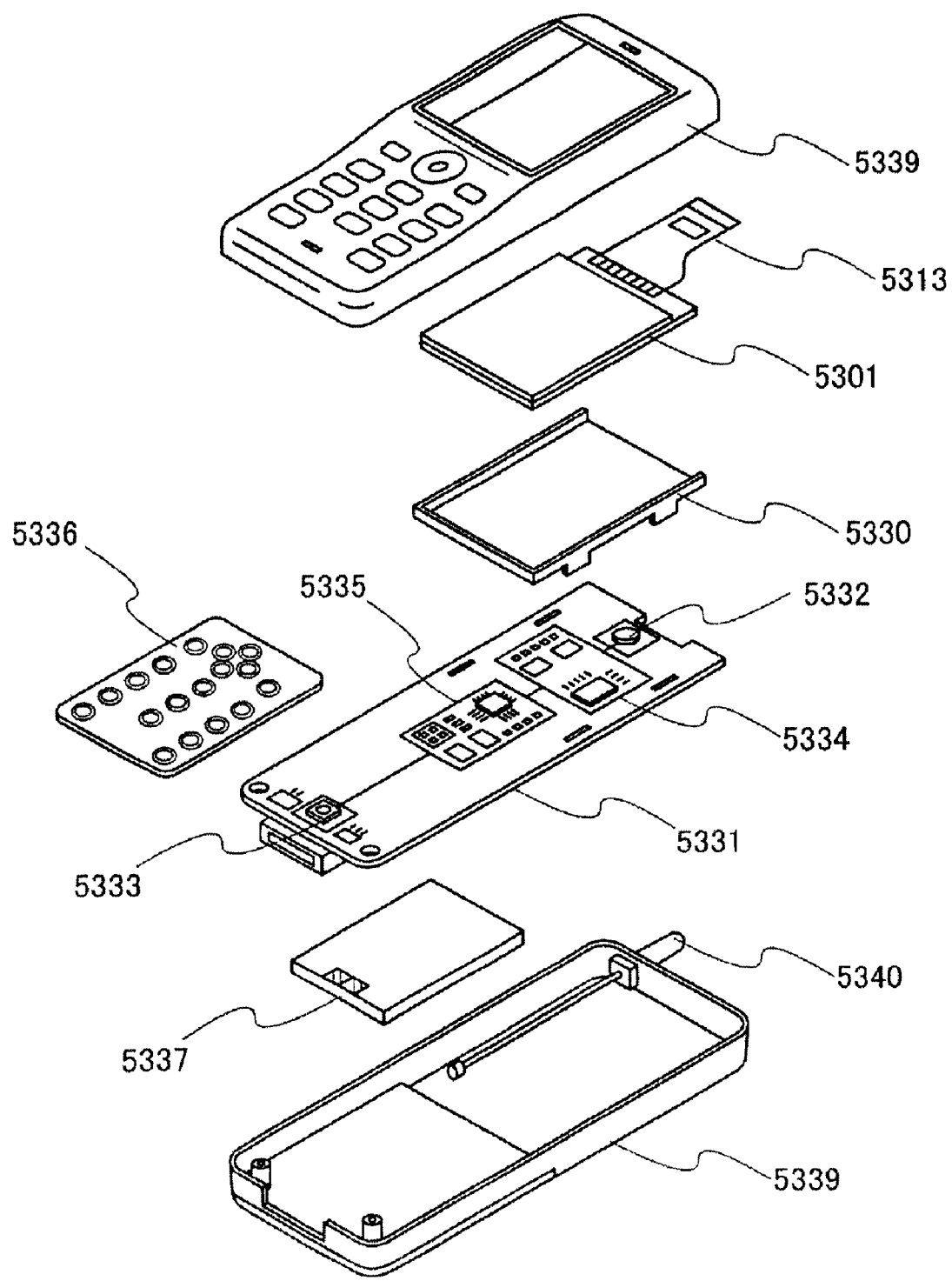
FIG. 49 illustrates an example of an electronic device to which the invention is applied.

FIG. 49 shows one mode of a portable phone including the module shown in FIG. 48A and FIG. 48B. The display panel 5301 is incorporated into a housing 5330 so that it can be freely detached. The shape and size of the housing 5330 can be appropriately changed in accordance with the size of the display panel 5301. The housing 5330 to which the display panel 5301 is fixed is fitted into a printed board 5331 so as to assemble a module.

The display panel 5301 is connected to the printed board 5331 through an FPC 5313. Over the printed board 5331, a speaker 5332, a microphone 5333, a transmission/reception circuit 5334 and a signal processing circuit 5335 including a CPU and a controller are formed. Such a module is combined with an input means 5336, a battery 5337 and an antenna 5340 to be incorporated into a housing 5339. A pixel portion of the display panel 5301 is disposed so that it can be seen from an open window formed in the housing 5339.

The portable phone in accordance with this embodiment can be changed into various modes in accordance with the function or applications thereof. For example, even when providing multiple display panels and appropriately dividing a housing into multiple portions so that the portable phone can be opened/folded with a hinge, a similar effect to the aforementioned can be obtained.

By applying the invention to the portable phone shown in FIG. 48A to FIG. 49, simple manufacturing steps can be achieved with high accuracy. Further, a portable phone can be manufactured with high throughput and yield while the manufacturing time and cost can be suppressed. In addition, by attaching an ID chip manufactured in accordance with the aforementioned embodiments to the portable phone in this embodiment, distribution routes and the like can be accurately controlled.

Figure 50A:
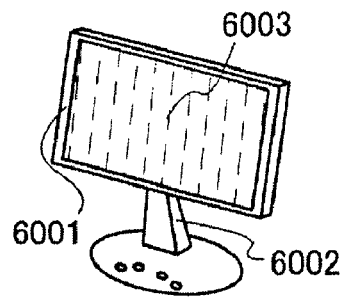
FIG. 50A to FIG. 50E illustrate examples of an electronic device to which the invention is applied.

FIG. 50A is a liquid crystal display or an OLED display which includes a housing 6001, a supporting base 6002, a display portion 6003 and the like. The invention can be applied to the display portion 6003, using the liquid crystal module or the EL module shown in FIG. 45 or the display panel configuration shown in FIG. 48A. In addition, the invention can also be applied to a control circuit portion and the like.

By using the invention, simple manufacturing steps can be achieved with high accuracy. Further, the display of this embodiment can be manufactured with high throughput and yield while the manufacturing time and cost can be suppressed. In addition, by attaching an ID chip manufactured in accordance with the aforementioned embodiments to the display in this embodiment, distribution routes and the like can be accurately controlled.

Figure 50B:
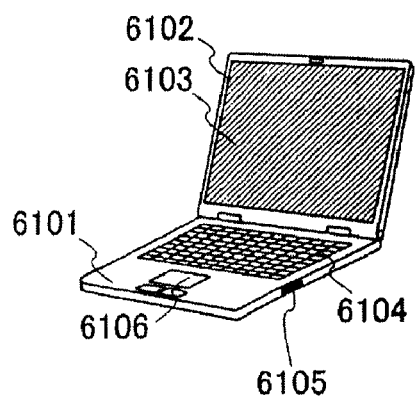

FIG. 50B is a computer which includes a main body 6101, a housing 6102, a display portion 6103, a keyboard 6104, an external connection port 6105, a pointing mouse 6106 and the like. The invention can be applied to the display portion 6103, using the liquid crystal module or the EL module shown in FIG. 45 or the display panel configuration shown in FIG. 48A. In addition, the invention can also be applied to a control circuit portion and the like.

By using the invention, simple manufacturing steps can be achieved with high accuracy. Further, the display of this embodiment can be manufactured with high throughput and yield while the manufacturing time and cost can be suppressed. In addition, by attaching an ID chip manufactured in accordance with the aforementioned embodiments to the display in this embodiment, distribution routes and the like can be accurately controlled.

Figure 50C:
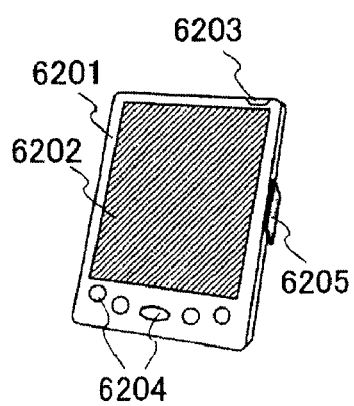

FIG. 50C is a portable computer which includes a main body 6201, a display portion 6202, a switch 6203, operating keys 6204, an IR port 6205 and the like. The invention can be applied to the display portion 6202, using the liquid crystal module or the EL module shown in FIG. 45 or the display panel configuration shown in FIG. 48A. In addition, the invention can also be applied to a control circuit portion and the like.

By using the invention, simple manufacturing steps can be achieved with high accuracy. Further, the computer of this embodiment can be manufactured with high throughput and yield while the manufacturing time and cost can be suppressed. In addition, by attaching an ID chip manufactured in accordance with the aforementioned embodiments to the computer in this embodiment, distribution routes and the like can be accurately controlled.

Figure 50D:
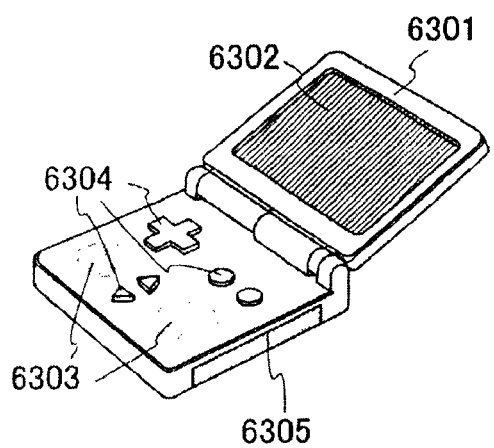

FIG. 50D is a portable game machine which includes a housing 6301, a display portion 6302, speaker portions 6303, operating keys 6304, a recording medium socket 6305 and the like. The invention can be applied to the display portion 6302, using the liquid crystal module or the EL module shown in FIG. 45 or the display panel configuration shown in FIG. 48A. In addition, the invention can also be applied to a control circuit portion and the like.

By using the invention, simple manufacturing steps can be achieved with high accuracy. Further, the game machine of this embodiment can be manufactured with high throughput and yield while the manufacturing time and cost can be suppressed. In addition, by attaching an ID chip manufactured in accordance with the aforementioned embodiments to the game machine in this embodiment, distribution routes and the like can be accurately controlled.

Figure 50E:
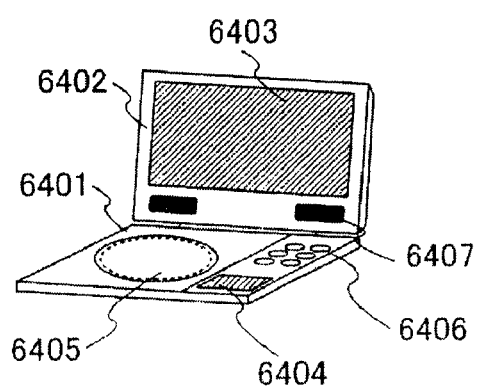

FIG. 50E is a portable image reproducing device provided with a recording medium (specifically, a DVD reproducing device) which includes a main body 6401, a housing 6402, a display portion A 6403, a display portion B 6404, a recording medium (e.g., DVD) reading portion 6405, an operating key 6406, a speaker portion 6407 and the like. The display portion A 6403 mainly displays image data while the display portion B 6404 mainly displays text data. The invention can be applied to the display portion A 6403 and the display portion B 6404, using the liquid crystal module or the EL module shown in FIG. 45 or the display panel configuration shown in FIG. 48A. In addition, the invention can also be applied to a control circuit portion and the like. Note that the image reproducing device provided with a recording medium includes a home-use game machine and the like.

By using the invention, simple manufacturing steps can be achieved with high accuracy. Further, the image reproducing device of this embodiment can be manufactured with high throughput and yield while the manufacturing time and cost can be suppressed. In addition, by attaching an ID chip manufactured in accordance with the aforementioned embodiments to the image reproducing device in this embodiment, distribution routes and the like can be accurately controlled.

The display device used in such electronic devices can be formed using a glass substrate as well as a heat-resistant plastic substrate in accordance with the size, strength or application purposes. Accordingly, further weight saving can be achieved.

Note that examples shown in this embodiment are only exemplary, and therefore, the invention is not limited to such applications.

This embodiment can be appropriately implemented in combination with any of the aforementioned embodiment modes and embodiments.

Embodiment 15

Here, a comparison was made between the characteristics of a p-channel TFT which is formed using a Ni silicide formation method of the invention and a p-channel TFT which is formed without using Ni silicide. First, a manufacturing method of both the TFTs is shown.

Figure 51A:
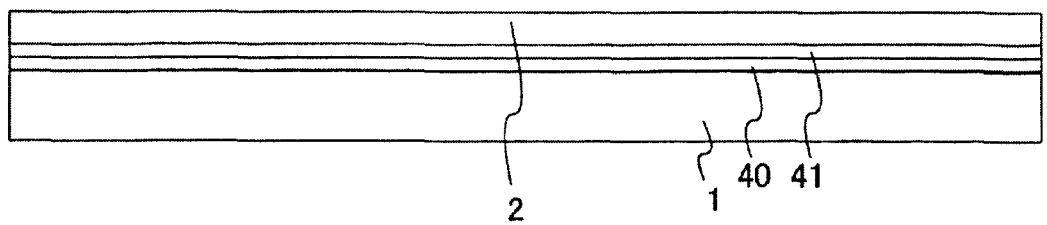
FIG. 51A to FIG. 51D illustrate manufacturing steps of a semiconductor device in accordance with the invention.

The amorphous silicon film 2 is formed with a thickness of 66 nm by plasma CVD over a cleaned glass substrate (EAGLE 2000, product of Corning Incorporated) 1. In order to prevent diffusion of impurities such as sodium from the substrate side, the silicon nitride oxide film 40 ($SiN_xO_y$ film) (x>y) with a thickness of 50 nm, and the silicon oxynitride film 41 ($SiO_xN_y$ film) (x>y) with a thickness of 100 nm are formed in this order as base films (FIG. 51A).

Figure 51B:
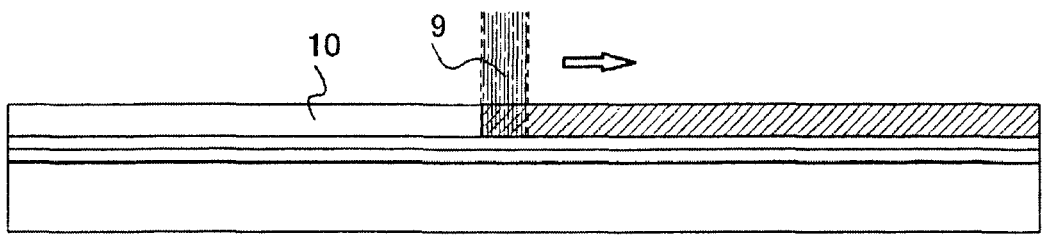

Then, the amorphous silicon film 2 is crystallized by laser irradiation. Here, after applying heat treatment for dehydrogenation (500° C. for 1 hour), the amorphous silicon film 2 is irradiated with the laser beam 9 under the atmospheric pressure (FIG. 51B).

As the laser beam 9, a second harmonic of a CW $YVO_4$ laser is used. The laser output is set to about 10 W, and the laser beam is converted into a second harmonic with a nonlinear optical element. The power density at this time is set to about 0.001 to 100 $MW/cm^2$. Then, the silicon film is irradiated with the laser beam while being moved relatively to the laser beam at a rate of 35 cm/sec. Accordingly, the crystalline silicon film 10 is formed.

Figure 51C:
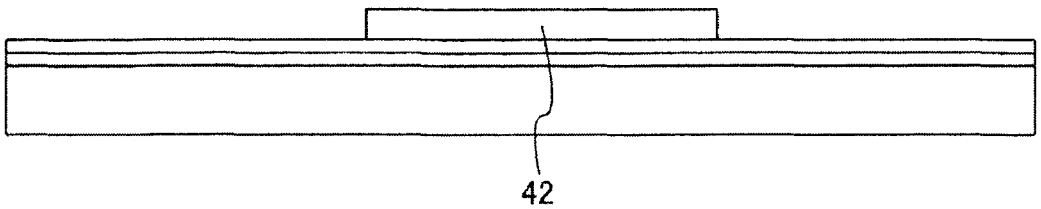

The crystalline silicon film 10 is formed into the island-like crystalline silicon film 42 by a photolithography step (FIG. 51C). After that, the crystalline silicon film 42 is doped with B ions in order to control the threshold voltage of a TFT. Then, the gate insulating film 43 is formed covering the crystalline silicon film 42. Here, a silicon oxynitride film ($SiO_xN_y$ film) (x>y) is formed with a thickness of 40 nm by plasma CVD.

Then, a first conductive layer and a second conductive layer are stacked over the gate insulating layer 43. The first conductive layer is formed by depositing a TaN film with a thickness of 30 nm by sputtering while the second conductive layer is formed by depositing a W film with a thickness of 370 nm by sputtering.

Figure 51D:
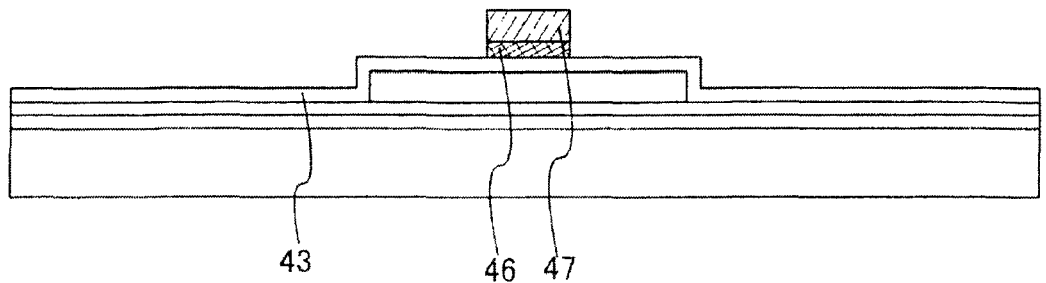
Figure 52A:
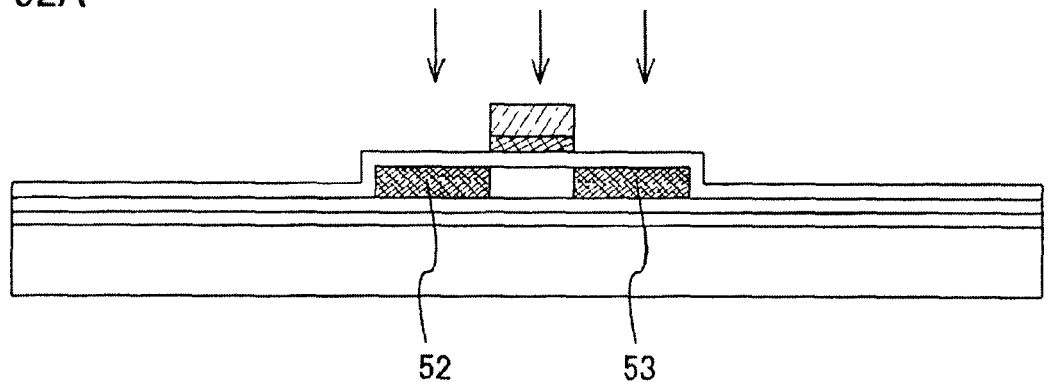
FIG. 52A to FIG. 52D illustrate manufacturing steps of a semiconductor device in accordance with the invention.

Then, a resist mask is formed by photolithography, and the first and second conductive layers are etched for forming a gate electrode and a gate line, thereby forming the conductive layers (also called gate electrode layers) 46 and 47 functioning as a gate electrode (FIG. 51D). Then, the crystalline silicon film 42 is doped with p-type impurity elements (boron) to form the p-type impurity regions 52 and 53 (FIG. 52A).

Figure 52B:
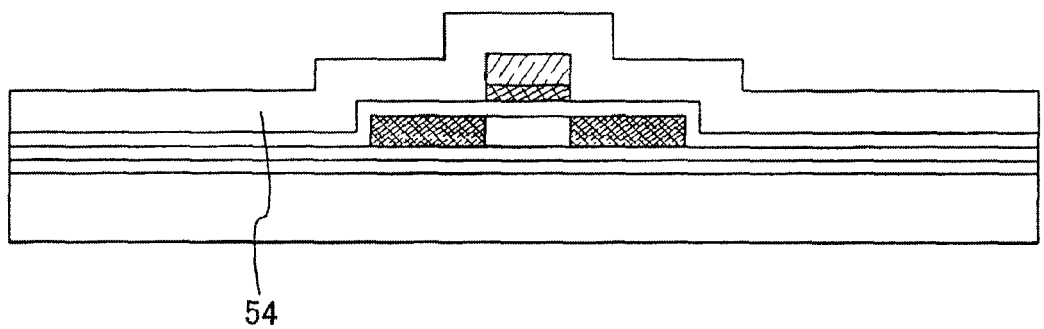

Then, the insulating layer 54 is formed covering the gate insulating film 43 and the conductive layers 46 and 47. The insulating layer 54 is formed by depositing silicon oxynitride ($SiO_xN_y$) (x>y) with a thickness of 100 nm by plasma CVD (FIG. 52B).

Figure 52C:
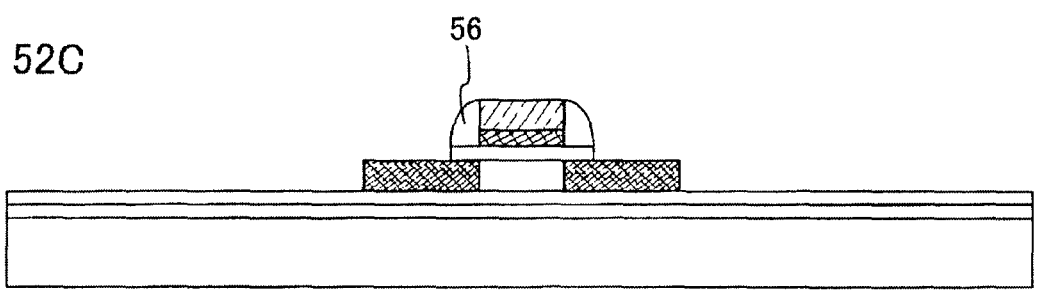

Then, the insulating layer 54 is selectively (mainly, in a perpendicular direction) etched by anisotropic etching, thereby forming the insulating layers (hereinafter referred to as sidewall insulating layers) 56 on side surfaces of the conductive layers 46 and 47. The sidewall insulating layers 56 function to prevent a short-circuit between the gate electrode layer and source and drain regions due to Ni silicide which is formed later. By this etching, the gate insulating film is also partially etched so that a part of the crystalline silicon film is exposed (FIG. 52C).

Then, an oxide film formed on the surface of the crystalline silicon film is removed by etching. Here, the oxide film is removed by dropping a buffered hydrofluoric acid solution in which HF and $NH_4F$ are mixed at a ratio of 1:100 while rotating the substrate.

Figure 52D:
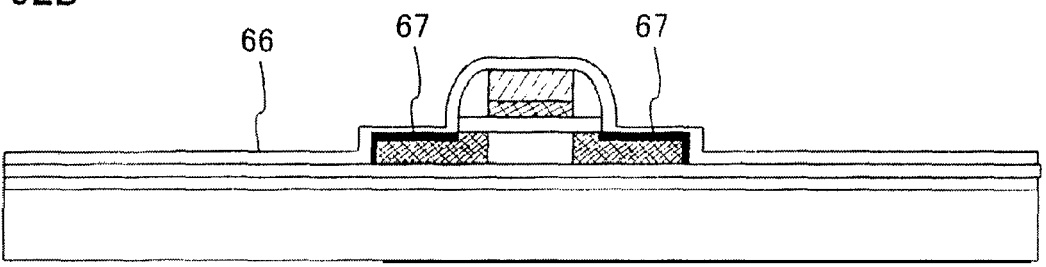

After removing the oxide film, the Ni film 66 is deposited by sputtering in an Ar atmosphere using a heater (not shown), thereby forming the Ni silicide 67. The heating temperature at the Ni film deposition is set to 450° C., the power density at the film deposition is set to 0.7 $W/cm^2$, the deposition pressure is set to 0.2 Pa, and the thickness of the Ni film is set to 15 or 25 nm (FIG. 52D). As for the TFT as a comparative example, on the other hand, Ni film deposition was not performed.

Figure 53A:
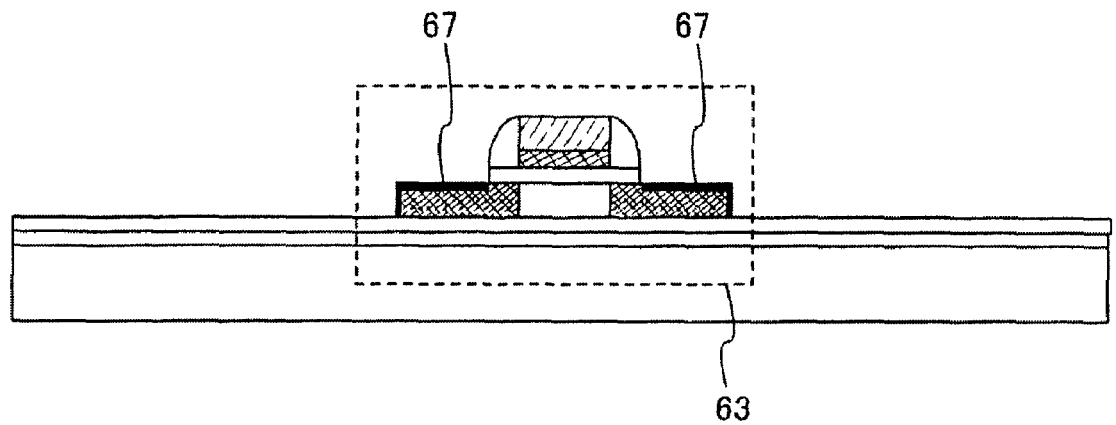
FIG. 53A to FIG. 53C illustrate manufacturing steps of a semiconductor device in accordance with the invention.
Figure 53B:
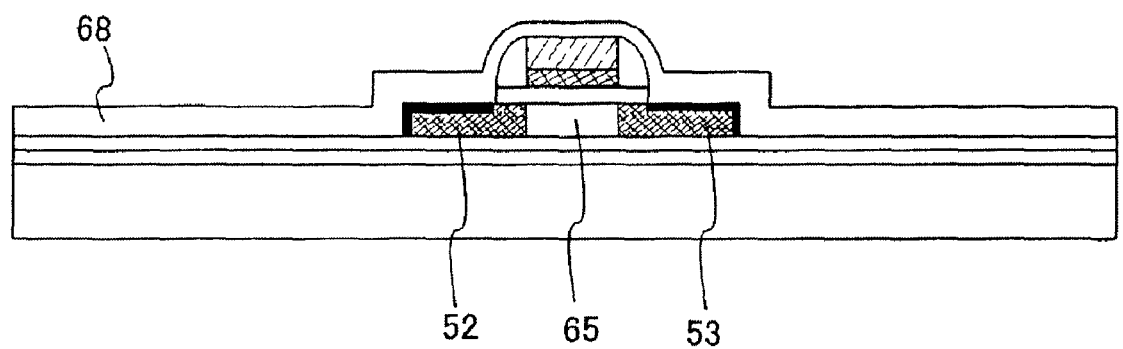

Then, an unreacted portion of the Ni film is removed. Here, the unreacted portion of the Ni film is removed by using an etchant composed of $HCl:HNO_3:H_2O=3:2:1$ (FIG. 53A). As for the TFT as a comparative example, on the other hand, this removal step was not performed.

Through the aforementioned steps, the basic structure of the p-channel thin film transistor 63 is completed. The p-channel thin film transistor 63 has a crystalline silicon film including the p-type impurity regions 52 and 53 and the channel region 65; the gate insulating layer 43; and the conductive layers 46 and 47 functioning as a gate electrode. Such a structure of the thin film transistor 63 is called a single-drain structure. The thin film transistor 63 obtained through the aforementioned steps has a channel length of 1.5 µm and a channel width of 4 µm.

Then, the insulating layer 68 is formed covering the thin film transistor 63. The insulating layer 68 is formed by depositing silicon oxynitride ($SiO_xN_y$) (x>y) with a thickness of 50 nm by plasma CVD.

After forming the insulating layer 68, heat treatment is applied for hydrogenation of the silicon film. Here, heat treatment is applied at 550° C. for 4 hours in a nitrogen atmosphere. By this heat treatment, crystallinity of the silicon film can be recovered as well as the impurity elements added into the silicon film can be activated. Note that the activation step can be originally omitted since the resistance of the source and drain regions can be sufficiently lowered by using the invention.

Then, the silicon nitride layer 69 with a thickness of 100 nm and a silicon oxynitride layer 70 with a thickness of 600 nm are continuously formed as an interlayer insulating film by CVD, and then heat treatment is applied at 410° C. for 1 hour. Since the aforementioned insulating film contains hydrogen, the crystalline silicon film can be hydrogenated by this heat treatment.

Figure 53C:
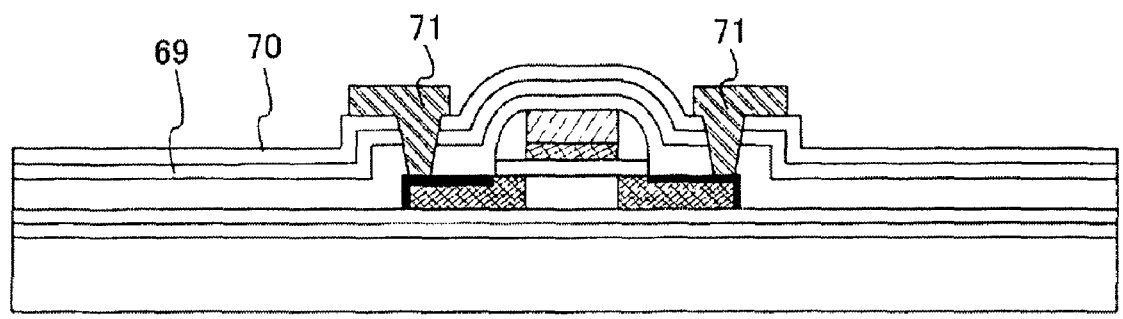

Then, the insulating layers 68, 69 and 70 are etched by photolithography, thereby forming contact holes to expose the p-type impurity regions 52 and 53, namely to expose the Ni-silicide layers 67. Subsequently, a conductive layer is formed so as to fill the contact holes, which is patterned then to form conductive layers 71 functioning as source and drain wires (FIG. 53C).

The conductive layer 71 is formed in stacked layers by depositing a titanium (Ti) layer, a titanium nitride (TiN) layer, an aluminum (Al) layer, a Ti Layer and a TiN layer in this order by sputtering, thereby a TFT is completed.

Figure 54:
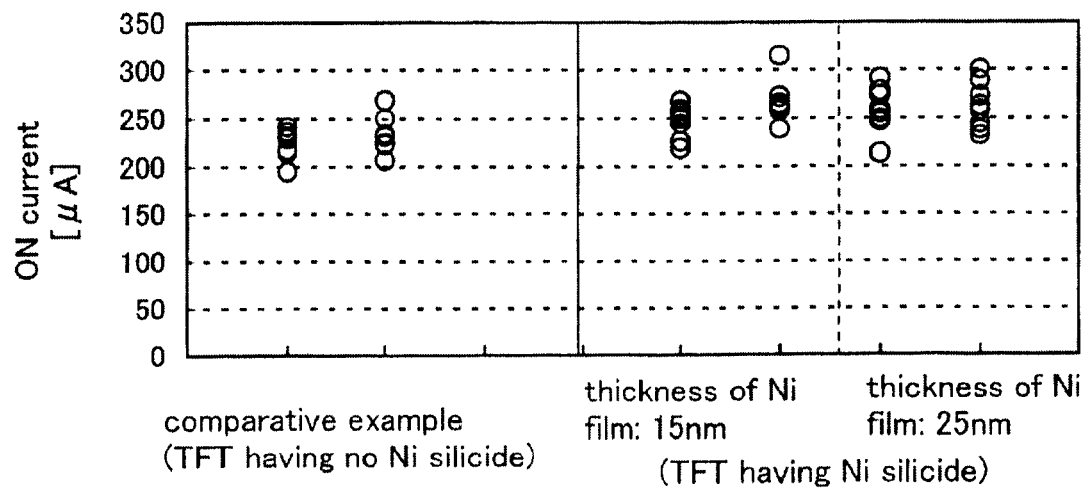
FIG. 54 illustrates the on-current characteristics of a p-channel TFT.
Figure 55:
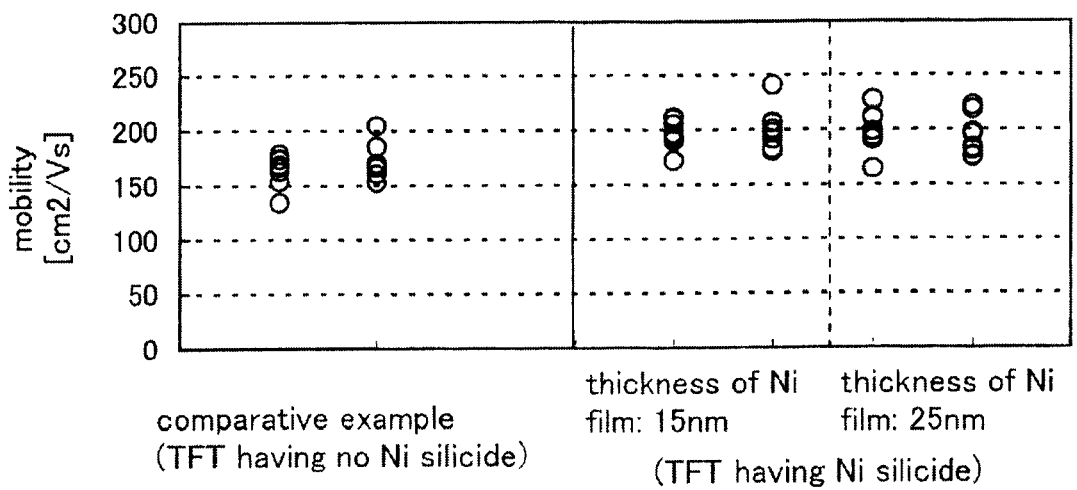
FIG. 55 illustrates the mobility characteristics of a p-channel TFT.

Measurement results of the TFT characteristics are shown below. FIG. 54 and FIG. 55 show the on current characteristics ([µA], VG=5 V and VD=5 V) and the mobility characteristics ([$cm^2/Vs$], V=1 V) of a p-channel thin film transistor, which are indicated by ○. Eight points were measured in each substrate. The number of the substrates is 2. As for the TFT having no Ni silicide as a comparative example, the average value of the on current was 228.8 µA while the average value of the mobility was 167.9 $cm^2/Vs$. On the other hand, in the case where the Ni film has a thickness of 15 nm, the average value of the on current was 257.3 µA while the average value of the mobility was 198.8 $cm^2/Vs$. In the case where the Ni film has a thickness of 25 nm, the average value of the on current was 259.9 µA while the average value of the mobility was 196.8 $cm^2/Vs$. Therefore, it was verified that both the on current and mobility are improved by forming silicide through thermal deposition.

The present application is based on Japanese Priority application No. 2004-342902 filed on Nov. 26, 2004 with the Japanese Patent Office, the entire contents of which are hereby incorporated by reference.

What is claimed is:

1. A manufacturing method of a semiconductor device, comprising:
    forming a gate electrode over a semiconductor substrate with a first insulating film interposed therebetween;
    forming a metal film over the semiconductor substrate and the gate electrode, thereby forming metal silicide on the semiconductor substrate; and
    removing an unreacted portion of the metal film,
    wherein the metal film comprises nickel and platinum.

2. The method according to claim 1, wherein the metal film is formed while the semiconductor substrate is heated.

3. The method according to claim 2, wherein the semiconductor substrate is heated up to 450° C. or higher.

4. The method according to claim 1, wherein the metal film is formed in a thickness of 10 nm or more.

5. The method according to claim 1, wherein the metal film is deposited by sputtering, CVD or vapor deposition.

6. The method according to claim 1, wherein the metal film is deposited by sputtering with a power density lower than 1.4 $W/cm^2$.

7. The method according to claim 1, further comprising:
    exposing a part of the semiconductor substrate by partially removing the first insulating film.

8. The method according to claim 1, further comprising:
    forming a second insulating film covering the gate electrode and the first insulating film; and
    forming sidewalls on side surfaces of the gate electrode by etching the second insulating film.

9. The method according to claim 8, wherein etching the second insulating film is performed by anisotropic etching.

10. The method according to claim 1, further comprising:
    adding n-type or p-type impurities into the semiconductor substrate using the gate electrode as a mask.

11. The method according to claim 1, further comprising:
    removing an oxide film on the semiconductor substrate.

12. A manufacturing method of a semiconductor device, comprising:
    forming a semiconductor film over a substrate;
    forming a gate electrode over the semiconductor film with a first insulating film interposed therebetween,
    forming a metal film over the semiconductor film and the gate electrode while heating the substrate, thereby forming metal silicide on the semiconductor film; and
    removing an unreacted portion of the metal film,
    wherein the metal film comprises nickel and platinum.

13. The method according to claim 12, wherein the substrate is heated up to 450° C. or higher.

14. The method according to claim 12, wherein the metal film is formed in a thickness of 10 nm or more.

15. The method according to claim 12, wherein the metal film is deposited by sputtering, CVD or vapor deposition.

16. The method according to claim 12, wherein the metal film is deposited by sputtering with a power density lower than 1.4 W/cm².

17. The method according to claim 12, further comprising:
adding n-type or p-type impurities into the substrate using the gate electrode as a mask.

18. The method according to claim 17, further comprising:
second adding n-type or p-type impurities into the semiconductor film to form LDD regions and source and drain regions.

19. The method according to claim 12, further comprising:
forming a second insulating film covering the gate electrode and the first insulating film; and
forming sidewalls on side surfaces of the gate electrode by etching the second insulating film.

20. The method according to claim 19, wherein etching the second insulating film is performed by anisotropic etching.

21. The method according to claim 12, further comprising:
exposing a part of the substrate by partially removing the first insulating film.

22. The method according to claim 12, further comprising:
removing an oxide film on the substrate.

23. The method according to claim 12, wherein the metal film is formed so that the metal film is in contact with a top surface and a side surface of the semiconductor film.

24. A manufacturing method of a semiconductor device, comprising:
forming a gate electrode over a semiconductor substrate with a first insulating film interposed therebetween;
forming a film comprising nickel over the semiconductor substrate and the gate electrode while heating the semiconductor substrate, thereby forming nickel silicide on the semiconductor substrate; and
removing an unreacted portion of the film comprising nickel.

25. The method according to claim 24, wherein the semiconductor substrate is heated up to 450° C. or higher.

26. The method according to claim 24, wherein the film comprising nickel is formed in a thickness of 10 nm or more.

27. The method according to claim 24, wherein the film comprising nickel is deposited by sputtering, CVD or vapor deposition.

28. The method according to claim 24, wherein the film comprising nickel is deposited by sputtering with a power density lower than 1.4 W/cm².

29. The method according to claim 24, further comprising:
exposing a part of the semiconductor substrate by partially removing the first insulating film.

30. The method according to claim 24, further comprising:
forming a second insulating film covering the gate electrode and the first insulating film; and
forming sidewalls on side surfaces of the gate electrode by etching the second insulating film.

31. The method according to claim 30, wherein etching the second insulating film is performed by anisotropic etching.

32. The method according to claim 24, further comprising:
adding n-type or p-type impurities into the semiconductor substrate using the gate electrode as a mask.

33. The method according to claim 24, further comprising:
removing an oxide film on the semiconductor substrate.

34. The method according to claim 24, further comprising:
removing an oxide film on the semiconductor substrate.

35. A manufacturing method of a semiconductor device, comprising:
forming a gate electrode over a semiconductor substrate with a first insulating film interposed therebetween;
forming a film comprising platinum over the semiconductor substrate and the gate electrode while heating the semiconductor substrate, thereby forming platinum silicide on the semiconductor substrate; and
removing an unreacted portion of the film comprising platinum.

36. The method according to claim 35, wherein the semiconductor substrate is heated up to 450° C. or higher.

37. The method according to claim 35, wherein the film comprising platinum is formed in a thickness of 10 nm or more.

38. The method according to claim 35, wherein the film comprising platinum is deposited by sputtering, CVD or vapor deposition.

39. The method according to claim 35, wherein the film comprising platinum is deposited by sputtering with a power density lower than 1.4 W/cm².

40. The method according to claim 35, further comprising:
exposing a part of the semiconductor substrate by partially removing the first insulating film.

41. The method according to claim 35, further comprising:
forming a second insulating film covering the gate electrode and the first insulating film; and
forming sidewalls on side surfaces of the gate electrode by etching the second insulating film.

42. The method according to claim 41, wherein etching the second insulating film is performed by anisotropic etching.

43. The method according to claim 35 further comprising:
adding n-type or p-type impurities into the semiconductor substrate using the gate electrode as a mask.

44. A manufacturing method of a semiconductor device, comprising:
forming a semiconductor film over a substrate;
forming a gate electrode over the semiconductor film with a first insulating film interposed therebetween;
forming a film comprising platinum over the semiconductor film and the gate electrode while heating the substrate, thereby forming platinum silicide on the semiconductor film; and
removing an unreacted portion of the film comprising platinum.

45. The method according to claim 44, wherein the substrate is heated up to 450° C. or higher.

46. The method according to claim 44, wherein the film comprising platinum is formed in a thickness of 10 nm or more.

47. The method according to claim 44, wherein the film comprising platinum is deposited by sputtering, CVD or vapor deposition.

48. The method according to claim 44, wherein the film comprising platinum is deposited by sputtering with a power density lower than 1.4 W/cm².

49. The method according to claim 44, further comprising:
adding n-type or p-type impurities into the substrate using the gate electrode as a mask.

50. The method according to claim 49, further comprising:
second adding n-type or p-type impurities into the semiconductor film to form LDD regions and source and drain regions.

51. The method according to claim 44, further comprising:
forming a second insulating film covering the gate electrode and the first insulating film; and forming sidewalls on side surfaces of the gate electrode by etching the second insulating film.

52. The method according to claim 51, wherein etching the second insulating film is performed by anisotropic etching.

53. The method according to claim 51, further comprising:
exposing a part of the substrate by partially removing the first insulating film.

54. The method according to claim 44, further comprising:
removing an oxide film on the substrate.

55. The method according to claim 44, wherein the film comprising platinum is formed so that the film comprising platinum is in contact with a top surface and a side surface of the semiconductor film.

* * * * *

UNITED STATES PATENT AND TRADEMARK OFFICE
CERTIFICATE OF CORRECTION

PATENT NO. : 7,838,346 B2  
APPLICATION NO. : 12/505095  
DATED : November 23, 2010  
INVENTOR(S) : Hajime Tokunaga Page 1 of 2

It is certified that error appears in the above-identified patent and that said Letters Patent is hereby corrected as shown below:

Title Page, Item (57) in the Abstract, line 4, "suicide" should read "silicide"

column 1, line 13, "Si process" should read "LSI process"

column 7, line 13, "FIG. 3813" should read "FIG. 38B"

column 8, line 8, "beating" should read "heating"

column 14, line 38, "a no gate" should read "a gate"

column 16, line 4, "C.," should read "C."

column 17, line 21, "is;" should read "is,"

column 19, line 12, "FIG. 3A" should read "FIG. 13A"

column 25, line 36, "(A)" should read "(N)"

column 25, line 58, "three so layers" should read "three layers"

column 26, line 49, "order to of" should read "order of"

column 33, line 24, "completed," should read "completed."

column 38, line 54, "a-NPD" should read "α-NPD"

column 38, line 65, "a-NPD" should read "α-NPD"

column 38, line 66, "a-NPD" should read "α-NPD"

column 39, line 49, "BzOa" should read "BzOs"

column 40, line 48, "751Q" should read "751G"

Signed and Sealed this  
Twenty-second Day of March, 2011

David J. Kappos  
*Director of the United States Patent and Trademark Office*

CERTIFICATE OF CORRECTION (continued)
U.S. Pat. No. 7,838,346 B2 column 40, line 48, "752C" should read "752 G"

column 40, line 55, "7521" should read "752 B"

column 42, line 56, "(VP)" should read "(I/F)"

column 43, line 38, "clok" should read "clock"

column 45, line 60, "beat-resistant" should read "heat-resistant"